United States Patent
Ota et al.

(10) Patent No.: US 10,340,321 B2
(45) Date of Patent: Jul. 2, 2019

(54) ELECTRO-OPTICAL DEVICE, ELECTRONIC APPARATUS, AND METHOD OF DRIVING ELECTRO-OPTICAL DEVICE

(71) Applicant: SEIKO EPSON CORPORATION, Tokyo (JP)

(72) Inventors: Hitoshi Ota, Shiojiri (JP); Ryoichi Nozawa, Tatsuno-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 301 days.

(21) Appl. No.: 15/331,587

(22) Filed: Oct. 21, 2016

(65) Prior Publication Data
US 2017/0125502 A1   May 4, 2017

(30) Foreign Application Priority Data
Oct. 30, 2015   (JP) ................. 2015-215228

(51) Int. Cl.
*G02B 27/01*   (2006.01)
*H01L 27/32*   (2006.01)
*G09G 3/3233*   (2016.01)
*G09G 3/3291*   (2016.01)
(Continued)

(52) U.S. Cl.
CPC ........ *H01L 27/3265* (2013.01); *G02B 27/017* (2013.01); *G09G 3/3233* (2013.01); *G09G 3/3291* (2013.01); *H01L 27/3272* (2013.01); *G02B 2027/0118* (2013.01); *G02B 2027/0178* (2013.01); *G09G 2300/0819* (2013.01); *G09G 2300/0861* (2013.01); *G09G 2310/0251* (2013.01); *G09G 2310/0297* (2013.01); *G09G 2320/045* (2013.01); *H01L 27/3262* (2013.01); *H01L 27/3276* (2013.01)

(58) Field of Classification Search
CPC .. G09G 3/3283; G09G 3/3241; G09G 3/3233; H01L 27/3265; H01L 27/3276; H01L 27/3272; H01L 27/3262; G02B 27/017; H05B 37/02
USPC .......... 257/4; 345/204, 88, 211, 76; 315/224
See application file for complete search history.

(56) References Cited

U.S. PATENT DOCUMENTS

2013/0093737 A1* 4/2013 Ota ...................... G09G 3/3233
                                                            345/204
2013/0099692 A1* 4/2013 Chaji ..................... H05B 37/02
                                                            315/224
(Continued)

FOREIGN PATENT DOCUMENTS

JP    2009-282191 A    12/2009
JP    2013-088611 A     5/2013
JP    2016-038425 A     3/2016

*Primary Examiner* — Nduka E Ojeh
(74) *Attorney, Agent, or Firm* — Oliff PLC

(57) ABSTRACT

An electro-optical device includes a first electrode that is coupled to a first data transfer line, a second electrode that is coupled to a second data transfer line. The first and second electrodes are respectively formed in different layers. A first capacitor is formed of the first electrode, the second electrode, and a dielectric film between the first electrode and the second electrode. In addition, a power supplying line and the first data transfer line are formed in a same layer. A second capacitor is formed of the power supplying line, the first data transfer line, and an insulating layer between the power supplying line and the first data transfer line.

10 Claims, 33 Drawing Sheets

(51) Int. Cl.
*G06F 3/038* (2013.01)
*G09G 5/00* (2006.01)

(56) References Cited

U.S. PATENT DOCUMENTS

2013/0120338 A1* 5/2013 Kubota .................... G06F 3/038
                                                              345/211
2016/0042692 A1* 2/2016 Ota ....................... G09G 3/3233
                                                              345/215
2017/0125503 A1* 5/2017 Ota ..................... H01L 27/3248

* cited by examiner

COMPARISON EXAMPLE

ELECTRO-OPTICAL DEVICE, ELECTRONIC APPARATUS, AND METHOD OF DRIVING ELECTRO-OPTICAL DEVICE

BACKGROUND

1. Technical Field

The present invention relates to an electro-optical device, an electronic apparatus, and a method of driving the electro-optical device.

2. Related Art

In recent years, various electro-optical devices that use a light emitting element such as an organic light emitting diode (hereinafter, referred to as OLED) have been proposed. In a general configuration of the electro-optical device, a pixel circuit that includes a light emitting element, a transistor, or the like is provided in correspondence with a pixel among an image to be displayed, corresponding to intersection of a scan line and a data line.

In the configuration, if a data signal having a potential according to a gradation level of the pixel is applied to a gate of the transistor, the transistor supplies a light emitting element with a current according to a gate-source voltage. According to this, the light emitting element emits light in brightness according to a gradation level.

In a driving method that uses a transistor to adjust a light emission intensity, if threshold voltages of transistors provided to each pixel vary, a current that flows through a light emitting element varies, and thereby image quality of a display image is decreased. Thus, in order to prevent image quality from decreasing, it is necessary to compensate for variation of the threshold voltage of a transistor. Hence, in order to adjust a gate voltage of the transistor to the threshold voltage, a device is proposed in which a compensation transistor is provided between the gate, and a drain or a source of the transistor and a coupling capacitor is provided between the gate of the transistor and a data line (for example, JP-A-2009-282191). In the device, a capacitance element is added to the data line in the outside of the pixel, so as to compensate for lack of capacitance due to miniaturization of the pixel.

However, in JP-A-2009-282191, the capacitance element is added to the data line in the outside of the pixel, and thus, there is a possibility that the size of a circuit increases and cost increases.

SUMMARY

An advantage of some aspects of the invention is to secure required capacitance without increasing the size of a circuit.

According to an aspect of the invention, there is provided an electro-optical device including a first conductive layer; a second conductive layer; a third conductive layer; a first capacitor that includes a fourth conductive layer which is coupled to the second conductive layer, a fifth conductive layer which is coupled to the third conductive layer, and a dielectric film between the fourth conductive layer and the fifth conductive layer; a sixth conductive layer that shields the second conductive layer; a second capacitor that is formed between the second conductive layer and the sixth conductive layer; and a pixel circuit that is provided in correspondence with the third conductive layer and the first conductive layer. The pixel circuit includes a plurality of transistors including a drive transistor, and a light emitting element. The second conductive layer and the sixth conductive layer are formed in the same layer. The fourth conductive layer of the first capacitor is formed in a different layer from the second conductive layer. The fifth conductive layer of the first capacitor is formed in a different layer from the fourth conductive layer.

According to the aspect, the pixel circuit is provided in correspondence with the second data transfer line which is used as an example of the third conductive layer, and the scan line which is used as an example of the first conductive layer. The first data transfer line as an example of the second conductive layer is provided in common to a plurality of pixel circuits, but, if a set of the pixel circuits that are coupled to the same first data transfer line through the second data transfer line is set as a pixel string, and the pixel circuits having a smaller number than the pixel circuits which are included in the pixel string are set as one block, the second data transfer line is provided to each block. In the pixel circuit, the first data transfer line and a shield line which is used as an example of the sixth conductive layer that shields the first data transfer line are formed in the same layer. The second capacitor is formed of the first data transfer line, the shield line, and an insulating layer therebetween. Hence, since the second capacitor is formed in a direction of lengths of the wires, it is possible for the second capacitor to have predetermined capacitance required for shielding without an increase of a size of the pixel circuit. In addition, the second data transfer line is coupled to the second electrode which is used as an example of the fifth conductive layer, and the first data transfer line is coupled to the first electrode which is used as an example of the fourth conductive layer. The first electrode is formed in a different layer from a layer having the first data transfer line, and the second electrode is formed in a different layer from a layer having the first electrode. The first capacitor is formed of the first electrode and the second electrode which are respectively formed in different layers, and an insulating layer between the first and second electrodes. Hence, it is possible for the first capacitor to have large capacitance without an increase of the size of the pixel circuit.

In the electro-optical device according to another aspect of the invention, the first capacitor and the second capacitor may be located in a display region of the pixel circuit. According to the aspect, it is possible to secure required capacitance without an increase of the size of the pixel circuit.

In the electro-optical device according to still another aspect of the invention, if at least one of the third conductive layers are coupled to the second conductive layer through the first capacitors, a set of a predetermined number of the pixel circuits that are coupled to the same second conductive layer through the third conductive layer is set as a pixel string, and the pixel circuits having a smaller number than the pixel circuits which are included in the pixel string are set as one block, the third conductive layer may be provided to each block. According to the aspect, it is possible to commonly use the second data transfer line which is used as an example of the third conductive layer, and a transfer capacitor which is used as an example of the first capacitor that is coupled to the second data transfer line.

In the electro-optical device according to still another aspect of the invention, the first capacitor may be provided to each of the third conductive layers. According to the aspect, the first capacitor is provided to each of the second data transfer line which is used as an example of the third conductive layer. Accordingly, even though the second data transfer line is divided in each block, it is possible to efficiently supply data by using the first capacitor which secures required capacitance without an increase of the size of the pixel circuit.

In the electro-optical device according to still another aspect of the invention, the first capacitor may be formed in a layer higher than a layer in which a source electrode of the transistor is formed. According to the aspect, the first electrode and the second electrode of the first capacitor have a function of shielding the source electrode of the transistor, and thus, it is possible to reduce effects of noise from other wires.

According to an aspect of the invention, there is provided an electronic apparatus including the electro-optical device according to any one of the respective aspects. According to the aspect, an electronic apparatus that includes the electro-optical device according to any one of the respective aspects is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
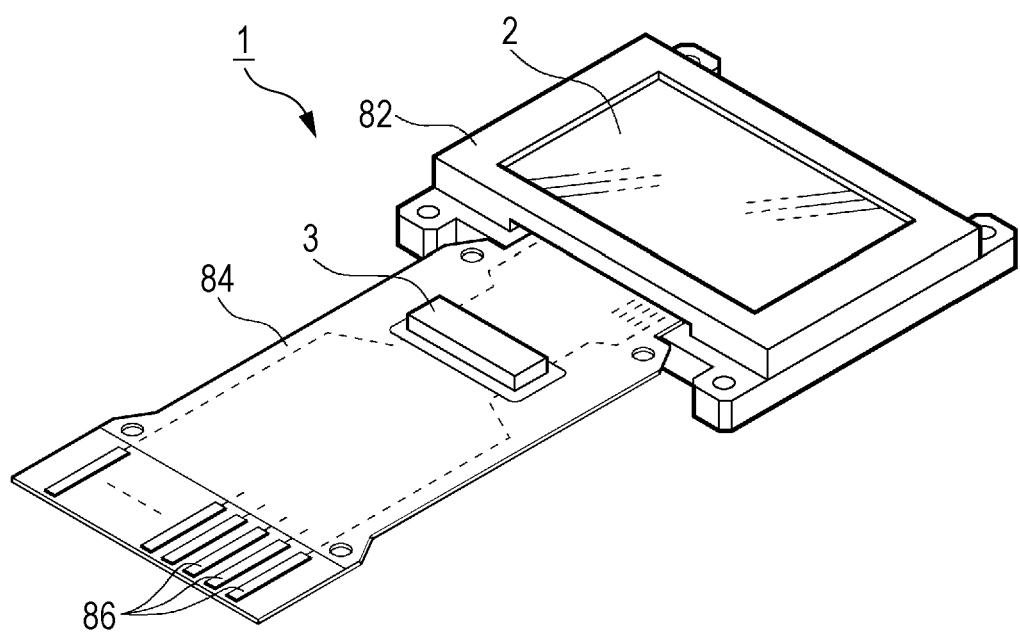
FIG. 1 is a perspective view illustrating a configuration of an electro-optical device according to a first embodiment of the invention.

FIG. 1 is a perspective diagram illustrating a configuration of an electro-optical device 1 according to a first embodiment of the invention. For example, the electro-optical device 1 is a micro display which displays an image in a head-mounted display.

As illustrated in FIG. 1, the electro-optical device 1 includes a display panel 2, and a control circuit 3 that controls an operation of the display panel 2. The display panel 2 includes a plurality of pixel circuits, and a drive circuit that drives the pixel circuit. In the present embodiment, the plurality of pixel circuits and the drive circuit that are included in the display panel 2 are formed on a silicon substrate, and an OLED that is an example of a light emitting element is used for the pixel circuits. In addition, for example, the display panel 2 is contained in a case 82 of a frame shape that is opened in a display unit, and is coupled to one end of a flexible printed circuit (FPC) substrate 84.

The control circuit 3 of a semiconductor chip is mounted in the FPC substrate 84 by using a chip on film (COF) technology, a plurality of terminals 86 is provided, and the plurality of terminals 86 is coupled to an upper circuit that is not illustrated.

Figure 2:
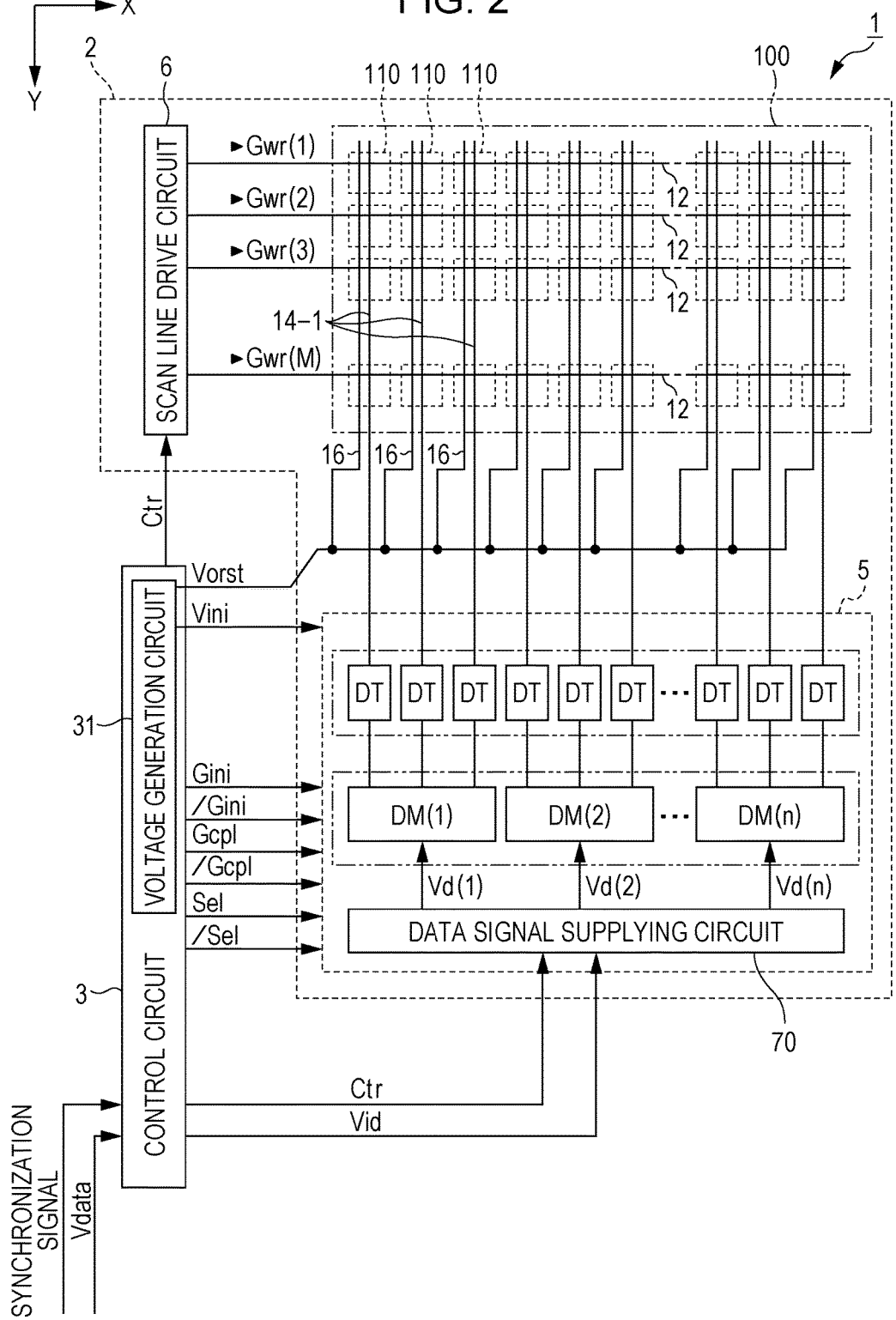
FIG. 2 is a block diagram illustrating a configuration of the electro-optical device.

FIG. 2 is a block diagram illustrating a configuration of the electro-optical device 1 according to the present embodiment. As described above, the electro-optical device 1 includes the display panel 2 and the control circuit 3.

Digital image data Vdata is supplied to the control circuit 3 from an upper circuit that is not illustrated in synchronization with a synchronization signal. Here, the image data Vdata is data in which a gray scale level of a pixel of an image to be displayed by the display panel 2 (strictly speaking, a display unit 100 that will be described below) is specified in, for example, eight bits. In addition, a synchronization signal is a signal that includes a vertical synchronization signal, a horizontal synchronization signal, and a dot clock signal.

The control circuit 3 generates various control signals based on a synchronization signal, and supplies the display panel 2 with the various control signals. Specifically, the control circuit 3 supplies the display panel 2 with a control signal Ctr, a control signal Gini with a positive logic, a control signal/Gini with a negative logic which is in a relationship of a logic opposite to the logic of the control signal Gini, a control signal Gcpl with a positive logic, a control signal/Gcpl with a negative logic which is in a relationship of a logic opposite to the logic of the control signal Gcpl, control signals Sel(1), Sel(2), and Sel(3), and control signals/Sel(1),/Sel(2), and/Sel(3) which are in a relationship of a logic opposite to the logic of the control signals Sel(1), Sel(2), and Sel(3).

Here, the control signal Ctr includes a plurality of signals, such as a pulse signal, a clock signal, and an enable signal.

There is a case in which the control signals Sel(1), Sel(2), and Sel(3) are comprehensively referred to as a control signal Sel, and the control signals/Sel(1),/Sel(2), and/Sel(3) are comprehensively referred to as a control signal/Sel.

In addition, the control circuit 3 includes a voltage generation circuit 31. The voltage generation circuit 31 supplies the display panel 2 with various potentials. Specifically, the control circuit 3 supplies the display panel 2 with a reset potential Vorst, an initial potential Vini, and the like.

Furthermore, the control circuit 3 generates an analog image signal Vid based on the image data Vdata. Specifically, a potential which is represented by the image signal Vid, and a look-up table that is stored in association with brightness of a light emitting element (OLED 130 which will be described below) which is included in the display panel 2 are provided to the control circuit 3. Then, the control circuit 3 generates the image signal Vid that represents a potential corresponding to the brightness of a light emitting element which is defined in the image data Vdata by referring to the look-up table, and supplies the display panel 2 with the image signal Vid.

As illustrated in FIG. 2, the display panel 2 includes the display unit 100, and a drive circuit (a data transfer line drive circuit 5 and a scan line drive circuit 6).

In the display unit 100, pixel circuits 110 that correspond to the pixels of an image to be displayed are arranged in a matrix. In detail, in the display unit 100, scan lines 12 of M rows are provided so as to extend in a horizontal direction (X direction) in the figure, and in addition, first data transfer lines 14-1 of (3N) columns that are grouped for each of three columns extend in a vertical direction (Y direction) in the figure and are provided so as to have an electrical insulation with the respective scan lines 12.

Figure 4:
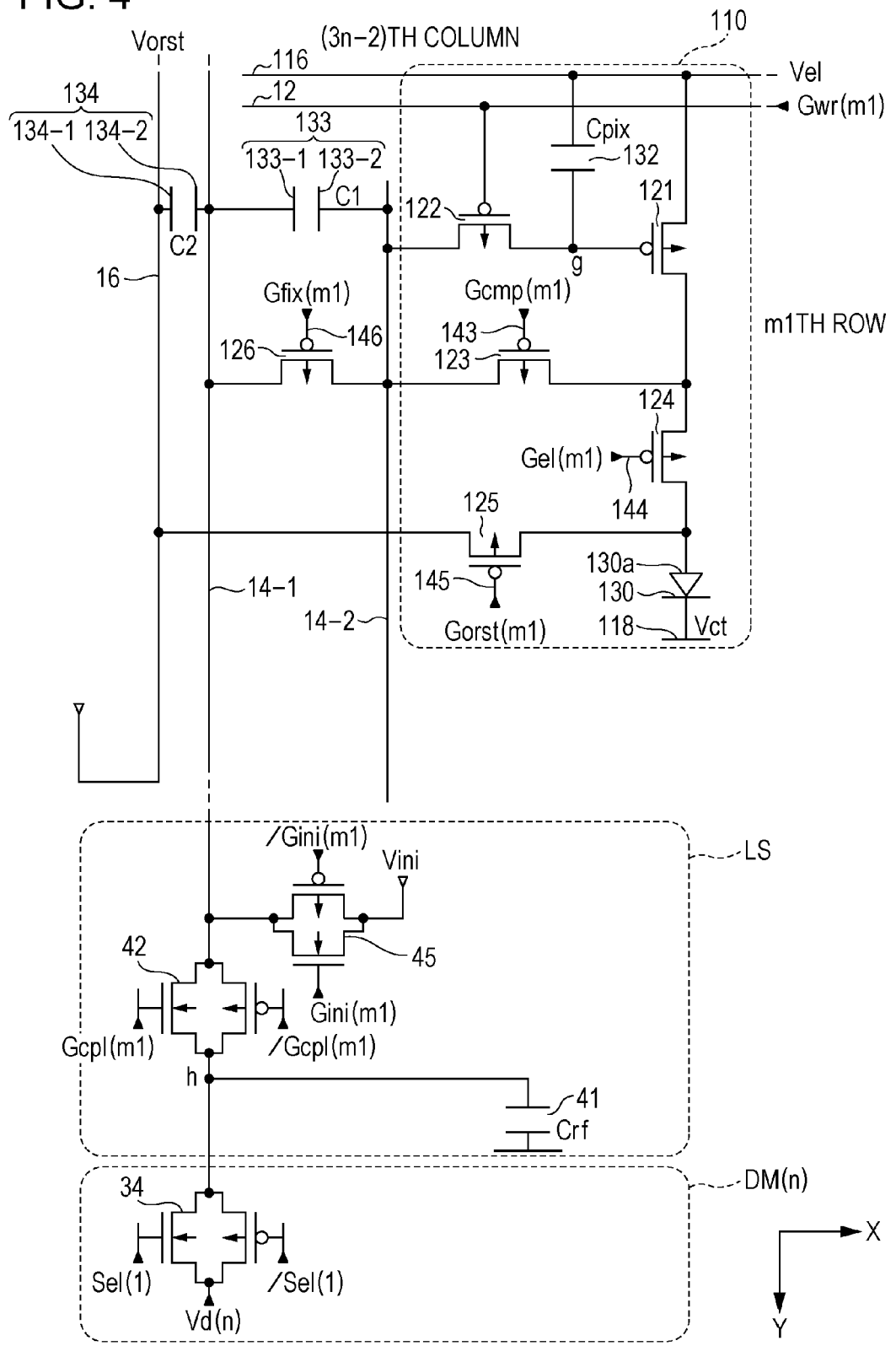
FIG. 4 is a circuit diagram illustrating a configuration of a pixel circuit of the electro-optical device.

While not illustrated in FIG. 2, but in order to avoid complexity of the figure, second data transfer lines 14-2 can be electrically coupled to the first respective data transfer lines 14-1 and are provided so as to extend in a vertical direction (Y direction) (for example, refer to FIG. 4). Then, pixel circuits 110 are provided in correspondence with the scan lines 12 of M rows and the second data transfer lines 14-2 of (3N) columns. For this reason, in the present embodiment, the pixel circuits 110 are arranged in a matrix of vertical M columns×horizontal (3N) columns.

Here, both M and N are natural numbers. In order to distinguish rows from the matrix of the scan lines 12 and the pixel circuits 110, there is a case of being referred to as a first row, a second row, a third row, . . . , an (M−1)th row, and an Mth row, sequentially from top in the figure. In the same manner, in order to distinguish columns from the matrix of the first data transfer lines 14-1 and the pixel circuits 110, there is a case of being referred to as a first column, a second column, a third column, . . . , a (3N−1)th column, and a (3N)th column, sequentially from the left in the figure.

Here, it is assumed that, in order to generally describe groups of the first data transfer lines 14-1, if one or more arbitrary integer is referred to as n, the first data transfer lines 14-1 of a (3n−2)th column, a (3n−1)th column, and a (3n)th column belongs to an nth group when counted from the left.

The three pixel circuits 110 that correspond to the scan lines 12 in the same row and the second data transfer lines 14-2 of three columns which belongs to the same group respectively correspond to pixels of R (red), G (green), and B (blue), and then represent one dot of a color image which will be displayed by the three pixels. That is, the present embodiment is configured in such a manner that the color of one dot is represented using additive color mixing according to light emission of an OLED corresponding to RGB.

In addition, as illustrated in FIG. 2, in the display unit 100, power supplying lines (reset potential supplying lines) 16 of the (3N) columns are provided so as to extend to in a vertical direction and to have electrical insulation with the respective scan lines 12. A predetermined reset potential Vorst is commonly supplied to the respective power supplying line 16. Here, in order to distinguish the columns of the power supplying lines 16, there is a case of being referred to as power supplying lines 16 of a first column, a second column, a third column, . . . , and a (3N)th column. Each of the power supplying lines 16 of the first to (3N)th columns is provided so as to correspond to each of the first data transfer lines 14-1 (second data transfer lines 14-2) of the first to (3N)th columns.

The scan line drive circuit 6 generates scan signals Gwr for sequentially scanning M scan lines 12 for each row during one frame period, according to a control signal Ctr. Here, the scan signals Gwr which are supplied to the scan lines 12 of the first column, the second column, the third column, . . . , and the Mth column are respectively referred to as Gwr(1), Gwr(2), Gwr(3), . . . , Gwr(M−1), and Gwr(M).

The scan line drive circuit 6 generates various control signals which are synchronous to the scan signals Gwr for each row and supplies the display unit 100 with the signals, in addition to the scan signals Gwr(1) to Gwr(M), while not illustrated in FIG. 2. In addition, a frame means a period that the electro-optical device 1 needs so as to display an image with an amount of one cut (frame), and is a period of 8.3 milliseconds of one period, if a frequency of a vertical synchronization signal which is included in a synchronization signal is 120 Hz, for example.

The data transfer line drive circuit 5 includes (3N) data transmission circuits DT that are provided so as to correspond one-to-one to each of the first data transfer lines 14-1 of the (3N)th column, N demultiplexers DM which are provided to each of the first data transfer lines 14-1 of three columns that configure each group, and a data signal supplying circuit 70.

The data signal supplying circuit 70 generates data signals Vd(1), Vd(2), . . . , and Vd(N), based on the image signal Vid which is supplied by the control circuit 3, and the control signal Ctr. That is, the data signal supplying circuit 70 generates the data signals Vd(1), Vd(2), . . . , and Vd(N), based on the image signal Vid which is obtained by performing time-division multiplexing of the data signals Vd(1), Vd(2), . . . , and Vd(N). Then, the data signal supplying circuit 70 supplies the demultiplexers DM corresponding to a first group, a second group, . . . , and an Nth group with the data signals Vd(1), Vd(2), . . . , and Vd(N), respectively.

Figure 3:
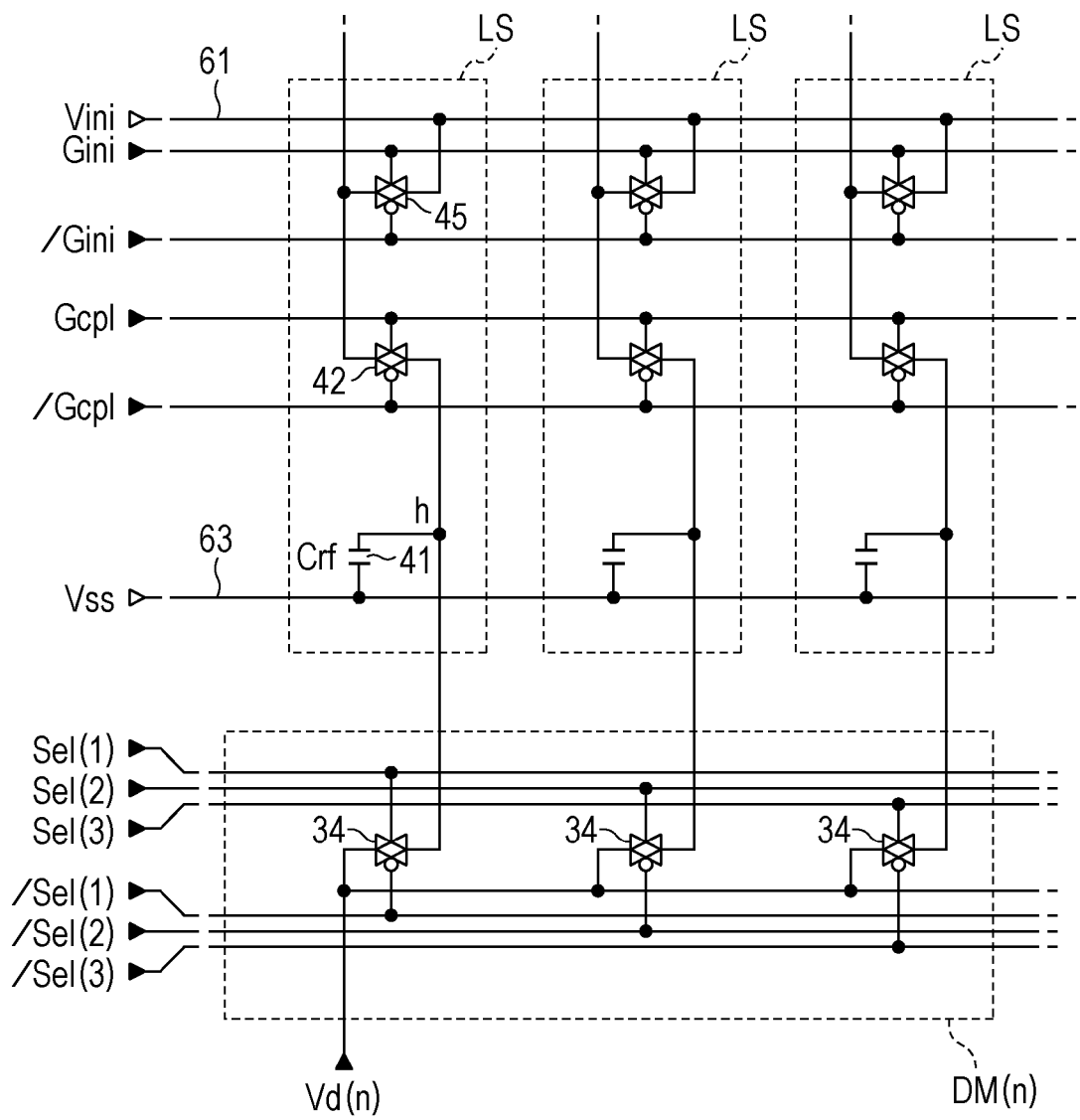
FIG. 3 is a circuit diagram illustrating configurations of a demultiplexer and a data transmission circuit of the electro-optical device.

FIG. 3 is a circuit diagram illustrating configurations of the demultiplexer DM and the data transmission circuit DT. FIG. 3 representatively illustrates the demultiplexer DM which belongs to the nth group, and the three data transmission circuits DT which are coupled to the demultiplexer DM. Hereinafter, there is a case in which the demultiplexer DM that belongs to the nth group is referred to as DM(n).

Hereinafter, the configurations of the demultiplexer DM and the data transmission circuit DT will be described with reference to FIG. 3 in addition to FIG. 2.

As illustrated in FIG. 3, the demultiplexer DM is a collection of transmission gates 34 which are provided to each column, and sequentially supplies the data signals to three columns that configure the respective groups. Here, input terminals of the transmission gates 34 corresponding to the (3n−2)th column, the (3n−1)th column, and the (3n)th column which belong to the nth group are commonly coupled to each other, and the data signals Vd(n) are respectively supplied to the common terminals. The transmission gate 34 that is provided to the (3n−2)th column which is a left end column in the nth group is turned on (conducted) when a control signal Sel(1) goes to an H level (when a control signal/Sel(1) goes to an L level). In the same manner, the transmission gate 34 that is provided to the (3n−1)th column which is a central column in the nth group is turned on when a control signal Sel(2) goes to an H level (when a control signal/Sel(2) goes to an L level), and the transmission gate 34 that is provided to the (3n)th column which is a right end column in the nth group is turned on when a control signal Sel(3) goes to an H level (when a control signal/Sel(3) goes to an L level).

The data transmission circuit DT includes a set of a retention capacitor (third capacitor) 41, a transmission gate 45, and a transmission gate 42 in each column. The data transmission circuit DT accumulates a potential of a data signal which is output from an output terminal of the transmission gate 34 in each column in the retention capacitor (third capacitor) 41 during an initialization period and a compensation period which will be described below, and transfers the potential of the data signal which is accumulated in the retention capacitor (third capacitor) 41 to a transfer capacitor 133, during a writing period which will be described below.

A source or a drain of the transmission gate 45 of each column is electrically coupled to the first data transfer line 14-1. In addition, the control circuit 3 commonly supplies a gate of the transmission gate 45 of each column with a control signal/Gini. The transmission gate 45 electrically couples the first data transfer line 14-1 to a supplying line of an initial potential Vini, when the control signal/Gini goes to an L level, and electrically decouples the first data transfer line 14-1 from the supplying line, when the control signal/Gini goes to an H level. A predetermined initial potential Vini is supplied to a supplying line 61 of the initial potential Vini from the control circuit 3.

The retention capacitor 41 includes two electrodes. One electrode of the retention capacitor 41 is electrically coupled to an input terminal of the transmission gate 42 via a node h. In addition, an output terminal of the transmission gate 42 is electrically coupled to the first data transfer line 14-1.

The control circuit 3 commonly supplies the transmission gates 42 of each column with the control signal Gcpl and the control signal/Gcpl. For this reason, the transmission gates 42 of each column are simultaneously turned on when the control signal Gcpl goes to an H level (the control signal/Gcpl goes to an L level).

One electrode of the retention capacitors 41 of each retention capacitor is electrically coupled to output terminals of the transmission gates 34 and input terminals of the transmission gates 42 through the node h. Then, when the transmission gate 34 is turned on, the data signal Vd(n) is supplied to the one electrode of the retention capacitor 41 via the output terminal of the transmission gate 34. That is, the data signal Vd(n) is supplied to the one electrode of the retention capacitor 41.

In addition, the other electrodes of the retention capacitors 41 of each column are commonly coupled to the power supplying line 63 to which a potential Vss that is a fixed potential is supplied. Here, the potential Vss may be a potential corresponding to an L level of the scan signal and the control signal which are logic signals. A capacitance value of the retention capacitor 41 is referred to as Crf.

The pixel circuit 110 or the like will be described with reference to FIG. 4. In order to generally represent a row on which the pixel circuits 110 are arranged, an arbitrary integer which is equal to or greater than 1 and equal to or less than M is referred to as m. In addition, arbitrary integers which are equal to or greater than 1, equal to or less than M, and consecutive are referred to as m1 and m2. That is, m has a generalized concept that includes m1 or m2.

From an electrical viewpoint, the respective pixel circuits 110 are configured in the same manner as each other, thus being positioned in the mth row, and in the (3n−2)th column of the left end column of the nth group, here. The pixel circuit 110 in the mth row and the (3n−2)th column will be described as an example.

As illustrated in FIG. 4, a first electrode 133-1 of a transfer capacitor (first capacitor) 133 and one of a source and a drain of a first transistor 126 are electrically coupled to the first data transfer line 14-1. In addition, a second electrode 133-2 of the transfer capacitor 133 and the other of the source and the drain of the first transistor 126 are electrically coupled to the second data transfer line 14-2.

That is, the transfer capacitor 133 and the first transistor 126 are coupled in parallel with each other between the first data transfer line 14-1 and the second data transfer line 14-2.

In addition, the pixel circuit 110 is coupled to the second data transfer line 14-2. That is, a gradation potential is supplied to the pixel circuit 110 according to a designated gradation via the first data transfer line 14-1 and the second data transfer line 14-2.

In the present embodiment, one pixel circuit 110 is electrically coupled to the second data transfer line 14-2.

However, the invention is not limited to such a configuration, and Nb pixel circuits 110 may be electrically coupled to one of the second data transfer lines 14-2. That is, a plurality of the pixel circuits 110 may share one of the second data transfer lines 14-2, one of the transfer capacitors 133, and the first transistor 126.

Figure 5:
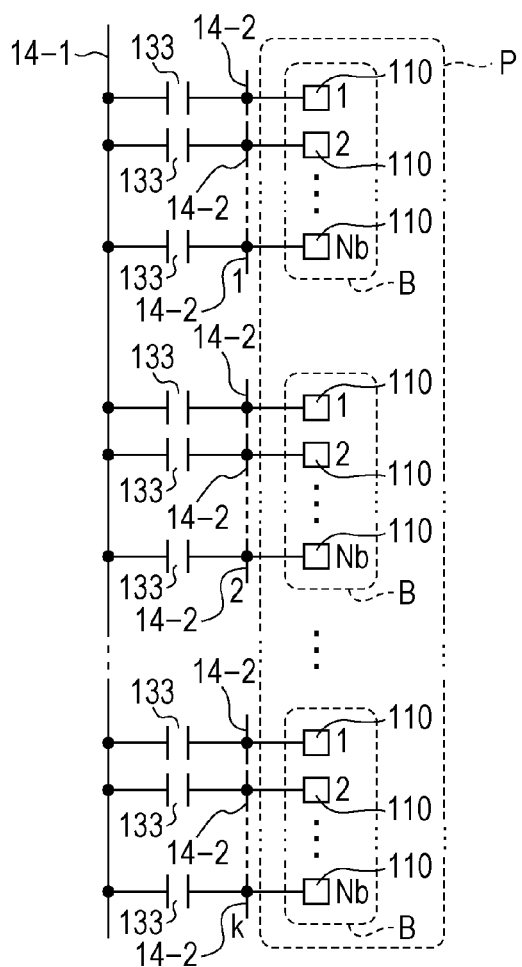
FIG. 5 is a diagram illustrating a specific configuration of the electro-optical device.

FIG. 5 is a diagram illustrating a specific configuration according to the present embodiment. In the present embodiment, as illustrated in FIG. 5, the second data transfer lines 14-2 which are equal to or more than two pieces are respectively coupled to the first data transfer line 14-1 via the transfer capacitors 133.

Here, a collection of the pixel circuits 110 which are coupled to the same first data transfer line 14-1 via the second data transfer lines 14-2 and the transfer capacitors 133 is referred to as a "pixel string" (pixel string P in FIG.

5). In addition, a predetermined number of sets of the pixel circuits 110 is referred to as a "block" (block B in FIG. 5).

As illustrated in FIG. 5, the pixel string P includes a plurality of blocks B, and each block B includes a plurality of pixel circuits 110. That is, in the present embodiment, the second data transfer lines 14-2 are provided to the pixel circuits 110 whose number is equal to the number of the pixel circuits 110 that are included in the pixel string P.

Figure 6:
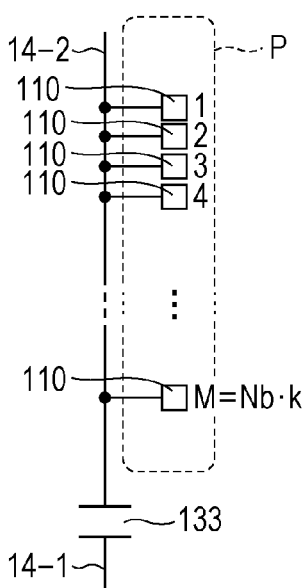
FIG. 6 is a diagram illustrating a configuration of the related art that is illustrated as a comparison example.

In contrast to this, a configuration of the related art is illustrated in FIG. 6. FIG. 6 is a diagram illustrating a configuration of the related art which is illustrated as a comparison example. As illustrated in FIG. 6, in the configuration of the related art, the second data transfer line 14-2 is provided to the pixel string P, and the transfer capacitor 133 and the first data transfer line 14-1 are provided on an end portion of the second data transfer line 14-2. That is, in the configuration of the related art, one first data transfer line 14-1 and one second data transfer line 14-2 are provided to one pixel string P (all the pixel circuits 110 are included in the pixel string P). This point is clearly different from a point in which, in the present embodiment described with reference to FIG. 5, a specific configuration, that is, the second data transfer line 14-2, is divided in the block B units which configure the pixel strings P and thereby a plurality of the second data transfer lines 14-2 are provided.

However, as represented by the following (Expression 1), a value which is obtained by dividing the number M of all the rows of the pixel circuits 110 in the display unit 100 by the number Nb of the rows of the pixel circuits 110 which are coupled to one second data transfer line 14-2 is referred to as K. In other words, it is assumed that the second data transfer lines 14-2 are divided into K pieces which are values that are obtained by dividing M by Nb, and Nb pixel circuits 110 are coupled to one second data transfer line 14-2.

$$K = \frac{M}{Nb} \quad \text{(Expression 1)}$$

In the present embodiment, (K(K≥2)×Nb) second data transfer lines 14-2 are provided to the first data transfer line 14-1. In other words, one pixel string P includes K blocks B. In addition, the first data transfer line 14-1 is provided so as to correspond to the pixel circuits 110 of M rows (M pieces), and the second data transfer lines 14-2 are provided so as to correspond to the pixel circuits 110 of Nb rows (Nb pieces). Thus, second data transfer line 14-2 is shorter than the first data transfer line 14-1.

In the present embodiment, the value of Nb is 1. k is used as an arbitrary integer which is equal to or greater than 1 and is equal to or less than K.

Hereinafter, the first transistor 126 corresponding to each pixel circuits 110 in the mth row which is counted from the first row is set as the first transistor 126 in the mth transistor which is counted from the first row, and a control signal Gfix(m) is supplied to the first transistor 126.

The pixel circuit 110 includes a P-channel MOS transistors 121 to 125, an OLED 130, and a pixel capacitor 132. The scan signal Gwr(m) and the control signal Gcmp(m), Gel(m), and Gorst(m) are supplied to the pixel circuit 110 of mth row. Here, the scan signal Gwr(m) and the control signal Gcmp(m), Gel(m), and Gorst(m) are respectively supplied by the scan line drive circuit 6 in correspondence with the mth row.

While not illustrated in FIG. 2, as illustrated in FIG. 4, control lines 143 (first control lines) of M rows which extend in a horizontal direction (X direction), control lines 144 (second control lines) of M rows which extend in the horizontal direction, control lines 145 (third control lines) of M rows which extend in the horizontal direction, and control lines 146 (fourth control lines) of Kth rows which extend in the horizontal direction are provided to the display panel 2 (display unit 100).

Then, the scan line drive circuit 6 supplies the control line 143 of the mth row with the control signal Gcmp(m), supplies the control line 144 of the mth row with the control signal Gel(m), supplies the control line 145 of the mth row with the control signal Gorst(m), and supplies the control line 146 of the mth row with the control signal Gfix(m).

That is, the scan line drive circuit 6 respectively supplies the pixel circuit which is positioned in the mth row with the scan signal Gwr(m) and the control signals Gel(m), Gcmp(m), and Gorst(m), via the scan line 12 and the control lines 143, 144, and 145 which are mth rows. In addition, the scan line drive circuit 6 supplies the first transistor 126 which is positioned in the mth row with the control signal Gfix(m) via the control line 146 of the mth row.

Hereinafter, there is a case in which the scan line 12, the control line 143, the control line 144, the control line 145, and the control line 146 are comprehensively referred to as a "control line". That is, in the display panel 2 according to the present embodiment, four control lines including the scan line 12 are provided to each row, and one control line 146 is provided to each one row.

The pixel capacitor 132 and the transfer capacitor 133 respectively includes two electrodes. The transfer capacitor 133 is a capacitor which includes the first electrode 133-1 and the second electrode 133-2.

A gate of the second transistor 122 is electrically coupled to the scan line 12 of the mth row, and one of a source and a drain of the second transistor 122 is electrically coupled to the second data transfer line 14-2. In addition, the other of the source and the drain of the second transistor 122 is respectively and electrically coupled to a gate of the drive transistor 121 and one electrode of the pixel capacitor 132. That is, the second transistor 122 is electrically coupled between the gate of the drive transistor 121 and the second electrode 133-2 of the transfer capacitor 133. Then, the second transistor 122 functions as a transistor that controls electrical coupling between the gate of the drive transistor 121 and the second electrode 133-2 of the transfer capacitor 133 which is coupled to the second data transfer line 14-2 of the (3n−2)th row.

A source of the drive transistor 121 is electrically coupled to a power supplying line 116, and a drain of the drive transistor 121 is electrically coupled to one of a source and a drain of a third transistor 123, and a source of a fourth transistor 124.

Here, a potential Vel which is on a high side of a power supply in the pixel circuit 110 is supplied to the power supplying line 116. The drive transistor 121 functions as a drive transistor in which a current according to a voltage between the gates and the source of the drive transistor 121 flows.

A gate of the third transistor 123 is electrically coupled to the control line 143, and the control signal Gcmp(m) is supplied to the gate of the third transistor 123. The third transistor 123 functions as a switching transistor which controls electrical coupling between the gate and the drain of the drive transistor 121. Thus, the third transistor 123 is a transistor for conducting the gate-source of the drive transistor 121 via the second transistor 122. The second transistor 122 is coupled between one of the source and the drain of the third transistor 123 and the gate of the drive transistor 121, but one of the source and the drain of the third transistor 123 can also be interpreted to be electrically coupled to the gate of the drive transistor 121.

A gate of the fourth transistor 124 is electrically coupled to the control line 144, and the control signal Gel(m) is supplied to the gate of the fourth transistor 124. In addition, a drain of the fourth transistor 124 is electrically coupled to a source of the fifth transistor 125 and an anode 130a of the OLED 130. The fourth transistor 124 functions as a switching transistor that controls electrical coupling between the drain of the drive transistor 121 and the anode of the OLED 130. Furthermore, the fourth transistor 124 is coupled between the drain of the drive transistor 121 and the anode of the OLED 130, but the drain of the drive transistor 121 can also be interpreted to be electrically coupled to the anode of the OLED 130.

A gate of the fifth transistor 125 is electrically coupled to the control line 145, and the control signal Gorst(m) is supplied to the gate of the fifth transistor 125. In addition, a drain of the fifth transistor 125 is electrically coupled to a power supplying line 16 of the (3n−2)th row, and is maintained as a reset potential Vorst. The fifth transistor 125 functions as a switching transistor that controls electrical coupling between the power supplying line 16 and the anode 130a of the OLED 130.

A gate of the first transistor 126 is electrically coupled to the control line 146, and the control signal Gfix(m1) is supplied to the gate of the first transistor 126. In addition, one of a source and a drain of the first transistor 126 is electrically coupled to the second data transfer line 14-2, and is electrically coupled to the second electrode 133-2 of the transfer capacitor 133 and the other of the source and the drain of the third transistor 123 via the second data transfer line 14-2. In addition, the other of the source and the drain of the first transistor 126 is electrically coupled to the first data transfer line 14-1 of the (3n−2)th row.

The first transistor 126 mainly functions as a switching transistor that controls electrical coupling between the first data transfer line 14-1 and the second data transfer line 14-2.

Here, the first transistor 126 and the transfer capacitor 133 are commonly used by the Nb pixel circuits 110 that are coupled to the same second data transfer lines 14-2. In the present embodiment, as illustrated in FIG. 4, the pixel circuit 110 in each row is coupled to the same second data transfer lines 14-2 which is one piece.

The display panel 2 in the present embodiment is formed on a silicon substrate, and thus substrate potentials of the transistors 121 to 126 are set as a potential Vel. In addition, the sources and drains of the transistors 121 to 126 may be interchanged with each other depending on a channel type of the transistors 121 to 126 and a relationship of potentials. In addition, the transistors may be thin film transistors and may be field effect transistors.

One electrode of the pixel capacitor 132 is electrically coupled to the gate g of the drive transistor 121, and the other electrode of the pixel capacitor 132 is electrically coupled to the power supplying line 116. For this reason, the pixel capacitor 132 functions as a retention capacitor that retains a gate-source voltage of the drive transistor 121. A capacitance value of the pixel capacitor 132 is referred to as Cpix.

As the pixel capacitor 132, a capacitor that parasitizes in the gate g of the drive transistor 121 may be used, and a capacitor that is formed by interposing an insulating layer between conductive layers different from each other in a silicon substrate may be used.

A first electrode 133-1 of the transfer capacitor 133 is electrically coupled to one electrode of the retention capacitor 41 through the first data transfer line 14-1 and the transmission gate 42. In addition, a second electrode 133-2 of the transfer capacitor 133 is electrically coupled to a gate g of the drive transistor 121 through the second data transfer line 14-2 and the second transistor 122. For this reason, the transfer capacitor 133 functions as a transfer capacitor which shifts a potential of the gate g by a value which is obtained by multiplying a capacitance ratio between the transfer capacitor 133 and the retention capacitor 41, and the amount of change of potentials of the first data transfer line 14-1 and the first electrode 133-1 together, during the compensation period which will be described below. The detailed description will be made below. A capacitance value of the transfer capacitor 133 is referred as C1.

In addition, in the present embodiment, a shield capacitor 134 is provided between the power supplying line 16 to which the reset potential Vorst is supplied and the first data transfer line 14-1. The shield capacitor 134 is a capacitor which includes a first electrode 134-1 and a second electrode 134-2. The shield capacitor 134 functions as a shield capacitor which shields the first data transfer line 14-1. A capacitance value of the shield capacitor 134 is referred to as C2.

The anode 130a of the OLED 130 is a pixel electrode that is independently provided for each pixel circuit 110. In contrast to this, a cathode of the OLED 130 is a common electrode 118 that is commonly provided across all the pixel circuits 110, and is maintained as a potential Vct which is on a low side of the power supply, in the pixel circuit 110. The OLED 130 is an element in which a white organic EL layer is interposed between the anode 130a and the cathode with optical transparency, in the silicon substrate. Then, a color filter corresponding to one of RGB overlaps an emission side (cathode side) of the OLED 130. A cavity structure may be formed and a wavelength of light that is emitted from the OLED 130 may be set, by adjusting an optical distance between two reflection layers in which a white organic EL layer is disposed so as to be interposed between the two reflection layers. In this case, a color filer may be used and may not be used.

In the OLED 130, if a current flows from the anode 130a to the cathode, holes that are injected from the anode 130a and electrons that are injected from the cathode are recombined together in an organic EL layer, and thereby excitons are generated and white light is generated. The white light generated at this time is configured so as to pass through the cathode on a side opposite to a silicon substrate (anode 130a) via coloration performed by a color filter and to be viewed by an observer.

Figure 7:
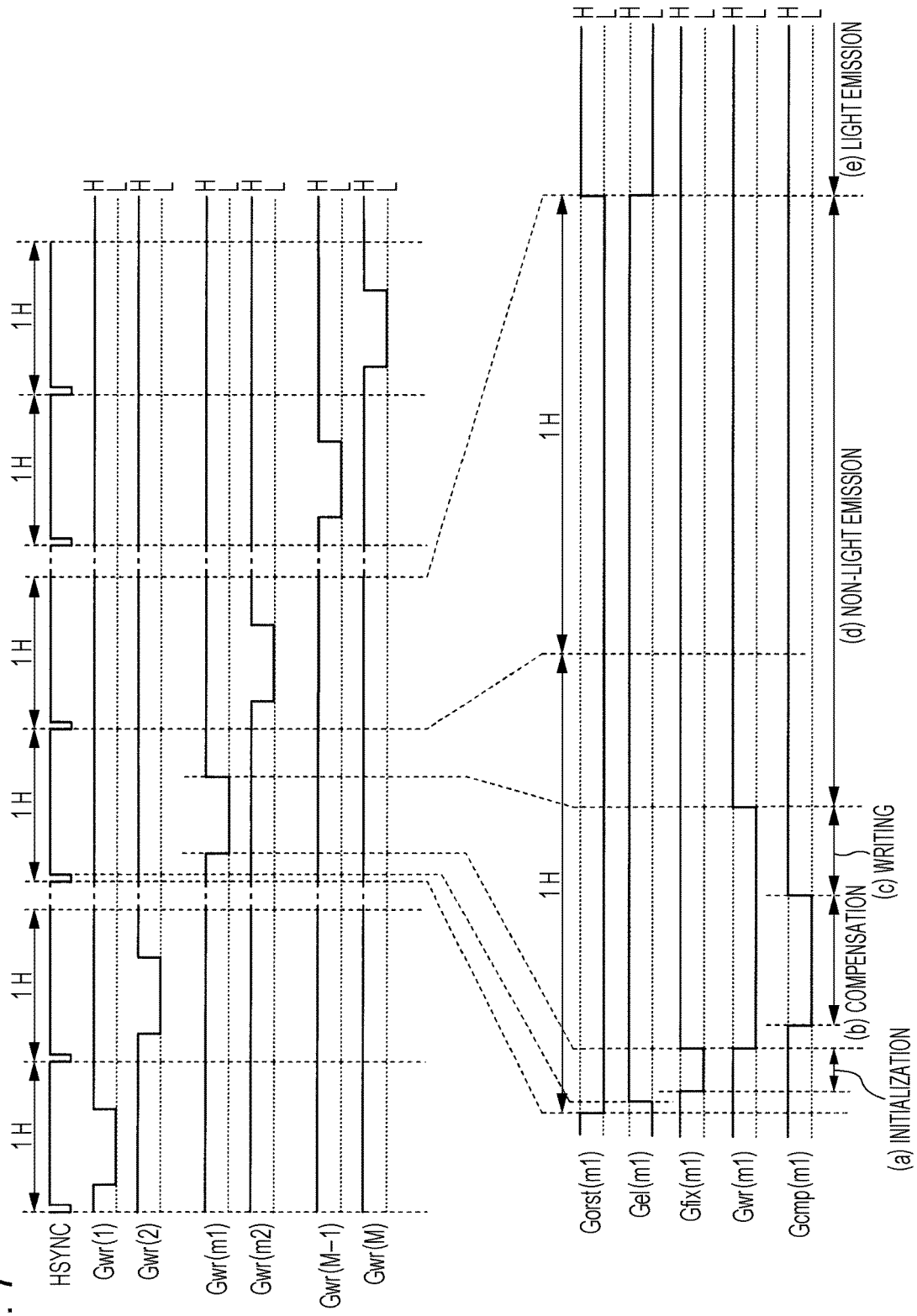
FIG. 7 is a timing chart illustrating an operation of the electro-optical device.

An operation of the electro-optical device 1 will be described with reference to FIG. 7. FIG. 7 is a timing chart illustrating operations of each unit in the electro-optical device 1. As illustrated in FIG. 7, the scan line drive circuit 6 sequentially switches the scan signals Gwr(1) to Gwr(M) in an L level, and sequentially scans the scan lines 12 of the first to Mth rows for each horizontal scan period (H), during one frame period.

Operations in one horizontal scan period (H) are common across the pixel circuits 110 of each row. Thus, hereinafter, in a horizontal scan period in which the m1th row is horizontally scanned, an operation will be described particularly with focus on the pixel circuit 110 of m1th row and (3n−2)th column.

In the present embodiment, the horizontal scan period of the m1th row is roughly divided into an initialization period denoted by (a), a compensation period denoted by (b), a writing period denoted by (c), and a non-light emission period denoted by (d), in FIG. 7. In addition, next horizontal scan period becomes a non-light emission period denoted by (d), further next horizontal scan period becomes a light emission period denoted by (e), and the horizontal scan period of the m1th row is repeated after one frame period passes. For this reason, in terms of the sequence of time, a cycle of the initialization period, the compensation period, the writing period, the non-light emission period, and the light emission period is repeated.

Figure 8:
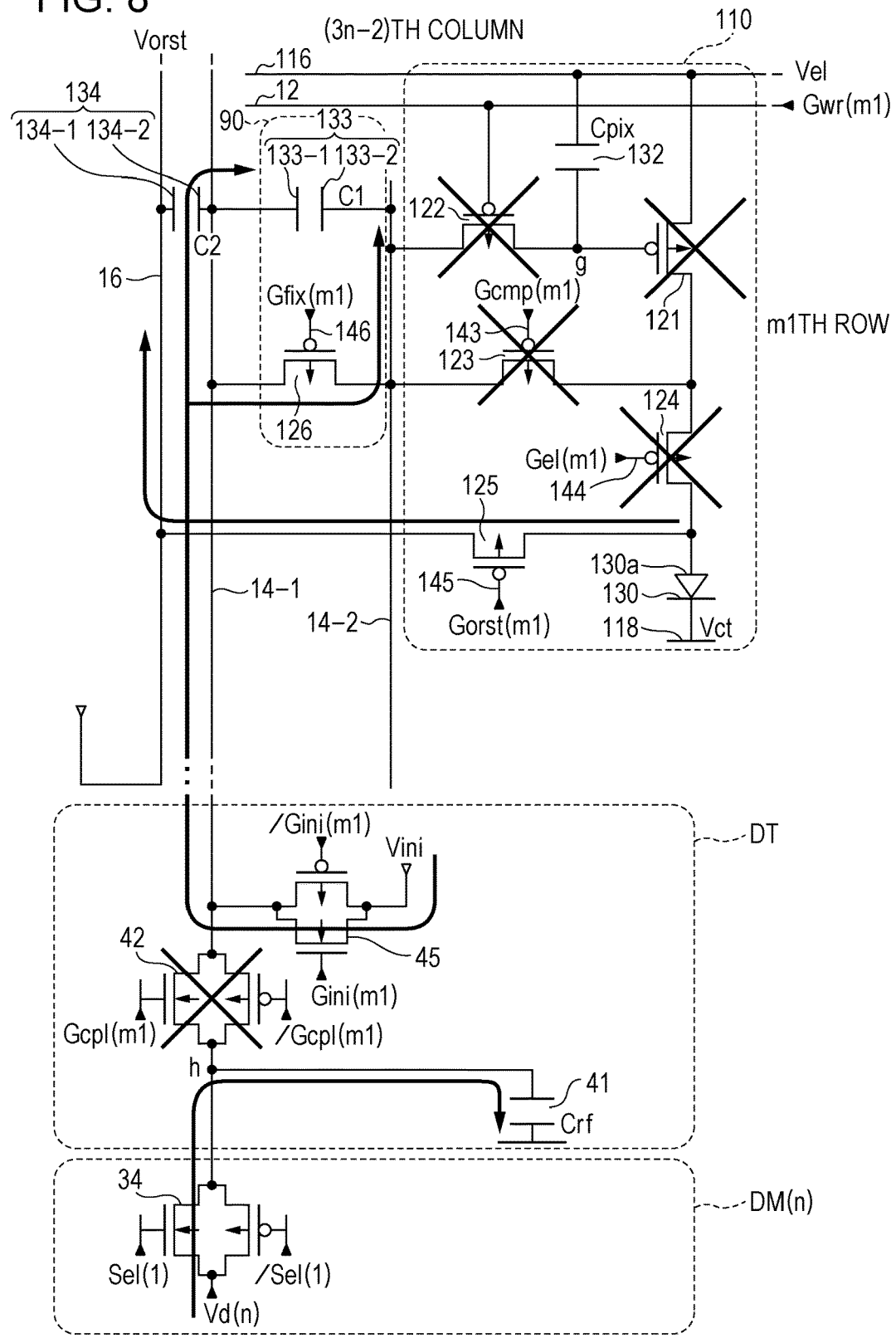
FIG. 8 is an operation explanatory diagram of the electro-optical device.

FIG. 8 is a diagram illustrating an operation of the pixel circuit 110 or the like in the light emission period. In FIG. 8, a current path which is important for operation description is denoted by a bold line, and "X" is boldly marked on transistors or transmission gates which are in an OFF state (this is also applied to FIG. 9, FIG. 10, FIG. 11, and FIG. 14 in the same manner).

Initialization Period

As illustrated in FIG. 7, during the initialization period of the m1th row, the scan signal Gwr(m1) is in an H level, the control signal Gel(m1) is in an H level, the control signal Gcmp(m1) is in an H level, and the control signal Gfix(m1) is in an L level. The control signal Gorst(m1) is in an L level.

For this reason, as illustrated in FIG. 8, in the pixel circuit 110 of the m1th row and the (3n−2)th column, while a fifth transistors 125 and the first transistor 126 are turned on, the drive transistor 121, the second transistors 122, a third transistor 123, and a fourth transistor 124 are turned off. As a result, a path of the current which is supplied to the OLED 130 is blocked, and thus, the OLED 130 enters an OFF (non-light emission) state.

As illustrated in FIG. 8, a fifth transistor 125 is turned on, and thereby the anode 130a of the OLED 130 and the power supplying line 16 are electrically coupled to each other, and a potential of the anode 130a is set to the reset potential Vorst.

Here, during the initialization period, the control signal/Gini is in an L level, the control signal Gini is in an H level, and thereby the transmission gate 45 is turned on, in the data transmission circuit DT, as illustrated in FIG. 8. In addition, the control signal Gcpl is in an L level, and the control signal/Gcpl is in an H level, and thereby, the transmission gate 42 is turned off as illustrated in FIG. 8. In addition, since the control signal Gfix(m1) is in an L level, the first transistor 126 is turned on. For this reason, as illustrated in FIG. 8, the first data transfer line 14-1 which is coupled to the first electrode 133-1 of the transfer capacitor 133 is set to an initial potential Vini, the first data transfer line 14-1 and the second data transfer line 14-2 are coupled to each other, and the second electrode 133-2 of the transfer capacitor 133 is also set to the initial potential Vini. As a result, the transfer capacitor 133 is initialized.

In addition, during the initialization period, the control signal Sel(1) is in an H level, the control signal/Sel(1) is in an L level, and thereby the transmission gate 34 is turned on, in the demultiplexer DM(n), as illustrated in FIG. 8. As a result, a gradation potential is written to the retention capacitor 41 with a capacitance value Crf.

Figure 9:
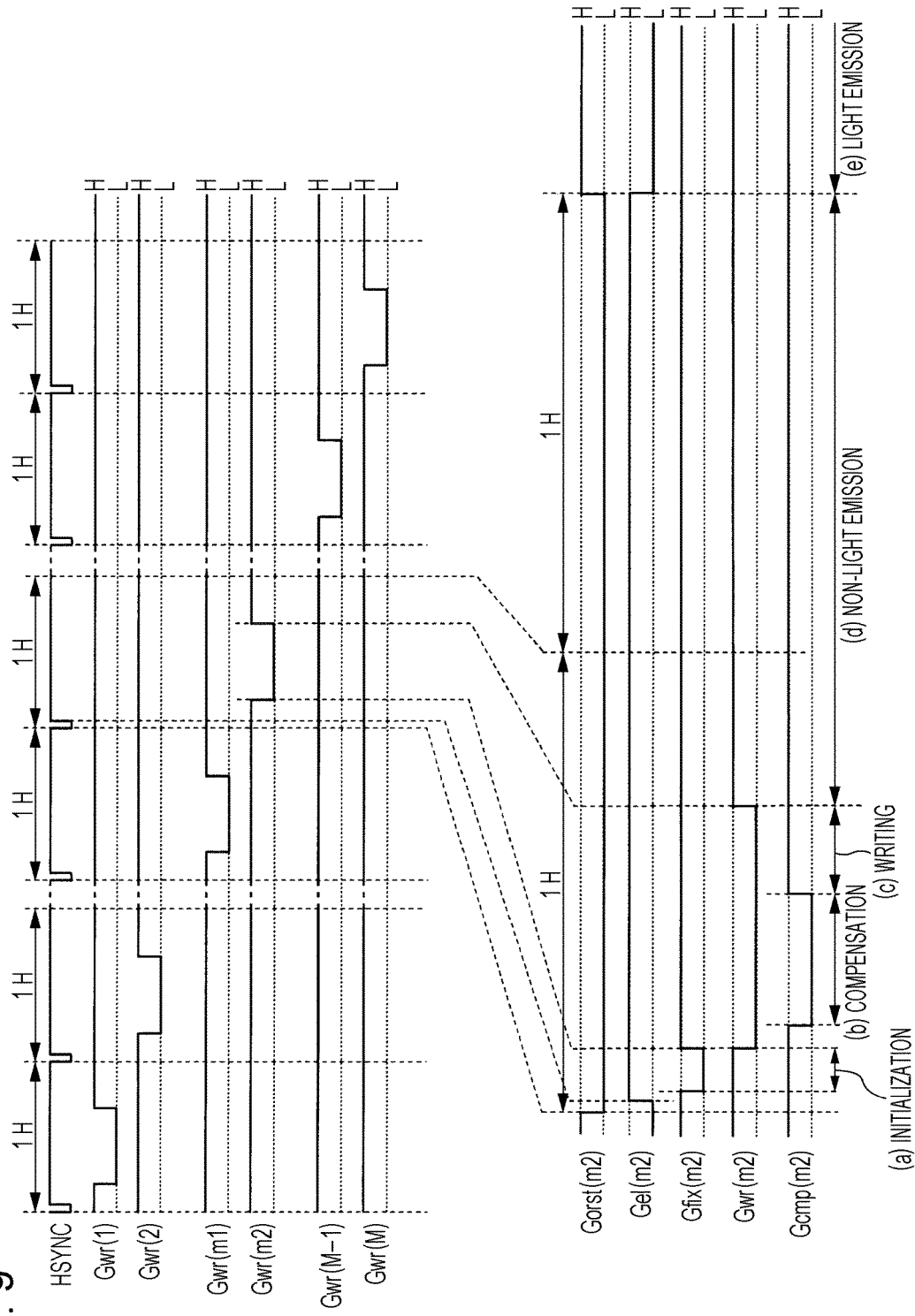
FIG. 9 is a timing chart illustrating the operation of the electro-optical device.

However, in the present embodiment, the second data transfer line 14-2 which is coupled to the pixel circuit 110 of the m1th row and the (3n−2)th column is separated from the second data transfer line 14-2 which is coupled to the pixel circuit 110 of the m2th row and the (3n−2)th column. Thus, the first transistor 126 which is controlled by the control signal Gfix(m1) is used during the initialization period of the m1th row, and the first transistor 126 which is controlled by the control signal Gfix(m2) is used during the initialization period of the m2th row, as illustrated in FIG. 9.

Compensation Period

If the initialization period ends, the compensation period starts. During the compensation period of the m1th row, the scan signal Gwr(m1) is in an L level, the control signal Gel(m1) is in an H level, the control signal Gcmp(m1) is in an L level, and the control signal Gfix(m1) is in an H level. The control signal Gorst(m1) is in an L level.

Figure 10:
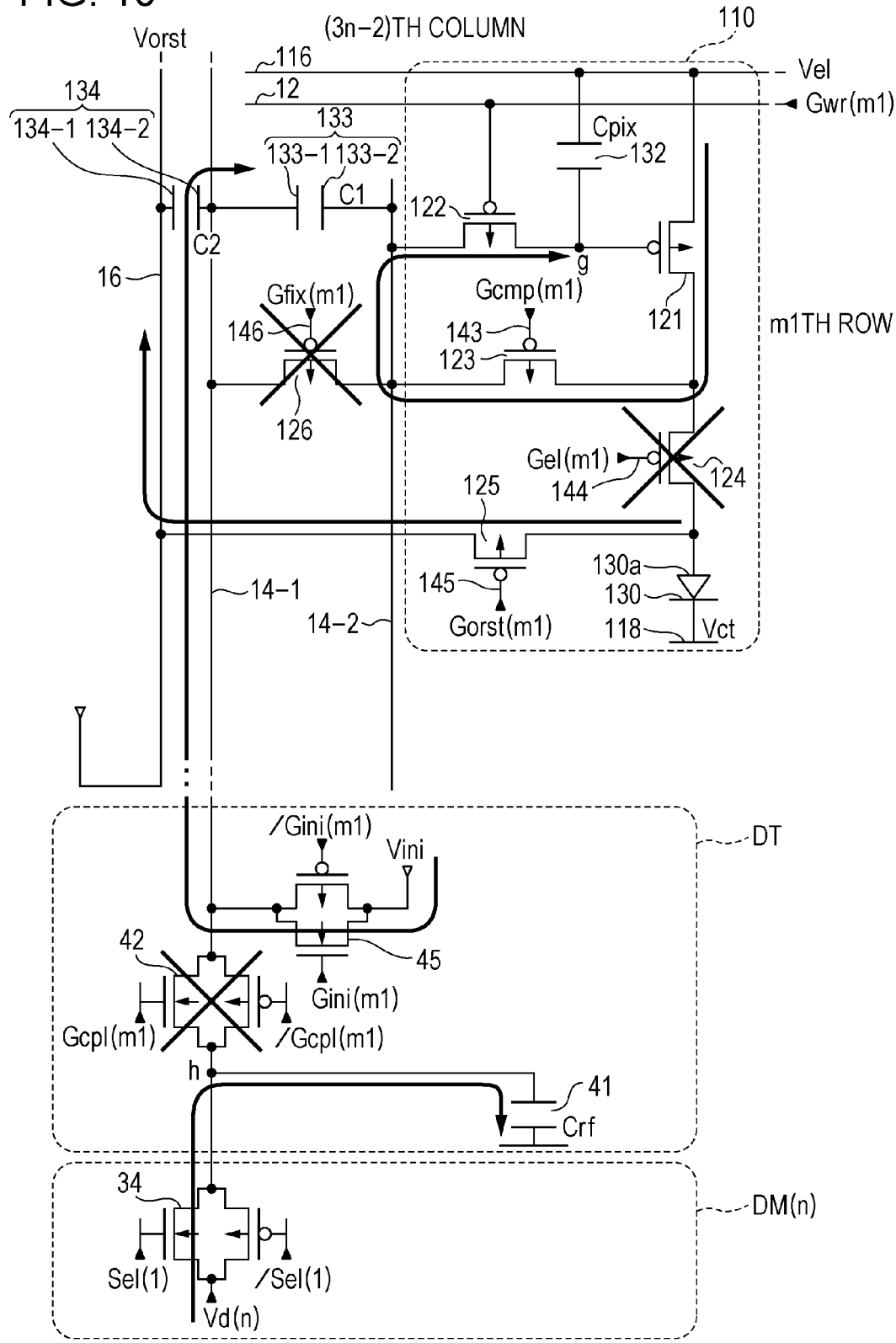
FIG. 10 is an operation explanatory diagram of the electro-optical device.

For this reason, as illustrated in FIG. 10, in the pixel circuit 110 of the m1th row and the (3n−2)th column, while the second transistor 122, the third transistor 123, and the fifth transistor 125 are turned on, the fourth transistor 124 and the first transistor 126 are turned off. At this time, the gate g of the drive transistor 121 is coupled (diode-coupled) to a drain of the drive transistor 121 through the second transistor 122 and third transistor 123, and a drain current flows through the drive transistor 121 thereby charging the gate g.

That is, the drain and gate g of the drive transistor 121 are coupled to the second data transfer line 14-2. If a threshold voltage of the drive transistor 121 is referred to as Vth, a potential Vg of the gate g of the drive transistor 121 gradually approaches (Vel−Vth).

Here, in the data transmission circuit DT during the compensation period, the control signal/Gini is in an L level and the control signal Gini is in an H level, and thereby the transmission gate 45 is turned on as illustrated in FIG. 10. In addition, the control signal Gcpl is in an L level and the control signal/Gcpl is in an H level, and thereby, the transmission gate 42 is turned off. At this time, the second data transfer line 14-2 is shortened compared to the configuration of the related art as described above, and thus a time required for charging or discharging of a parasitic capacitor accompanying the second data transfer line 14-2 is reduced, and the compensation period is shortened.

In addition, in the demultiplexer DM(n) during the compensation period, the control signal Sel(1) is in an H level and the control signal/Sel(1) is in an L level, and thereby the transmission gate 34 is turned on as illustrated in FIG. 10. As a result, a gradation potential is written to the retention capacitor 41 with a capacitance value Crf.

Since the fourth transistor 124 is turned off, the drain of the drive transistor 121 is electrically decoupled to the OLED 130. In addition, in the same manner as during the initialization period, the fifth transistor 125 is turned on, and thereby the anode 130a of the OLED 130 and the power supplying line 16 are electrically coupled to each other, and a potential of the anode 130a is set to a reset potential Vorst.

Writing Period

If the compensation period ends, the writing period starts. During the writing period of the m1th row, the scan signal Gwr(m1) is in an L level, the control signal Gel(m1) is in an H level, the control signal Gcmp(m1) is in an H level, and the control signal Gfix(m1) is in an H level. The control signal Gorst(m1) is in an L level.

Figure 11:
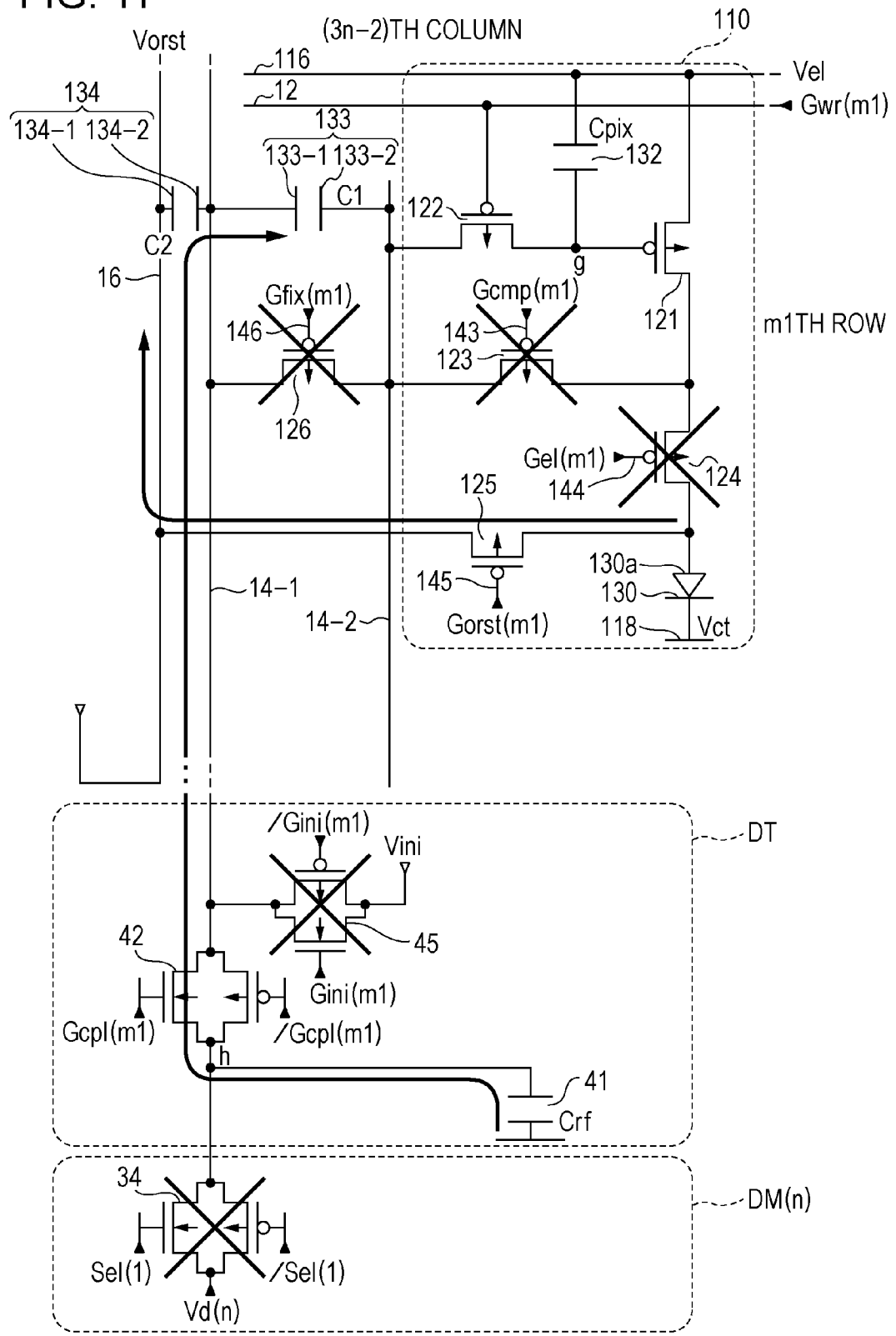
FIG. 11 is an operation explanatory diagram of the electro-optical device.

For this reason, as illustrated in FIG. 11, in the pixel circuit 110 of the m1th row and the (3n−2)th column, while the transistors 122 and 125 are turned on, the transistors 123, 124, and 126 are turned off.

Here, during the writing period, the control signal/Gini is in an H level, and thereby the transmission gate 45 is turned off, in the data transmission circuit DT, as illustrated in FIG. 11. In addition, the control signal Gcpl is in an H level, the transmission gate 42 is turned on as illustrated in FIG. 11.

For this reason, supplying of the initial potential Vini to the first data transfer line 14-1 and the first electrode 133-1 is released, one electrode of the retention capacitor 41 with the capacitance value Crf is coupled to the first data transfer line 14-1 and the first electrode 133-1, and a gradation potential is supplied to the first electrode 133-1. In addition, a signal which is generated by level-shifting the gradation potential is supplied to the gate of the drive transistor 121 and is written to the pixel capacitor 132. In this way, in the present embodiment, level-shift of the gradation potential is made by using the transmission gate 42 and the retention capacitor 41 of the data transmission circuit DT, and the transfer capacitor 133.

During the writing period, the control signal Sel(1) is in an L level, and thereby the transmission gate 34 is turned off, in the demultiplexer DM(n), as illustrated in FIG. 11.

Since the fourth transistor 124 is turned off, the drain of the drive transistor 121 is electrically decoupled to the OLED 130. In addition, in the same manner as, during the initialization period, the fifth transistor 125 is turned on, and thereby the anode 130a of the OLED 130 and the power supplying line 16 are electrically coupled to each other, and a potential of the anode 130a is set to a reset potential Vorst.

Until the writing period of the mth row starts (during the initialization period and the compensation period), the control circuit 3 sequentially switches the data signal Vd(n) to potentials according to gradation levels of the pixels of the mth row and the (3n−2) column, the mth row and the (3n−1)th column, and the mth row and (3n)th column, if the nth group is used as an example.

Meanwhile, the control circuit 3 sequentially and exclusively sets the control signals Sel(1), Sel(2), and Sel(3) to an H level, in accordance with switching of the potentials of the data signals. While not illustrated, the control circuit 3 also outputs the control signals/Sel(1),/Sel(2), and/Sel(3) which are in a relationship of logical inversion with the control signals Sel(1), Sel(2), and Sel(3). According to this, in the demultiplexer DM, the transmission gates 34 in each group are respectively turned on in a sequence of the left column, the central column, and the right column.

However, if, when the transmission gate 34 of the left column is turned on by the control signals Sel(1) and/Sel(1), a potential change amount of the first data transfer line 14-1 and the first electrode 133-1 is referred to as ΔV, and the second data transfer line 14-2 and a potential change amount ΔVg of the gate g of the drive transistor 121 are represented by the following (Expression 2). However, the capacitance value C1 of the transfer capacitor 133 can be adjusted in proportional to the number of rows of the pixel circuit 110, and is set to a capacitance C1a per row. In addition, a capacitance value of a parasitic capacitor accompanying the second data transfer line 14-2 is set to C3a per row. In addition, as described above, the number of rows of the pixel circuit 110 which is coupled to one second data transfer line 14-2 is referred to as Nb.

$$\Delta Vg = \frac{Nb \cdot C1a}{Nb \cdot C1a + Nb \cdot C3a + Cpix} \Delta V \quad \text{(Expression 2)}$$

Here, a ratio of ΔV and ΔVg is set as a compression rate R as represented by the following Expression 3.

$$R = \frac{Nb \cdot C1a}{Nb \cdot C1a + Nb \cdot C3a + Cpix} \quad \text{(Expression 3)}$$

That is, the potential Vg of the gate g of the drive transistor 121 in the writing period is a value which is level-shifted (data-compressed) from the potential Vg in the compensation period by a value that is obtained by multiplying the potential change amount ΔV of the first data transfer line 14-1 and the first electrode 133-1, and R together. If the writing period ends, the light emission period which will described below starts.

It can be seen from a relationship represented by Expression 2 described above that the greater the number Nb of the pixel circuits 110 which are coupled to the second data transfer line 14-2 is (the greater the number Nb of the pixel circuits 110 included in one block is), the closer values ΔVg and ΔV become. In other words, the greater a value of Nb is, the more R represented by Expression 3 approaches 1.

Here, it is preferable that the number Nb of the pixel circuits 110 (the number Nb of the pixel circuits 110 included in one block) which are coupled to the second data transfer line 14-2 is determined by taking into account a time required for completing a compensation operation, and a compression rate of data compression. Hereinafter, a specific description will be made.

To begin with, a time required for completing the compensation operation will be described. It is preferable that the potential Vg (compensation point) of the gate g of the drive transistor 121 at a time point in which the compensation period is completed is set to an intermediate gradation of a gradation voltage, and the smaller the value of Nb is, the smaller a parasitic capacitor accompanying the gate g of the drive transistor 121 is, and thereby the compensation period is extremely shortened. As a result, there is a possibility that, by an influence of rounding at rising edge (falling edge) of the scan signal Gwr(m), the compensation periods on a side which supplies the scan signal Gwr(m) and a side which receives the scan signal Gwr(m) are different from each other. In this case, the scan line drive circuit 6 with a high drive capability enough to eliminate the possibility is required.

In addition, with regard to a compression rate of data compression, as represented by Expression 2, the smaller the value of Nb is, the greater the compression rate is, and conversely, the greater the value of Nb is, the smaller the compression rate is.

Thus, it is preferable that the value of Nb is set to an appropriate value by taking into account the time required for completing the compensation period and the compression rate of data compression. For example, in a case in which the total number of rows M is 720, Nb may be 90 and the total number of blocks K may be 8.

Non-Light Emission Period

As illustrated in the timing chart of FIG. 7, if the scan signal Gwr(m1) goes to an H level from an L level and the writing period ends, the remaining period of one horizontal scan period (H) and next one horizontal scan period (H) become a non-light emission period. During the non-light emission period, all the transistors are off, and the control signal Gorst(m1) is in an L level.

Light Emission Period

If the non-light emission period ends, the light emission period starts. As illustrated in the timing chart of FIG. 7, during the light emission period of m1th row, the scan signal Gwr(m1) is in an H level, the control signal Gel(m1) is in an L level, the control signal Gcmp(m1) is in an H level, and the control signal Gfix(m1) is in an H level. The control signal Gorst(m1) is in an H level.

Figure 12:
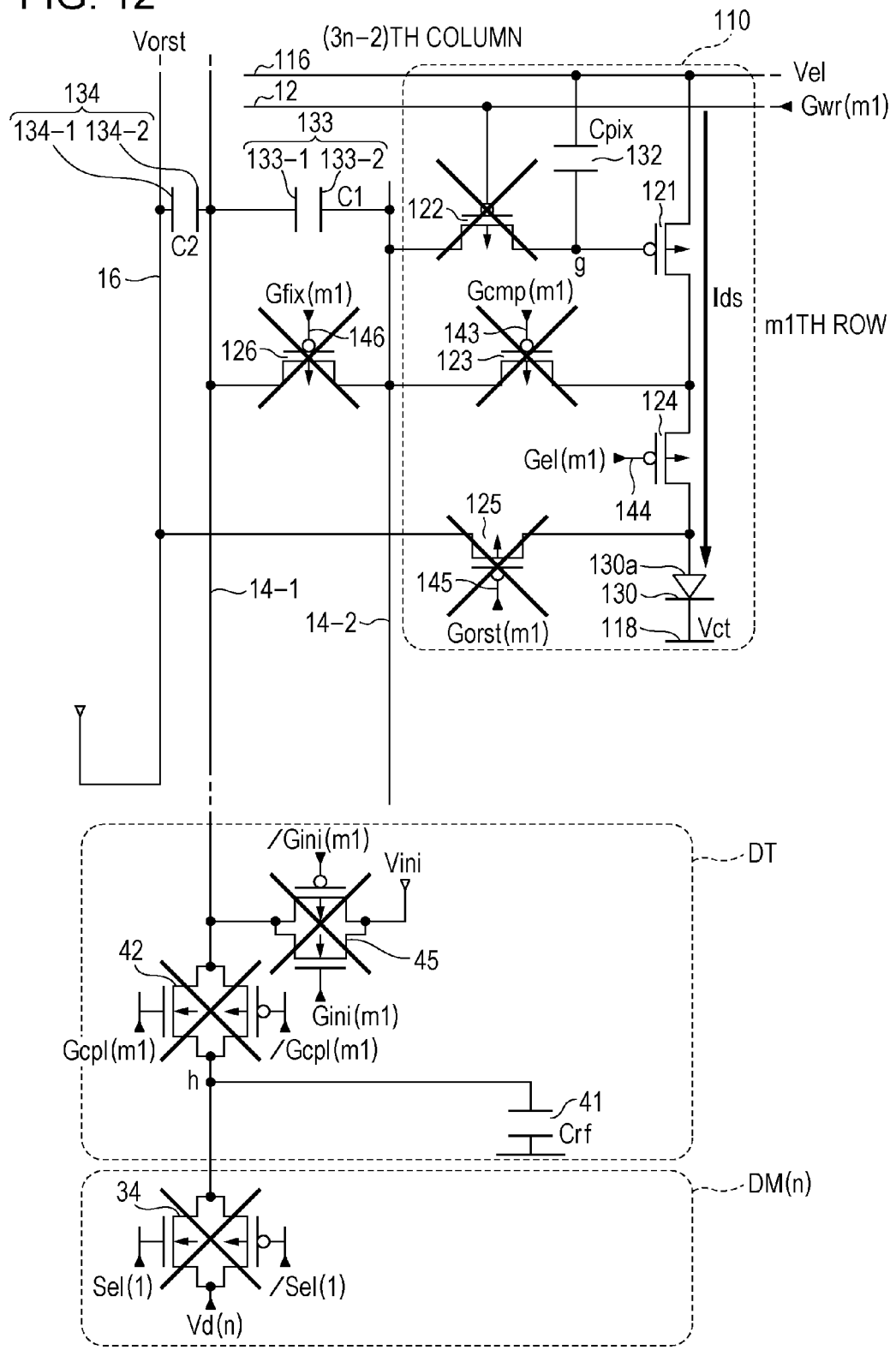
FIG. 12 is an operation explanatory diagram of the electro-optical device.

For this reason, while the fourth transistor 124 is turned on, the second transistor 122, the third transistor 123, the fifth transistor 125, and the first transistor 126 are turned off, in the pixel circuit 110 of the m1th row and the (3n−2)th column, as illustrated in FIG. 12. As a result, the drive transistor 121 supplies the OLED 130 with a voltage retained in the pixel capacitor 132, that is, a drive current Ids according to a gate-source voltage Vgs. That is, a current corresponding to a gradation voltage according to gradation designated to each pixel is supplied to the OLED 130 by the drive transistor 121, and the OLED 130 emits with luminance according to the current.

Here, during the light emission period, the control signal/Gini is in an H level and the control signal Gini is in an L level, and thereby the transmission gate 45 is turned off, and, the control signal Gcpl is in an L level and the control signal/Gcpl is in an H level, and thereby the transmission gate 42 is turned off, in the data transmission circuit DT, as illustrated in FIG. 12. In addition, during the light emission period, the control signal Sel(1) is in an L level and the control signal/Sel(1) is in an H level, and thereby the transmission gate 34 is turned off, in the demultiplexer DM(n).

Since the light emission period of the m1th row is a period in which rows other than the m1th row are horizontally scanned, the transmission gate 34, the transmission gate 42, and the transmission gate 45 are turned on or off in accordance with the operations of the rows, and thereby potentials of the first data transfer line 14-1 and the second data transfer line 14-2 are appropriately changed. Particularly, in a case where the first transistor 126, the second transistor 122, and the third transistor 123 are turned off, the second data transfer line 14-2 enters a floating state, and a potential thereof easily changes.

Accordingly, in the present embodiment, during the light emission period of one block B, the first transistor 126 is turned on, and thereby the first data transfer line 14-1 and the second data transfer line 14-2 enters a conduction state, and a period in which the initial potential Vini is supplied to the second data transfer line 14-2 is set.

If a block to which the pixel circuit 110 of the m1th row, the m2th row, or the like belongs is referred to as a block B(m), the initialization period of a block B(n) subsequent to the block B(m) is a light emission period of the block B(m). For example, if the block B(n) subsequent to the block B(m) is referred to as one block and the block B(m) is referred to as another block, during the initialization period of the block B(n) which is the one block and during the light emission period of the block B(m) which is another block, the first transistor 126 is turned on, and thereby the first data transfer line 14-1 and the second data transfer line 14-2 enter a conduction state, and the initial potential Vini is supplied to the second data transfer line 14-2.

Figure 13:
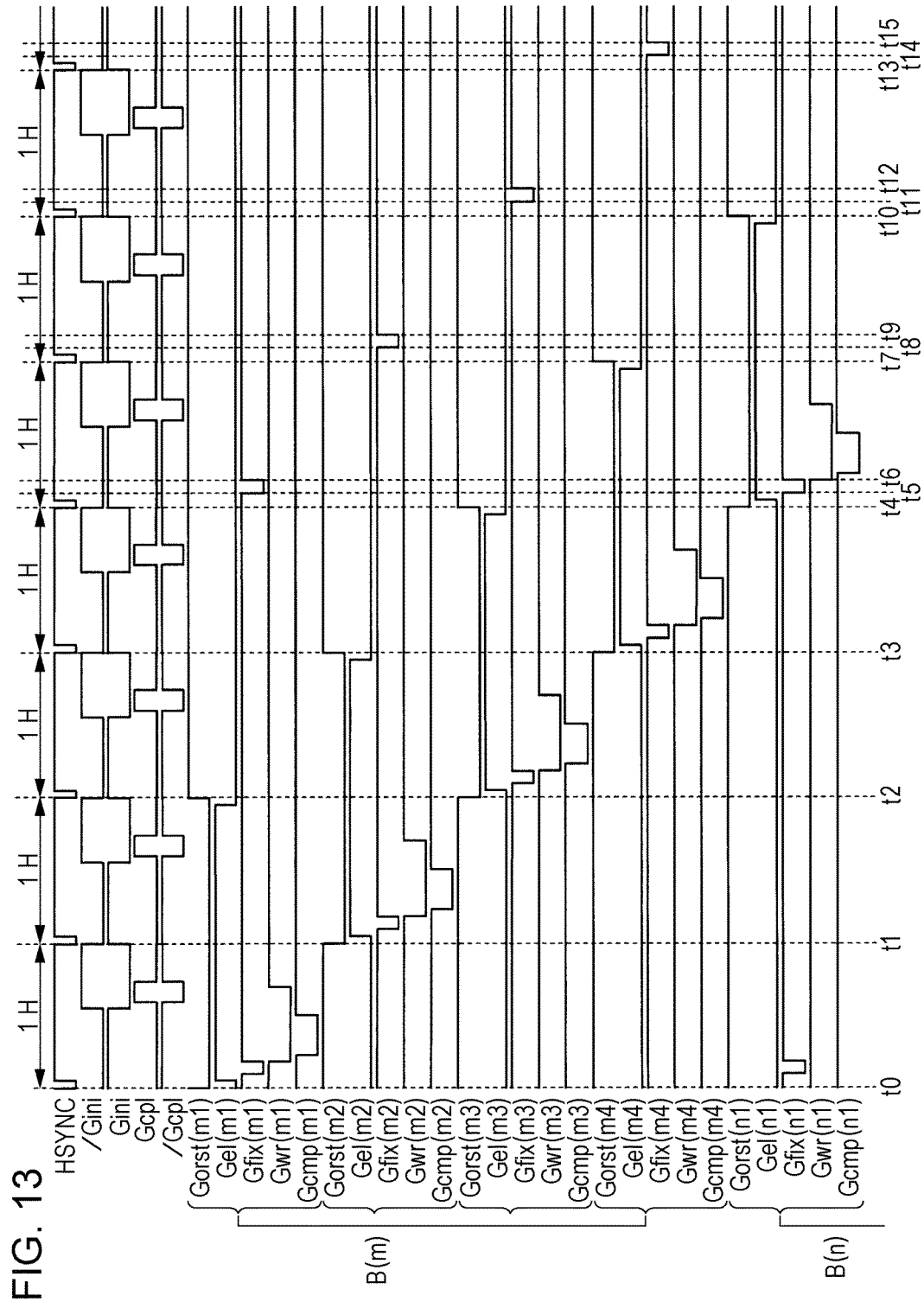
FIG. 13 is a timing chart illustrating the operation of the electro-optical device.

As illustrated in FIG. 13, during a period from a point of time t1 to a point of time t4, the block B(m) performs processing of the initialization period, the contact position, and the writing period.

Figure 14:
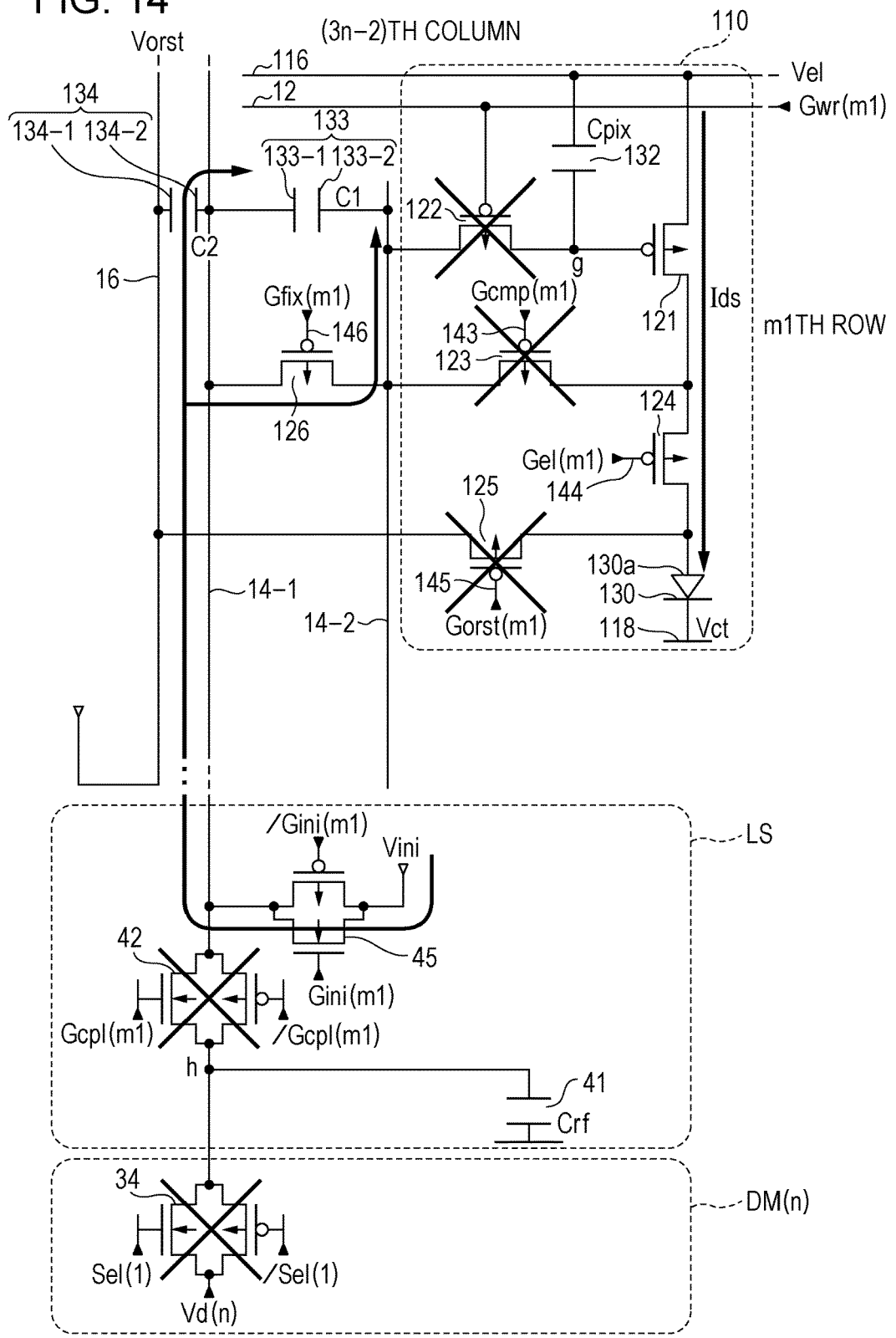
FIG. 14 is an operation explanatory diagram of the electro-optical device.

During a period from a point of time t5 to a point of time t6, processing of the initialization period is performed in the block B(n) which is a block subsequent to the block B(m), but the period is the light emission period of the block B(m). However, in the present embodiment, when processing of the initialization period is performed in the block B(n), the control signals Gfix are in an L level in the block B(m) to another block B. As a result, as illustrated in FIG. 14, the first transistor 126 is turned on, the first data transfer line 14-1 and the second data transfer line 14-2 enter a conduction state, and the initial potential Vini is supplied to the second data transfer line 14-2, in the block B(m) to another block B.

Hereinafter, in the same manner, during a period from a point of time t8 to a point of time t9, a period from a point of time t11 to a point of time t12, and a period from a point of time t14 to a point of time t15, in which processing of the initialization period is performed in the block B(n), the control signals Gfix are in an L level in the block B(m) to another block B. As a result, as illustrated in FIG. 14, the first transistor 126 is turned on, the first data transfer line 14-1 and the second data transfer line 14-2 enter a conduction state, and the initial potential Vini is supplied to the second data transfer line 14-2, in the block B(m) to another block B.

As described above, according to the present embodiment, the second data transfer line 14-2 on the transfer capacitor 133 side of the second transistor 122, which becomes a floating node during the light emission period, is set to the initial potential Vini of a fixed potential during a period in which processing of the initialization period is performed in other blocks. Thus, it is possible to prevent a potential of the second data transfer line 14-2 from approaching a power supply voltage. As a result, the second transistor 122 is not turned on, a voltage is retained in the pixel capacitor 132, and display failure does not occur.

Structure

Figure 15:
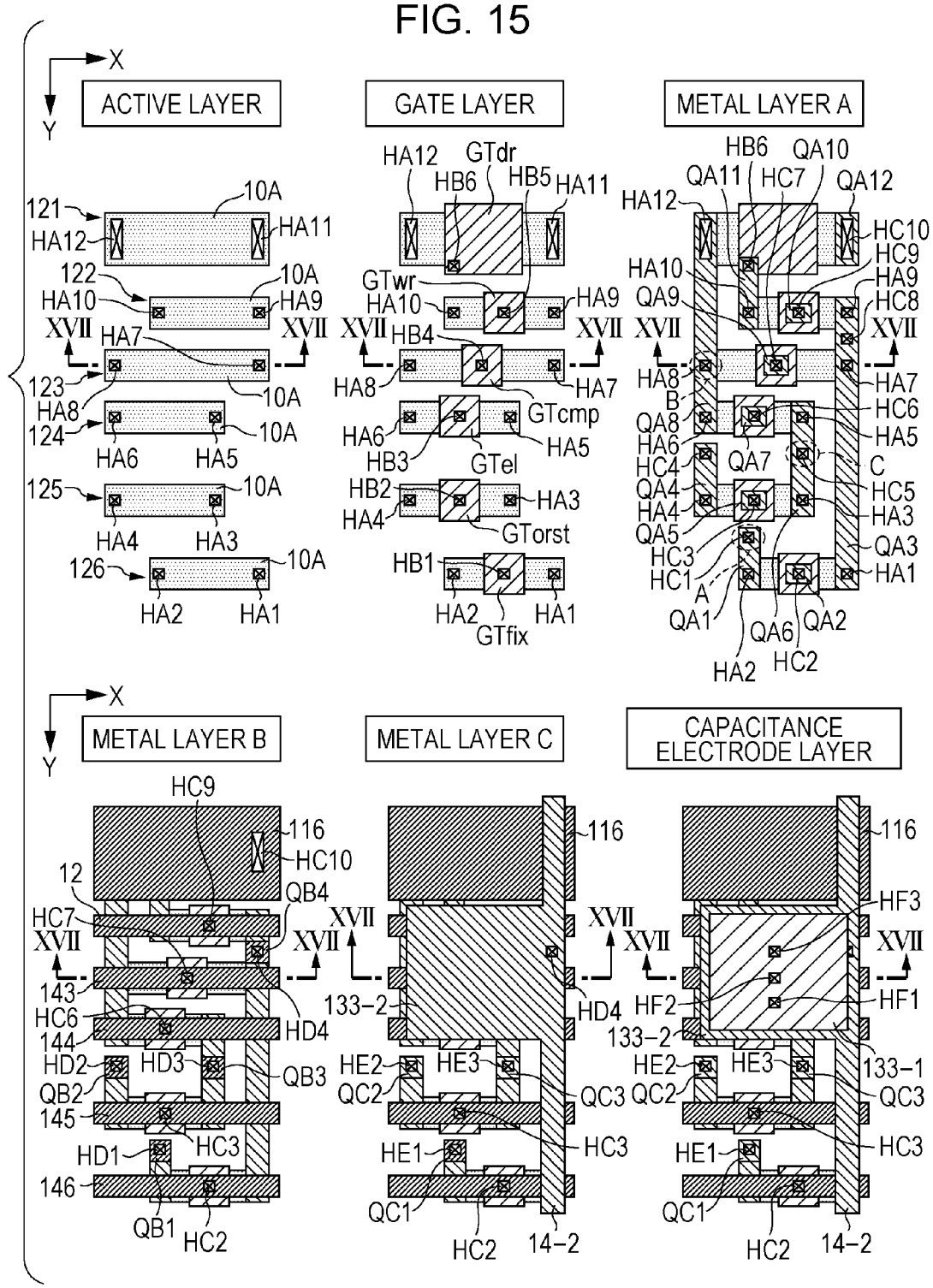
FIG. 15 is an explanatory view of each unit which is formed on a substrate.
Figure 16:
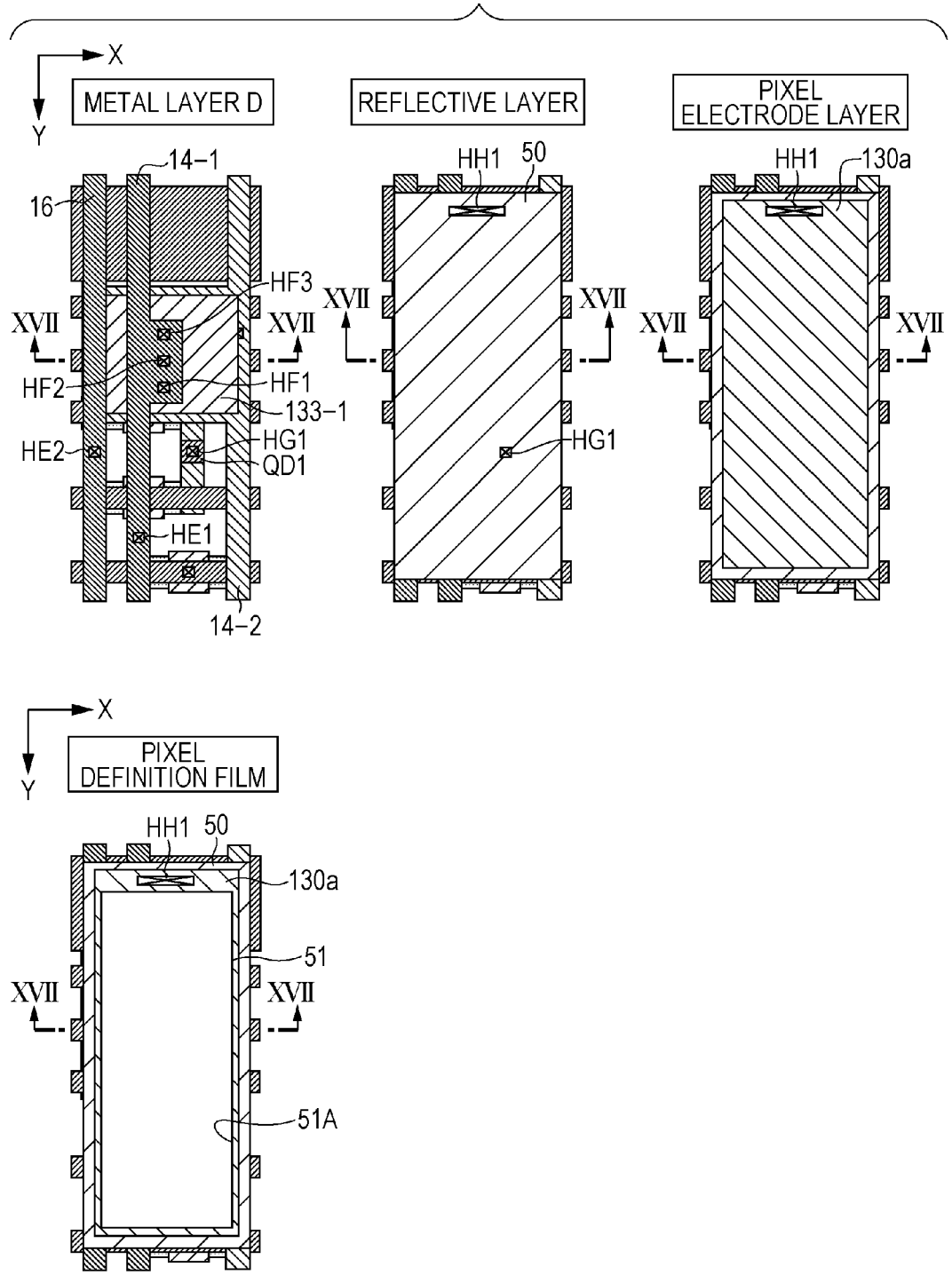
FIG. 16 is an explanatory view of each unit which is formed on a substrate.
Figure 17:
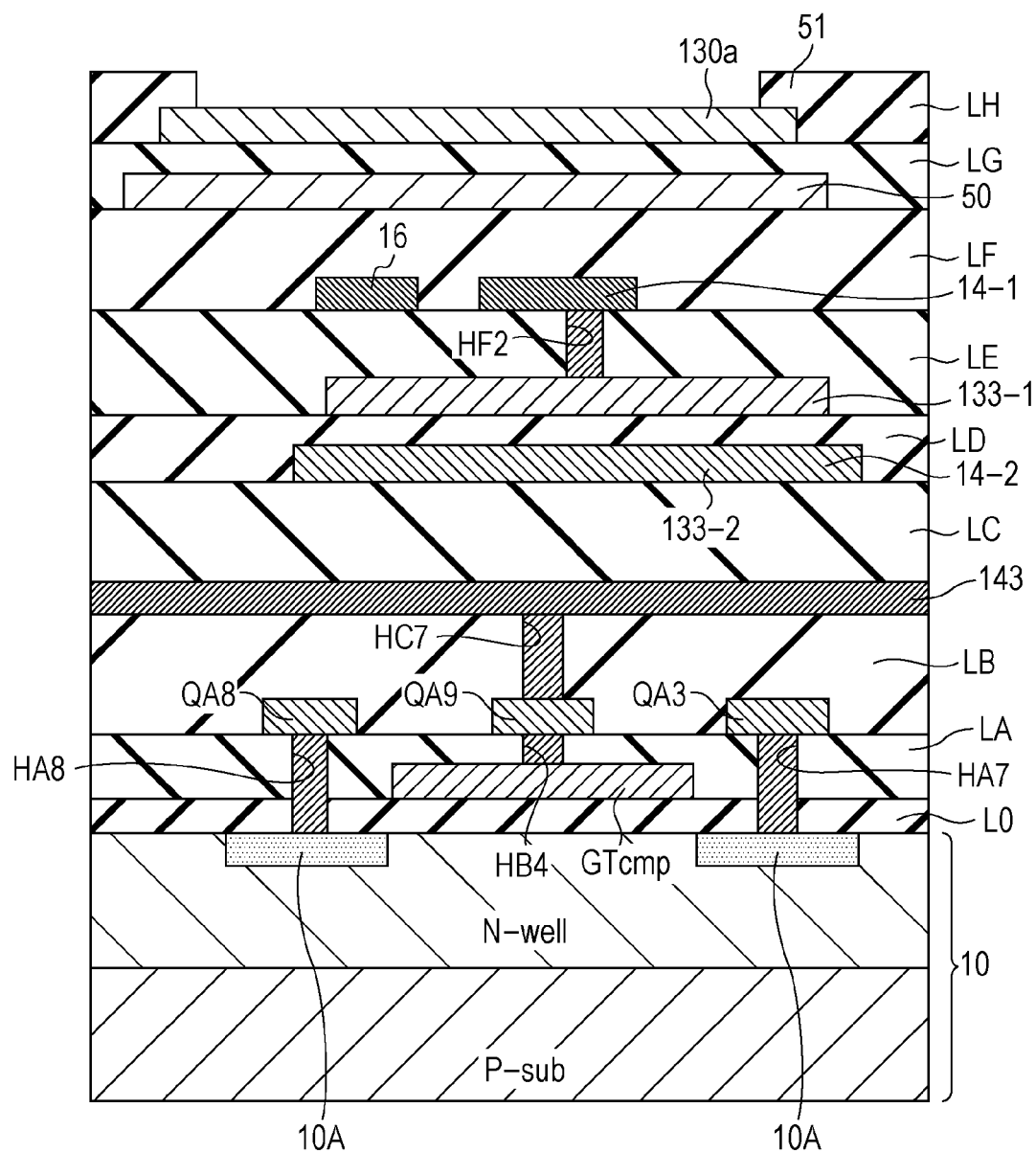
FIG. 17 is a sectional view of a light emitting device.

Next, a specific structure of the electro-optical device 1 according to the present embodiment will be hereinafter described. In each figure which is used in the following description, dimensions and scales of each element are illustrated differently from actual dimensions and scales of the electro-optical device 1, for the sake of convenience of description. FIG. 15 and FIG. 16 are plan views illustrating states of surfaces of a substrate 10 in each step in which each element of the electro-optical device 1 is formed, in one pixel circuit 110. FIG. 17 is a sectional view of the electro-optical device 1. FIG. 17 is a sectional view corresponding to a cross section including lines XVII-XVII of FIG. 15 and FIG. 16. In the plan views of FIG. 15 and FIG. 16, hatching of the same shape as in FIG. 17 is conveniently added to the respective elements which are common to those of FIG. 17, from a viewpoint of facilitating visual understanding of each element.

As can be understood from the part of active layers of FIG. 15 and FIG. 17, active regions 10A (source/drain regions) of the respective transistors 121, 122, 123, 124, 125, and 126 of the pixel circuit 110 are formed on a surface of the substrate 10 which is formed of a semiconductor material such as silicon. Ions are injected into the active regions 10A. Active layers of the respective transistors 121, 122, 123, 124, 125, and 126 of the pixel circuit 110 are located between source regions and drain regions, and ions of different types from those which are injected into the active region 10A are injected into the active layers, but the active regions are described as one piece with the active region 10A for the sake of convenience.

As can be understood from the part of a gate layer of FIG. 15 and FIG. 17, a surface of the substrate 10 on which the active region 10A is formed is covered with an insulating film L0 (gate insulating film), and gate layers GT (GTdr, GTwr, GTcmp, GTel, GTorst, and GTfix) of the respective transistors 121, 122, 123, 124, 125, and 126 are formed on a surface of the insulating film L0. The gate layers GT of the respective transistors 121, 122, 123, 124, 125, and 126 faces the active layers in a state where the insulating film L0 are interposed therebetween.

As can be understood from FIG. 17, a multilayer wiring layer in which a plurality of insulating layers L (LA to LH) and a plurality of conductive layers (wiring layers) are alternately stacked is formed on the surface of the insulating film L0 in which the gate layers GT of the respective transistors 121, 122, 123, 124, 125, and 126 are formed. Each of the insulating films L is formed of an insulating inorganic material such as a silicon compound (typically silicon nitride or silicon oxide). In the following description, a relationship in which a plurality of elements are collectively formed in the same step by selective removal of a conductive layer (single layer or multiple layers) is referred to as "it is formed from the same layer".

The insulating layer LA is formed on a surface of the insulating film L0 in which the gate layers GT of the respective transistors 121, 122, 123, 124, 125, and 126 are formed. As can be understood from the part of a metal layer A of FIG. 15 and FIG. 17, a plurality of relay electrodes QA (QA1 to QA12) are formed on a surface of the insulating layer LA.

As can be understood from the part of a metal layer A of FIG. 15 and FIG. 17, the relay electrode QA1 is electrically coupled to the active region 10A which formed a drain region or a source region of the first transistor 126 through a conduction hole HA2 which penetrates the insulating film L0 and the insulating layer LA. The relay electrode QA2 is electrically coupled to the gate layer GTfix of the first transistor 126 through a conduction hole HB1 which penetrates the insulating layer LA. The relay electrode QA3 is electrically coupled to the active region 10A which forms a drain region or a source region of the first transistor 126 through a conduction hole Ha1 which penetrates the insulating film L0 and the insulating layer LA. In addition, the relay electrode QA3 is electrically coupled to the active region 10A which forms a drain region or a source region of the third transistor 123 though the conduction hole HA7 which penetrates the insulating film L0 and the insulating layer LA. Furthermore, the relay electrode QA3 is electrically coupled to the active region 10A which forms a drain region or a source region of the second transistor 122 though the conduction hole HA9 which penetrates the insulating film L0 and the insulating layer LA. As described above, the relay electrode QA3 is a source electrode, and is formed by directly coming into contact with the active region 10A which forms a drain region or a source region of the first transistor 126, the active region 10A which forms a drain region or a source region of the third transistor 123, and the active region 10A which forms a drain region or a source region of the second transistor 122.

The relay electrode QA4 is electrically coupled to the active region 10A which forms a drain region or a source region of the fifth transistor 125 through the conduction hole HA4 which penetrates the insulating film L0 and the insulating layer LA. The relay electrode QA5 is electrically coupled to the gate layer GTorst of the fifth transistor 125 through the conduction hole HB2 which penetrates the insulating layer LA. The relay electrode QA6 is electrically coupled to the active region 10A which forms a drain region or a source region of the fifth transistor 125 through the conduction hole HA3 which penetrates the insulating layer LA and the insulating film L0.

In addition, the relay electrode QA6 is electrically coupled to the active region 10A which forms a drain region or a source region of the fourth transistor 124 through the conduction hole HA5 which penetrates the insulating layer LA and the insulating film L0. The relay electrode QA7 is electrically coupled to the gate layer GTe1 of the fourth transistor 124 through the conduction hole HB3 which penetrates the insulating layer LA. The relay electrode QA8 is electrically coupled to the active region 10A which forms a drain region or a source region of the fourth transistor 124 through the conduction hole HA6 which penetrates the insulating layer LA and the insulating film L0. In addition, the relay electrode QA8 is electrically coupled to the active region 10A which forms a drain region or a source region of the third transistor 123 through the conduction hole HA8 which penetrates the insulating layer LA and the insulating film L0. Furthermore, the relay electrode QA8 is electrically coupled to the active region 10A which forms a drain region or a source region of the drive transistor 121 through the conduction hole HA12 which penetrates the insulating layer LA and the insulating film L0. As described above, the relay electrode QA6 is a source electrode, and is formed by directly coming into contact with the active region 10A which forms a drain region or a source region of the fourth transistor 124. In addition, the relay electrode QA8 is also a source electrode, and is formed by directly coming into contact with the active region 10A which forms a drain region or a source region of the fourth transistor 124, the active region 10A which forms a drain region or a source region of the third transistor 123, and the active region 10A which forms a drain region or a source region of the drive transistor 121.

The relay electrode QA9 is electrically coupled to the gate layer GTcmp of the third transistor 123 through the conduction hole HB4 which penetrates the insulating layer LA. The relay electrode QA10 is electrically coupled to the gate layer GTwr of the second transistor 122 through the conduction hole HB5 which penetrates the insulating layer LA. The relay electrode QA11 is electrically coupled to the active region 10A which forms a drain region or a source region of the second transistor 122 through the conduction hole HA10 which penetrates the insulating layer LA and the insulating film L0. In addition, the relay electrode QA11 is electrically coupled to the gate layer GTdr of the drive transistor 121 through the conduction hole HB6 which penetrates the insulating layer LA. The relay electrode QA12 is electrically coupled to the active region 10A which forms a drain region or a source region of the drive transistor 121 through the conduction hole HA11 which penetrates the insulating layer LA and the insulating film L0.

An insulating layer LB is formed on the surface of the insulating layer LA in which the plurality of relay electrodes QA (QA1, QA2, QA3, QA4, QA5, QA6, QA7, QA8, QA9, QA10, QA11, and QA12) are formed. As can be understood from the part of a metal layer B of FIG. 15 and FIG. 17, the scan line 12, the power supplying line 116, the plurality of control lines 143 to 146, and a plurality of relay electrodes QB (QB1, QB2, QB3, and QB4) are formed on a surface of the insulating layer LB.

As can be understood from the part of the metal layer B of FIG. 15 and FIG. 17, the scan line 12 which is used as an example of a first conductive line is electrically coupled to the gate layer GTwr of the second transistor 122 through a conduction hole HC9 which penetrates the insulating layer LB. The scan line 12 extends in a direction (X direction) of a channel length of the second transistor 122 across the pixel circuit 110.

The power supplying line 116 is electrically coupled to a mounting terminal to which the power supply potential Vel on a high side is applied, through a wire (not illustrated) in the multilayer wiring layer. The power supplying line 116 is formed of a conductive material, which contains, for example, silver or aluminum, with a thickness of, for example, approximately 100 nm. The power supplying line 116 is electrically coupled to the active region 10A which forms a drain region or a source region of the drive transistor 121 through a conduction hole HC10 which penetrates the insulating layer LB. The power supplying line 116 extends in a direction (X direction) of a channel length of the drive transistor 121 across the pixel circuit 110. The power supplying line 116 is electrically insulated from the second electrode 133-2 of the transfer capacitor 133 which will be described below, by an insulating layer LC.

As can be understood from the part of a metal layer B of FIG. 15 and FIG. 17, the control line 143 is electrically coupled to the gate layer GTcmp of the third transistor 123 through a conduction hole HC7 which penetrates the insulating layer LB, the relay electrode QA9, and the conduction hole HB4 which penetrates the insulating layer LA. In addition, the control line 143 extends in a direction (X direction) of a channel length of the third transistor 123.

As can be understood from the section indicating the metal layer B of FIG. 15 and FIG. 17, the control line 144 is electrically coupled to the gate layer GTe1 of the fourth transistor 124 through a conduction hole HC6 which penetrates the insulating layer LB, the relay electrode QA7, and the conduction hole HB3 which penetrates the insulating layer LA. In addition, the control line 144 extends in a direction (X direction) of a channel length of the fourth transistor 124.

The control line 145 is electrically coupled to the gate layer GTorst of the fifth transistor 125 through a conduction hole HC3 which penetrates the insulating layer LB, the relay electrode QA5, and the conduction hole HB2 which penetrates the insulating layer LA. In addition, the control line 145 extends in a direction (X direction) of a channel length of the fifth transistor 125.

The control line 146 is electrically coupled to the gate layer GTfix of the first transistor 126 through a conduction hole HC2 which penetrates the insulating layer LB, the relay electrode QA2, and the conduction hole HB1 which penetrates the insulating layer LA. In addition, the control line 146 extends in a direction (X direction) of a channel length of the first transistor 126.

As can be understood from the part of the metal B and the metal layer A of FIG. 15, a relay electrode QB1 is electrically coupled to the relay electrode QA1 through a conduction hole HC1 which penetrates the insulating layer LB. A relay electrode QB2 is electrically coupled to the relay electrode QA4 through a conduction hole HC4 which penetrates the insulating layer LB. A relay electrode QB3 is electrically coupled to the relay electrode QA6 through a conduction hole HC5 which penetrates the insulating layer LB. A relay electrode QB4 is electrically coupled to the relay electrode QA3 through a conduction hole HC8 which penetrates the insulating layer LB.

The insulating layer LC is formed on a surface of the insulating layer LB in which the scan lines 12, the plurality of control lines 143 to 146, and the plurality of relay electrodes QB (QB1, QB2, QB3, and QB4) are formed. As can be understood from the part of a metal layer C of FIG. 15 and FIG. 17, the second data transfer line 14-2, the second electrode 133-2 of the transfer capacitor 133, a plurality of relay electrodes QC (QC1, QC2, and QC3) are formed on a surface of the insulating layer LC.

The second data transfer line 14-2 which is used as an example of a third conductive layer extends in an Y direction across the plurality of pixel circuits 110. The second data transfer line 14-2 is electrically coupled to the active region 10A which forms a drain region or a source region of the second transistor 122 through a conduction hole HD4 which penetrates the insulating layer LC, the relay electrode QB4, a conduction hole HC8 which penetrates the insulating layer LB, and the relay electrode QA3. In addition, the second data transfer line 14-2 is electrically coupled to the active region 10A which forms a drain region or a source region of the third transistor 123 and the active region 10A which forms a drain region or a source region of the first transistor 126.

The second electrode 133-2 which is used as an example of a fifth conductive layer of the transfer capacitor (first capacitor) 133 is an rectangular electrode which covers the scan line 12, the control line 143, and the control line 144, and is formed as one piece with the second data transfer line 14-2, in the pixel circuit 110.

As can be understood from FIG. 15 and FIG. 17, the relay electrode QC1 is electrically coupled to the relay electrode QB1 through a conduction hole HD1 which penetrates the insulating layer LC. The relay electrode QC2 is electrically coupled to the relay electrode QB2 through a conduction hole HD2 which penetrates the insulating layer LC. The relay electrode QC3 is electrically coupled to the relay electrode QB3 through a conduction hole HD3 which penetrates the insulating layer LC.

An insulating layer LD is formed on a surface of the insulating layer LC in which the second data transfer line 14-2, the second electrode 133-2 of the transfer capacitor 133, and the plurality of relay electrodes QC (QC1, QC2, and QC3) are formed. As can be understood from the part of the capacitance electrode layer of FIG. 15 and FIG. 17, the first electrode 133-1 of the transfer capacitor 133 is formed on a surface of the insulating layer LD.

The first electrode 133-1 which is used as an example of a fourth conductive layer of the transfer capacitor (first capacitor) 133 is an rectangular capacitance electrode which faces the second electrode 133-2 through the insulating layer LD. The first electrode 133-1 faces the second electrode 133-2 through the insulating layer LD. In this way, the transfer capacitor 133 is configured by the first electrode 133-1 which is a metal, the insulating layer LD, and the second electrode 133-2 which is a metal, and has a metal-insulator-metal (MIM) structure. Hence, it is easy for the transfer capacitor 133 to have larger capacitance. In addition, since the transfer capacitor 133 is formed in a display region of the pixel circuit 110, it is possible to miniaturize the electro-optical device.

An insulating layer LE is formed on a surface of the insulating layer LD in which the first electrode 133-1 of the transfer capacitor 133 is formed. As can be understood from the part of a metal layer D of FIG. 16 and FIG. 17, the first data transfer line 14-1, the power supplying line 16, and a relay electrode QD1 is formed on a surface of the insulating layer LE.

The first data transfer line 14-1 which is used as an example of a second conductive layer extends in the Y direction across the pixel circuit 110. The first data transfer line 14-1 is electrically coupled to the first electrode 133-1 of the transfer capacitor 133 through conduction holes HF1, HF2, and HF3 which penetrate the insulating layer LE. In addition, the first data transfer line 14-1 is electrically coupled to the active region 10A which forms the drain region or the source region of the first transistor 126 through the conduction hole HE1 which penetrates the insulating layer LE and the insulating layer LD, the relay electrode QC1, the conduction hole HD1 which penetrates the insulating layer LC, the relay electrode QB1, the conduction hole HC1 which penetrates the insulating layer LB, the relay electrode QA1, and the conduction hole HA2 which penetrates the insulating layer LA and the insulating film L0.

The power supplying line 16 which is used as a sixth conductive layer extends in the Y direction across the pixel circuit 110. The power supplying line 16 is electrically coupled to the active region 10A which forms the drain region or the source region of the fifth transistor 125 through the conduction hole HE2 which penetrates the insulating layer LE and the insulating layer LD, the relay electrode QC2, the conduction hole HD2 which penetrates the insulating layer LC, the relay electrode QB2, the conduction hole HC4 which penetrates the insulating layer LB, the relay electrode QA4, and the conduction hole HA4 which penetrates the insulating layer LA and the insulating film L0. The relay electrode QD1 is electrically coupled to the relay electrode QC3 through the conduction hole HE3 which penetrates the insulating layer LE.

In addition, the power supplying line 16 is formed in the same layer as the first data transfer line 14-1, and is disposed so as to have a predetermined gap between the power supplying line 16 and the first data transfer line 14-1 through an insulating layer LF. By doing so, the shield capacitor (second capacitor) 134 is formed, and the first data transfer line 14-1 is shielded by the power supplying line 16 which functions as a shield line.

An insulating layer LF is formed on a surface of the insulating layer LE in which the first data transfer line 14-1, the power supplying line 16, and the relay electrode QD1 are formed. As can be understood from the part of a reflective layer of FIG. 16 and FIG. 17, a reflective layer 50 is formed on a surface of the insulating layer LF. The reflective layer 50 is independently formed in each pixel circuit 110. The reflective layer 50 is formed of a conductive material with a light-reflective property, which contains, for example, silver or aluminum, with a thickness of, for example, approximately 100 nm. As can be understood from the part of the reflective layer of FIG. 16 and FIG. 17, the reflective layer 50 is electrically coupled to the relay electrode QD1 through a conduction hole HG1 which penetrates the insulating layer LF. The relay electrode QD1 is electrically coupled to the drain region or the source region of the fourth transistor 124 and the drain region or the source region of the fifth transistor 125 through the conduction hole HE3, the relay electrode QC3, the conduction hole HD3, the relay electrode QB3, the conduction hole HC5, the relay electrode QA6, the conduction hole HA5, and the conduction hole HA3.

As can be seen from FIG. 17, a light path adjustment layer LG is formed on a surface of the insulating layer LF on which the reflective layer 50 is formed. The light path adjustment layer LG is a film body with optical transparency which defines a resonance wavelength (that is, display color) of a resonance structure of the pixel circuit 110. The resonance wavelengths of the resonance structure are set to be approximately the same in pixels having the same display color, and the resonance wavelength of the resonance structure are set to be different in pixels having different display colors.

As can be seen from the part of a pixel electrode layer of FIG. 16 and FIG. 17, anodes 130a in each pixel circuit 110 are formed on a surface of the light path adjustment layer LG. The anode 130a is formed of a conductive material with optical transparency such as indium tin oxide (ITO). The anode 130a is electrically coupled to the reflective layer 50 through a conduction hole HH1 which penetrates the light path adjustment layer LG. Hence, the anode 130a is electrically coupled to the drain region or the source region of the fourth transistor 124 and the drain region or the source region of the fifth transistor 125 through the reflective layer 50.

As illustrated in the part of a pixel definition film of FIG. 16 and FIG. 17, a pixel definition film 51 is formed on a surface of the light path adjustment layer LG on which the anode 130a is formed, over the entire substrate 10. The pixel definition film 51 is formed of an insulating inorganic material such as a silicon compound (typically, silicon nitride or silicon oxide). As can be understood from the part of the pixel definition film of FIG. 16, an opening 51A corresponding to each anode 130a is formed in the pixel definition film 51. A region around an inner circumference of the opening 51A of the pixel definition film 51 overlaps a circumference of the anode 130a. That is, the inner circumference of the opening 51A is located at the inside of the circumference of the anode 130a in a planar view. The respective openings 51A have a plan shape (rectangular shape) or a common size, and are arranged in a matrix with a common pitch in the X direction and Y direction. As can be understood from the aforementioned description, the pixel definition films 51 are formed in a lattice shape in a planar view. Meanwhile, the plan shapes or the sizes of the openings 51A may be the same as each other if display colors thereof are the same as each other, and may be different from each other in a case where the display colors thereof are different from each other. In addition, the pitches between the opening 51A may be equal in the openings having the same display colors, and may be different in the openings having different display colors from each other.

While not described in detail, also in others, a light emission function layer, a cathode of the OLED 130, and a sealing body are stacked on an upper layer of the anode 130a, and a sealing substrate (not illustrated) is bonded to a surface of the substrate 10 on which the aforementioned elements are formed, by, for example, an adhesive. The sealing substrate is a plate shape member (for example, glass substrate) with optical transparency which protects each unit on the substrate 10. It is also possible to form a color filter on a surface of the sealing substrate or a surface of a sealing body for each pixel circuit 110.

In addition, while not illustrated, a common electrode 118 which is used as another power supply line layer is formed in the pixel circuit 110. The common electrode 118 is electrically coupled to a mounting terminal to which a power supply potential Vct on a low side is supplied, through a wire (not illustrated) in a multilayer wiring layer. The power supplying line 116 and the common electrode 118 to which the power supply potential Vct on a low side is supplied are formed of a conductive material which contains, for example, silver or aluminum with a thickness of, for example, approximately 100 nm. The common electrode 118 is electrically coupled to the anode 130a.

As described above, data compression rate of the potential Vg which is supplied to the gate g of the drive transistor 121 can be increased. In addition, the transfer capacitor 133 is also formed in a layer higher than a layer in which source electrodes of the second transistor 122 and the third transistor 123 are formed, thereby being formed in a display region of the pixel circuit 110, and it is preferable that the transfer capacitor (first capacitor) 133 is increased so as to increase a chip rate. However, according to the present embodiment, the transfer capacitor 133 is formed of the first electrode 133-1 and the second electrode 133-2 which are formed in layers different from each other, and the insulating layer LD between the electrodes, and employs a metal-insulator-metal (MIM) structure. Accordingly, it is possible to prevent a chip size and the transfer capacitor 13 from increasing.

In addition, the shield capacitor (second capacitor) 134 is formed by disposing a predetermined gap between the first data transfer line 14-1 and the power supplying line 16 which is used as a shield line, through the insulating layer LF. Hence, the shield capacitor 134 is formed of two parallel wires, and can secure predetermined capacitance by having a predetermined length in the Y direction. In addition, the shield capacitor 134 is also formed in a display region of the pixel circuit 110, and thus, it is possible to prevent a chip size of the shield capacitor 134 from increasing.

In the present embodiment, the transfer capacitor 133 is formed in each pixel circuit 110, but the transfer capacitor 133 may be formed in each second data transfer lines 14-2. Hence, it is possible to further prevent a chip size from increasing.

As can be understood from FIG. 15 to FIG. 17, in the present embodiment, the first data transfer line 14-1 to which a signal with large amplitude is supplied is formed in a layer higher than a layer having the second data transfer line 14-2 to which a compressed signal is supplied. That is, it is possible to reduce effects of a signal with large amplitude which is supplied to the first data transfer line 14-1, on the gate of the drive transistor 121, to prevent a potential of the gate of the drive transistor 121 from changing, and to increase display quality.

In addition, as can be understood from FIG. 15 and FIG. 17, in the present embodiment, the second data transfer line 14-2 is formed on a layer higher than a layer in which source electrodes of the drive transistor 121, the first transistor 126, the second transistor 122, and the third transistor 123. Hence, it is possible to prevent a chip size from increasing.

Furthermore, as can be understood from FIG. 15 and FIG. 17, the power supplying line 116 which is used as a power supply line coupled to a second current terminal of the drive transistor 121 is formed in a layer lower than a layer having the second data transfer line 14-2, and thus, the power supplying line 116 functions as a shield. In addition, it is possible to more effectively prevent a potential of the gate of the drive transistor 121 from changing, and to increase display quality.

In addition, as can be understood from FIG. 15, the drive transistor 121 is covered with the power supplying line 116 which is used as a power supply line, and thus, the power supplying line 116 functions as a shield. In addition, it is possible to more effectively prevent the potential of the gate of the drive transistor 121 from changing, and to increase display quality.

As can be understood from FIG. 15 to FIG. 17, the first electrode 133-1 and the second electrode 133-2 of the transfer capacitor 133 are formed in different layers from the layer in which the first data transfer line 14-1 is formed. Hence, even in a case where the insulating layer is thinned to secure a capacitor with a small size, it is possible to form the transfer capacitor 133 having a uniform space between layers without short-circuit.

As illustrated in the part of the metal layer A of FIG. 15, an ellipse A of a dashed line denotes a coupling location of the first transistor 126 and the first data transfer line 14-1, and an ellipse B of a dashed line denotes a coupling location of a first current terminal of the drive transistor 121 and the third transistor 123. In addition, an ellipse C of a dashed line denotes a coupling location of the fourth transistor 124 and the OLED 130 which is used as a light emitting element. By illustrating so, in a planar view of the pixel circuit, the ellipse A of a dashed line which denotes a coupling location of the first transistor 126 and the first data transfer line 14-1 is set to be close to the ellipse C of a dashed line which denotes the coupling location of the fourth transistor 124 and the OLED 130 which is used as a light emitting element rather than the ellipse B of a dashed line which denotes the coupling location of the first current terminal of the drive transistor 121 and the third transistor 123.

A signal with large amplitude is supplied to the first data transfer line 14-1, and noise can be generated at the coupling location (ellipse A) of the first transistor 126 and the first data transfer line 14-1. However, the coupling location (ellipse A) of the first transistor 126 and the first data transfer line 14-1 is set to a location distant from the coupling location (ellipse B) of the first current terminal of the drive transistor 121 and the third transistor 123 rather than the coupling location (ellipse C) of the fourth transistor 124 and the OLED 130 which is used as a light emitting element, in a planar view of a pixel circuit. Hence, even though noise is generated in the coupling location (ellipse A) of the first transistor 126 and the first data transfer line 14-1, it is possible to prevent the noise from affecting the drive transistor 121, and to increase display quality.

In addition, the coupling location (ellipse A) of the first transistor 126 and the first data transfer line 14-1, the coupling location (ellipse B) of a first current terminal of the drive transistor 121 and the third transistor 123, and the coupling location (ellipse C) of the fourth transistor 124 and the OLED 130 as a light emitting element are respectively disposed between the power supplying lines 116 which are used as power supply lines in the pixel circuit 110 and the power supplying lines 116 which are used as power supply lines in the pixel circuits 110 of blocks adjacent to each other in the Y direction. Hence, the power supplying line 116 becomes a shield, and effects of noise can be reduced.

In addition, as illustrated in FIG. 15, the coupling location (ellipse A) of the first transistor 126 and the first data transfer line 14-1 is disposed between the control line 145 coupled to the gate layer GTorst of the fifth transistor 125 coupled to the power supplying line 16 which is used as a reset potential supplying line, and the control line 146 coupled to the gate layer GTfix of the first transistor 126. Hence, even though a signal with large amplitude is supplied to the first data transfer line 14-1 and noise is generated, the control line 145 and the control line 146 function as shields, and it is possible to reduce effects of the noise on the drive transistor 121.

In addition, as illustrated in FIG. 15, the coupling location (ellipse C) of the fourth transistor 124 and the OLED 130 which is used as a light emitting element is disposed between the control line 145 coupled to the gate layer GTorst of the fifth transistor 125 coupled to the power supplying line 16 which is used as the reset potential supplying line, and the control line 144 coupled to the gate layer GTe1 of the fourth transistor 124. Hence, even though a signal with large amplitude is supplied to the first data transfer line 14-1 and noise is generated, the control line 145 and the control line 144 function as shields, and it is possible to reduce effects of the noise on the drive transistor 121.

Second Embodiment

Next, a second embodiment of the invention will be described with reference to FIG. 18 to FIG. 20 of the accompanying drawings. In the second embodiment, the same symbols or reference numerals will be attached to the same members as in the first embodiment.

A circuit according to the present embodiment is the same as the circuit according to the first embodiment illustrated in FIG. 4. In the present embodiment, dispositions of each transistor in a planar view are different from those according to the first embodiment, as illustrated in FIG. 18 to FIG. 20. However, a positional relationship between the respective wires on layers are the same as in the first embodiment.

Figure 18:
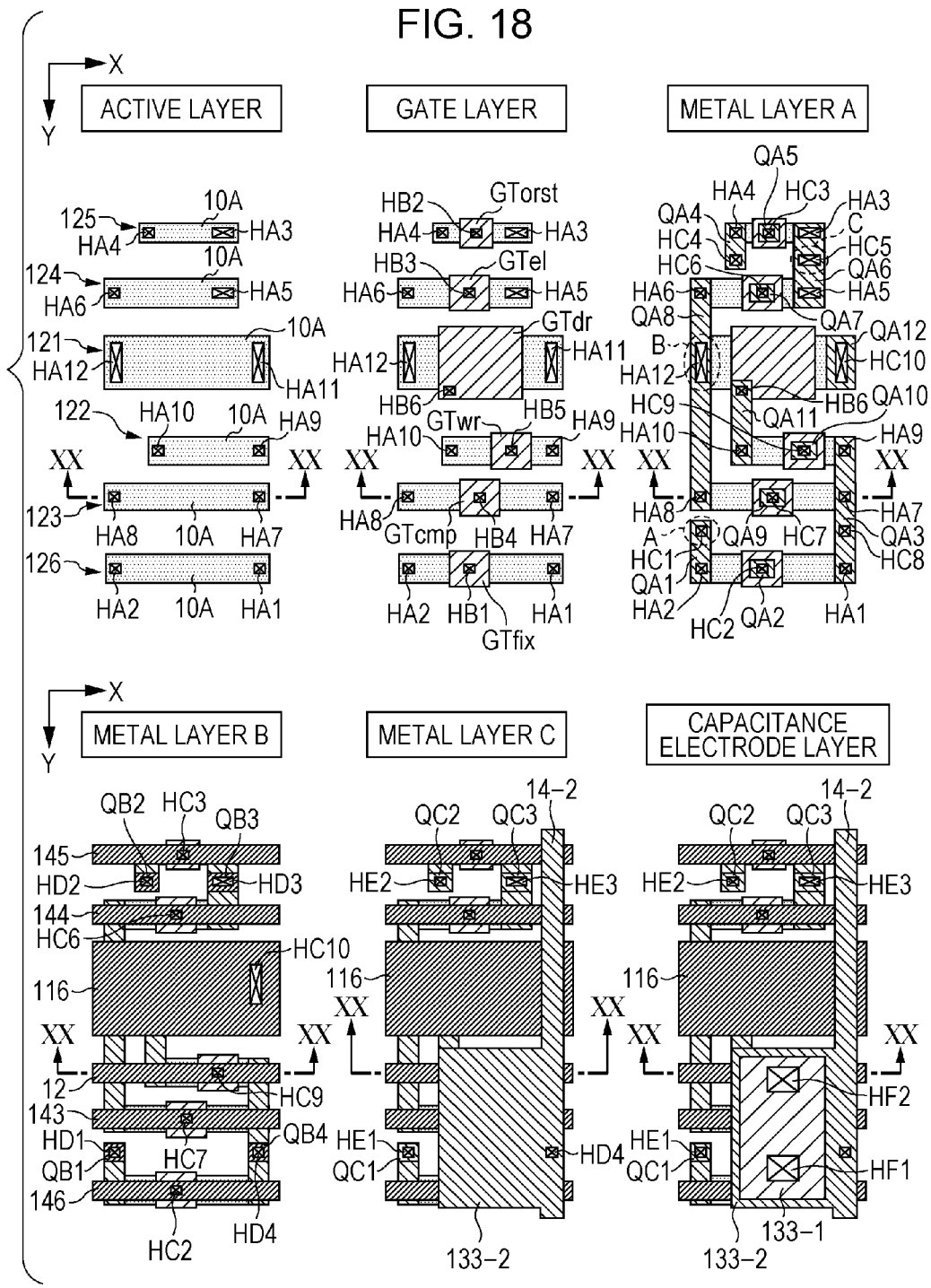
FIG. 18 is an explanatory view of each unit which is formed on the substrate of an electro-optical device according to a second embodiment of the invention.
Figure 20:
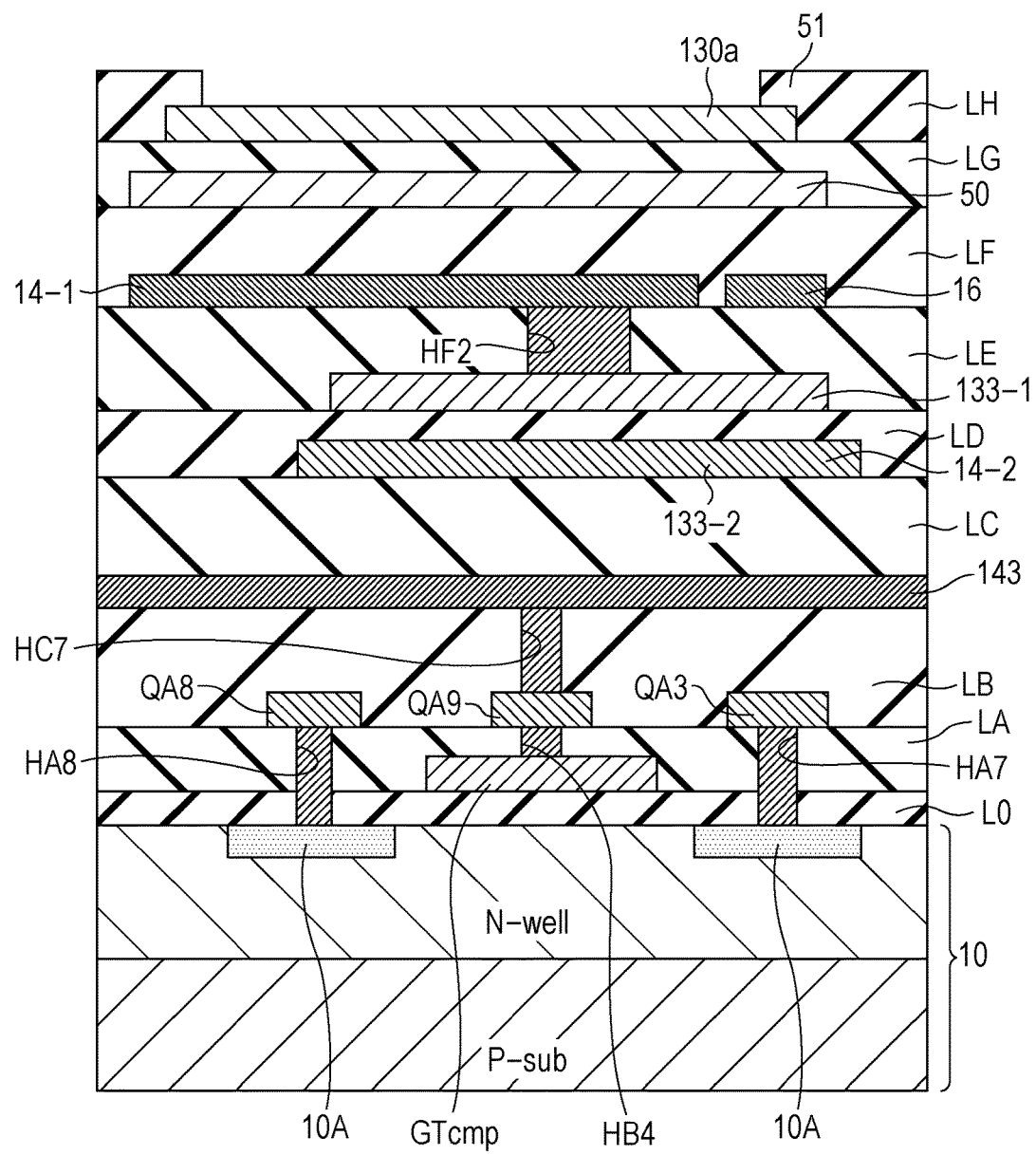
FIG. 20 is a sectional view of the light emitting device.

As can be understood from FIG. 18 and FIG. 20, also in the present embodiment, the transfer capacitor (first capacitor) 133 is formed of the first electrode 133-1 which is a metal, the insulating layer LD, and the second electrode 133-2 which is a metal, and is configured by a metal-insulator-metal (MIM) structure. Thus, the transfer capacitor 133 can have large capacitance, and a data compression rate of the potential Vg which is supplied to the gate g of the drive transistor 121 can be increased. In addition, the transfer capacitor 133 is also formed in a layer higher than a layer in which source electrodes of the second transistor 122 and the third transistor 123 are formed, thereby being formed in a display region of the pixel circuit 110, and it is possible to prevent a chip size from increasing.

Figure 19:
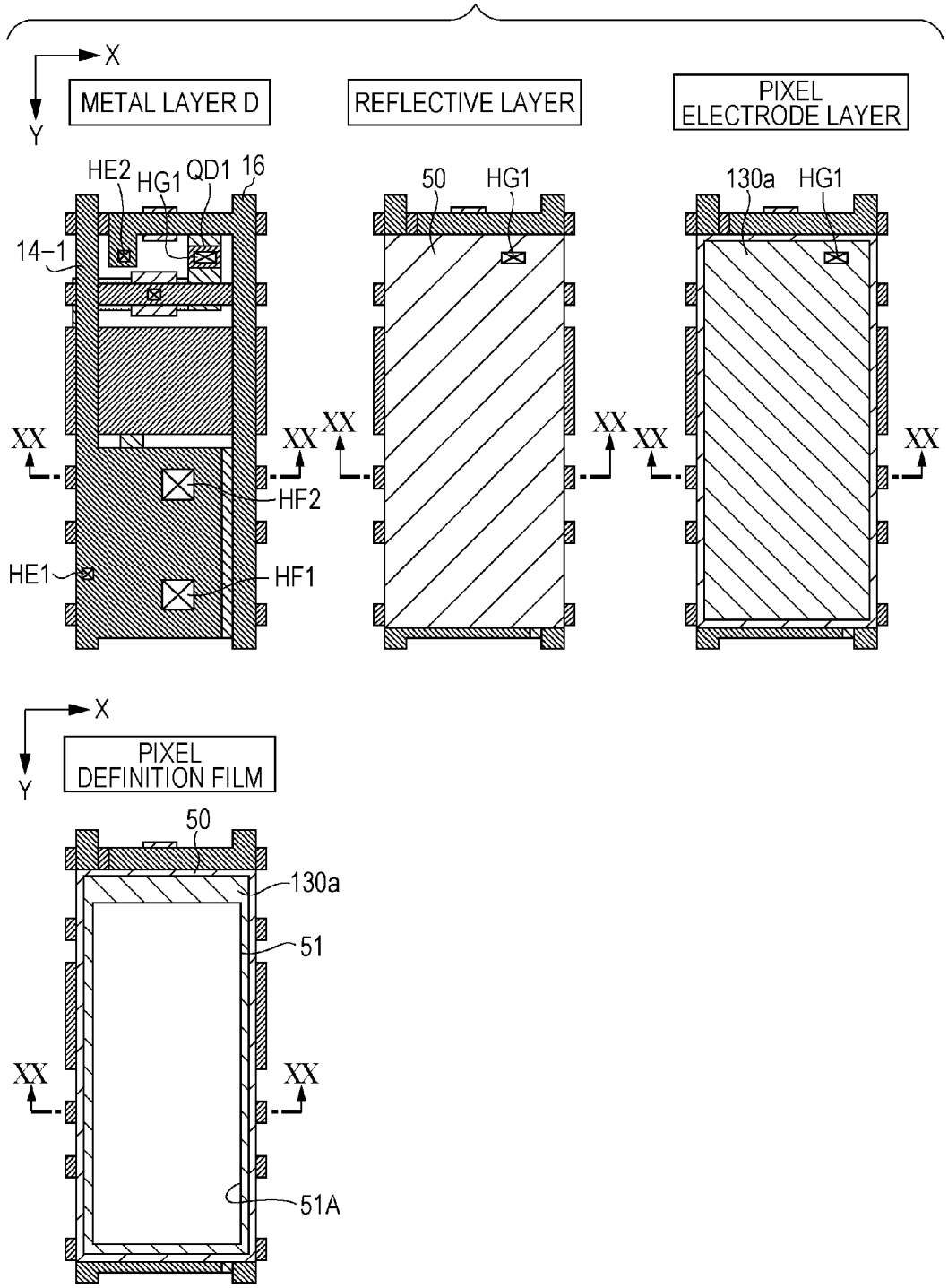
FIG. 19 is an explanatory view of each unit which is formed on the substrate.

As can be understood from FIG. 19 and FIG. 20, the shield capacitor (second capacitor) 134 is formed by disposing a predetermined gap between the first data transfer line 14-1 and the power supplying line 16 which is used as a shield line through the insulating layer LF. Hence, the shield capacitor 134 is formed of two parallel wires, and can secure predetermined capacitance by having a predetermined length in the Y direction. In addition, the shield capacitor 134 is also formed in a display region of the pixel circuit 110, and thus, it is possible to prevent a chip size of the shield capacitor 134 from increasing.

Also in the present embodiment, the transfer capacitor 133 is formed in each pixel circuit 110, but the transfer capacitor 133 may be formed in each second data transfer line 14-2. Accordingly, it is possible to further prevent a chip size from increasing.

As can be understood from FIG. 18 to FIG. 20, in the present embodiment, the first data transfer line 14-1 to which a signal with large amplitude is supplied is formed on a layer higher than a layer having the second data transfer line 14-2 to which a compressed signal is supplied. That is, it is possible to reduce effects of a signal with large amplitude which is supplied to the first data transfer line 14-1, on the gate of the drive transistor 121, to prevent a potential of the gate of the drive transistor 121 from changing, and to increase display quality.

In addition, as can be understood from FIG. 18 to FIG. 20, in the present embodiment, the second data transfer line 14-2 is formed in a layer higher than a layer in which source electrodes of the drive transistor 121, the first transistor 126, the second transistor 122, and the third transistor 123. Hence, it is possible to prevent a chip size from increasing.

The relay electrode QA3 illustrated in FIG. 18 is a source electrode, and is formed by directly coming into contact with the active region 10A which forms a drain region or a source region of the first transistor 126, the active region 10A which forms a drain region or a source region of the third transistor 123, and the active region 10A which forms a drain region or a source region of the second transistor 122.

In addition, the relay electrode QA8 illustrated in FIG. 18 is also a source electrode, and is formed by directly coming into contact with the active region 10A which forms a drain region or a source region of the fourth transistor 124, the active region 10A which forms a drain region or a source region of the third transistor 123, and the active region 10A which forms a drain region or a source region of the drive transistor 121.

Furthermore, the relay electrode QA11 illustrated in FIG. 18 is also a source electrode, and is formed by directly coming into contact with the active region 10A which forms a drain region or a source region of the second transistor 122.

Furthermore, as can be understood from FIG. 18 and FIG. 20, the power supplying line 116 which is used as a power supply line coupled to the second current terminal of the drive transistor 121 is formed in a layer higher than a layer having the second data transfer line 14-2, and thus, the power supplying line 116 functions as a shield. In addition, it is possible to more effectively prevent a potential of the gate of the drive transistor 121 from changing, and to increase display quality.

In addition, as can be understood from FIG. 18, the drive transistor 121 is covered with the power supplying line 116 which is used as a power supply line, and thus, the power supplying line 116 functions as a shield. In addition, it is possible to more effectively prevent the potential of the gate of the drive transistor 121 from changing, and to increase display quality.

As can be understood from FIG. 18 to FIG. 20, the first electrode 133-1 and the second electrode 133-2 of the transfer capacitor 133 are formed in different layers from the layer in which the first data transfer line 14-1 is formed. Hence, even in a case where the insulating layer is thinned to secure a capacitor with a small size, it is possible to form the transfer capacitor 133 having a uniform space between layers without short-circuit.

As illustrated in the part of the metal layer A of FIG. 18, an ellipse A of a dashed line denotes a coupling location of the first transistor 126 and the first data transfer line 14-1, and an ellipse B of a dashed line denotes a coupling location of the first current terminal of the drive transistor 121 and the third transistor 123. In addition, an ellipse C of a dashed line denotes a coupling location of the fourth transistor 124 and the OLED 130 which is used as a light emitting element. By illustrating so, in a case of being viewed from the inside of one pixel circuit 110, the ellipse A of a dashed line which denotes the coupling location of the first transistor 126 and the first data transfer line 14-1 is set to be close to the ellipse B of a dashed line which denotes the coupling location of the first current terminal of the drive transistor 121 and the third transistor 123 rather than the ellipse C of a dashed line which denotes the coupling location of the fourth transistor 124 and the OLED 130 which is used as a light emitting element.

Figure 21:
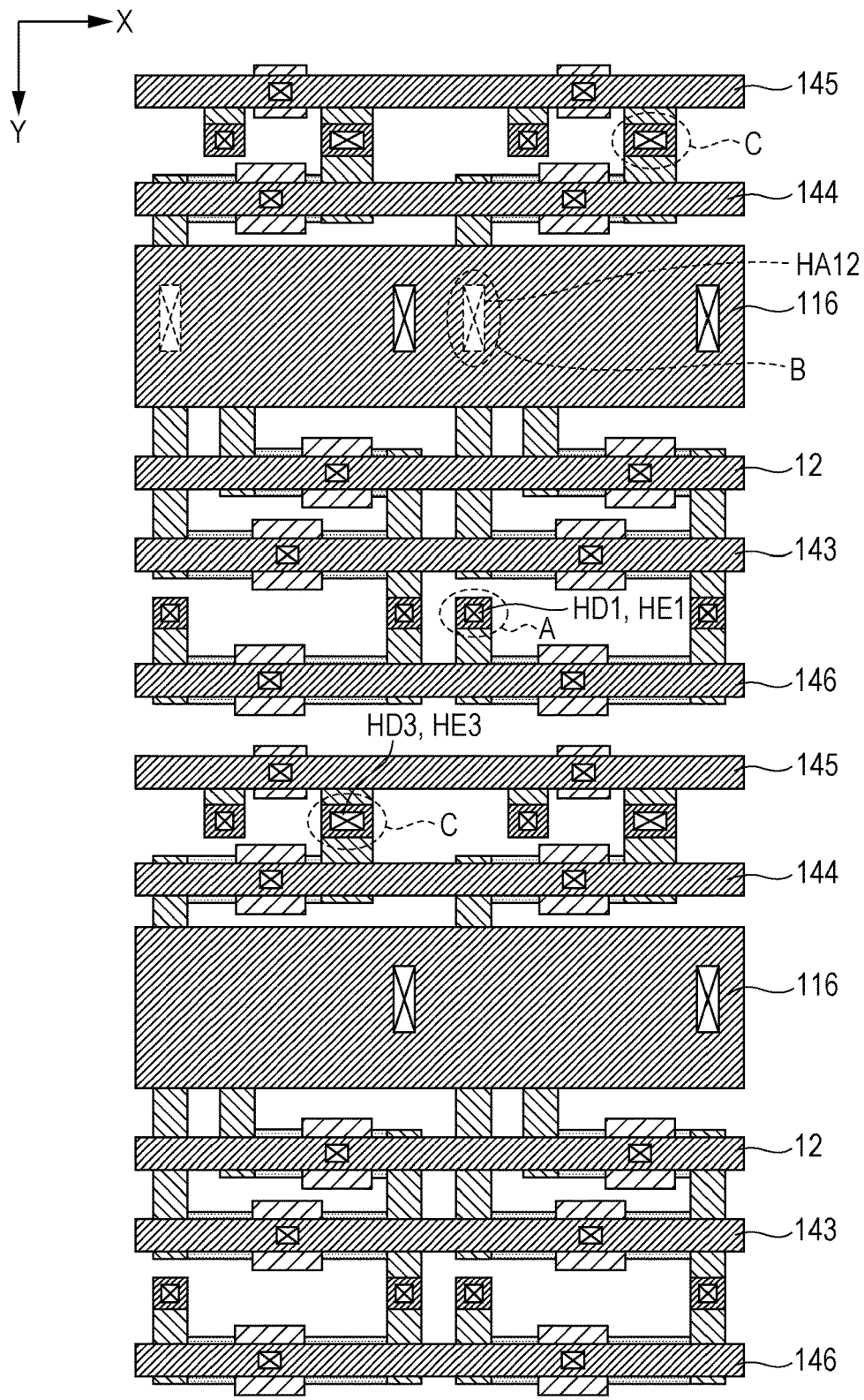
FIG. 21 is an explanatory view of each unit which is formed on the substrate.
Figure 22:
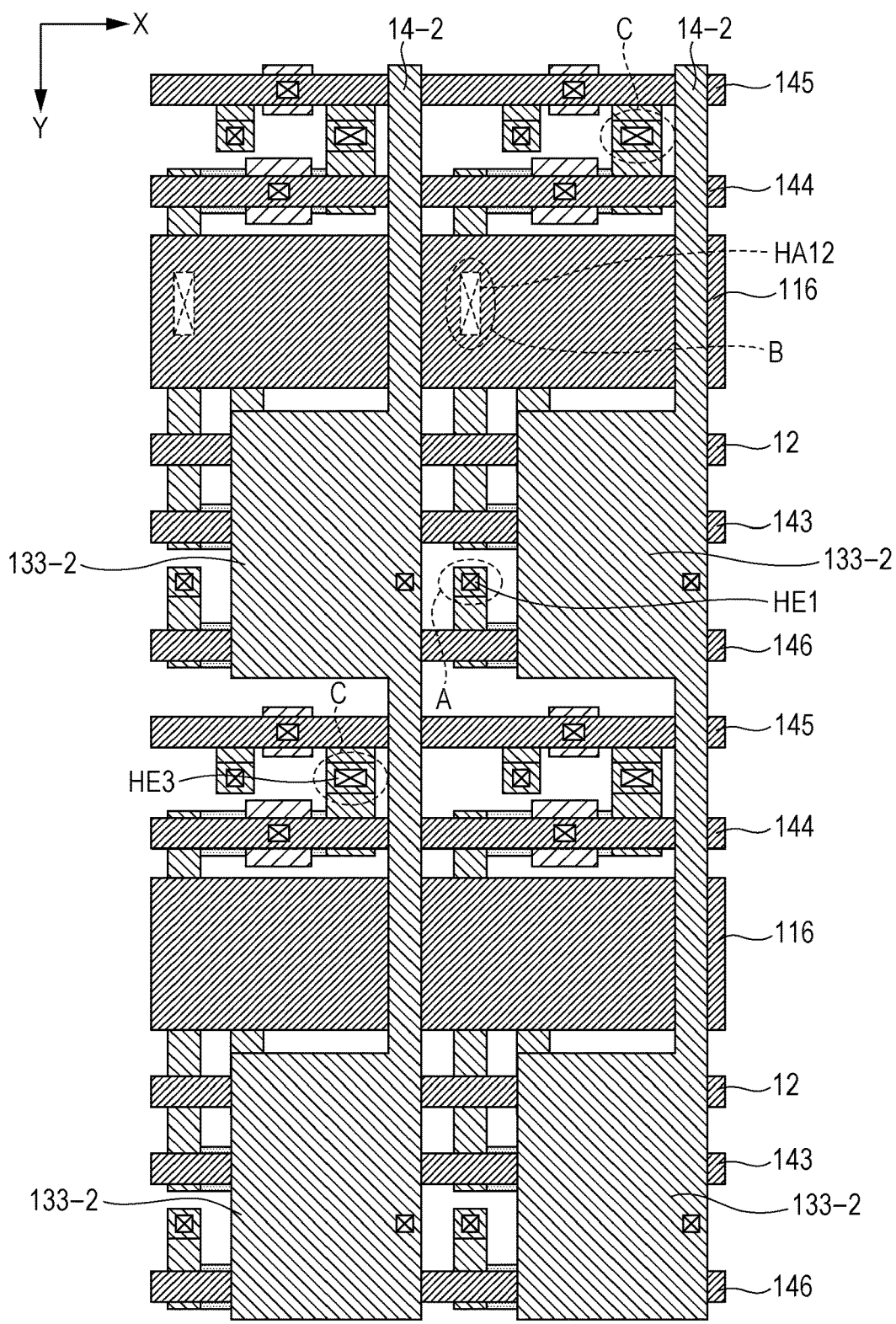
FIG. 22 is an explanatory view of each unit which is formed on the substrate.

However, as illustrated in FIG. 21 and FIG. 22, in a case of being viewed from a location between the different pixel circuits 110 adjacent to each other in the Y direction and the X direction, the ellipse A of a dashed line which denotes the coupling location of the first transistor 126 and the first data transfer line 14-1 is close to the ellipse C of a dashed line which denotes the coupling location of the fourth transistor 124 and the OLED 130 which is used as a light emitting element rather than the ellipse B of a dashed line which denotes the coupling location of the first current terminal of the drive transistor 121 and the third transistor 123.

Hence, a signal with large amplitude is supplied to the first data transfer line 14-1. Accordingly, even though noise is generated in the coupling location (ellipse A) of the first transistor 126 and the first data transfer line 14-1, it is possible to prevent the noise from affecting the drive transistor 121, and to increase display quality.

In addition, as illustrated in FIG. 21 and FIG. 22, in a case of being viewed from a location between the different pixel circuits 110 adjacent to each other in the Y direction and the X direction, the ellipse A of a dashed line which denotes a coupling location of the first transistor 126 and the first data transfer line 14-1 is disposed between the control line 145 coupled to the gate of the fifth transistor 125 and the scan line 12 coupled to the gate of the drive transistor 121. Hence, the gate of the drive transistor 121 is disposed between the control line 145 and the scan line 12 thereby being shielded by the control line 145 and the scan line 12. As a result, a signal with high amplitude is supplied to the first data transfer line 14-1. Accordingly, even though noise is generated in the coupling location (ellipse A) of the first transistor 126 and the first data transfer line 14-1, it is possible to reduce effects of the noise on the drive transistor 121, and to increase display quality.

In addition, as illustrated in FIG. 18, the coupling location (ellipse A) of the first transistor 126 and the first data transfer line 14-1, the coupling location (ellipse B) of the first current terminal of the drive transistor 121 and the third transistor 123, and the coupling location (ellipse C) of the fourth transistor 124 and the OLED 130 as a light emitting element are respectively disposed between the power supplying lines 116 which are used as power supply lines in the pixel circuit 110 and the power supplying lines 116 which are used as power supply lines in the pixel circuits 110 of blocks adjacent to each other in the Y direction. Hence, the power supplying line 116 becomes a shield, and effects of noise can be reduced.

In addition, as illustrated in FIG. 18, the coupling location (ellipse A) of the first transistor 126 and the first data transfer line 14-1 is disposed between the control line 143 coupled to the gate layer GTcmp of the third transistor 123 and the control line 146 coupled to the gate layer GTfix of the first transistor 126. Hence, even though a signal with large amplitude is supplied to the first data transfer line 14-1 and noise is generated, the control line 143 and the control line 146 function as shields, and it is possible to reduce effects of the noise on the drive transistor 121.

In addition, as illustrated in FIG. 18, the coupling location (ellipse C) of the fourth transistor 124 and the OLED 130 which is used as a light emitting element is disposed between the control line 145 coupled to the gate layer GTorst of the fifth transistor 125 coupled to the power supplying line 16 which is used as the reset potential supplying line, and the control line 144 coupled to the gate layer GTe1 of the fourth transistor 124. Hence, even though a signal with large amplitude is supplied to the first data transfer line 14-1 and noise is generated, the control line 145 and the control line 144 function as shields, and it is possible to reduce effects of the noise on the drive transistor 121.

Third Embodiment

Next, a third embodiment of the invention will be described with reference to FIG. 23 to FIG. 26 of the accompanying drawings. Six transistors are used in the respective embodiments described above, but five transistors are used in the present embodiment.

Circuit Diagram

Figure 23:
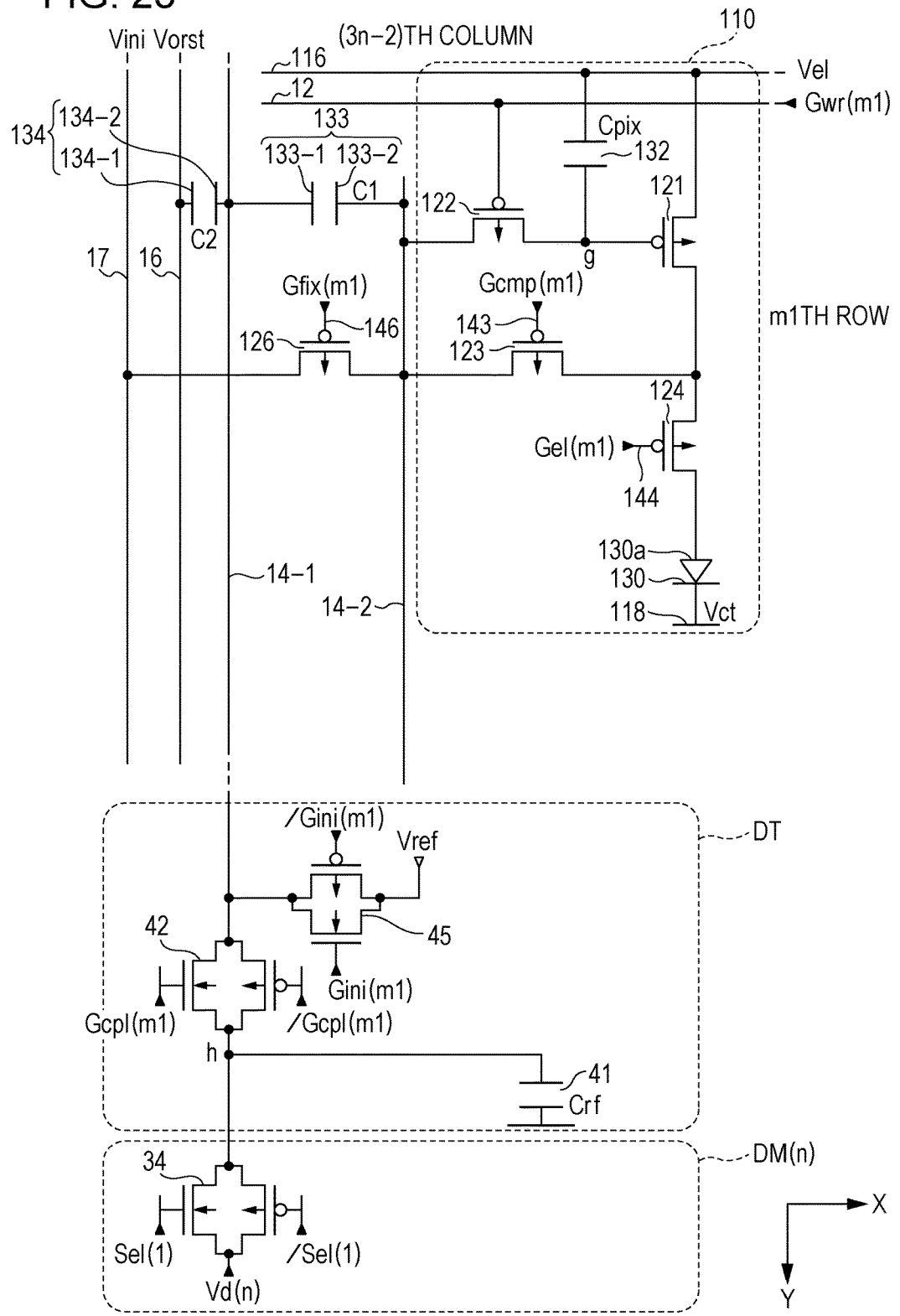
FIG. 23 is a circuit diagram illustrating a configuration of a pixel circuit of an electro-optical device according to a third embodiment of the invention.

The present embodiment is different from the respective embodiments described above in that a configuration in which the fifth transistor 125 is not included is provided as illustrated in FIG. 23. In addition, a power supplying line 17 to which the initial potential Vini is supplied is coupled to a drain or a source of the first transistor 126. In addition, a voltage Vref which initializes the first data transfer line 14-1 is supplied to the first data transfer line 14-1 through the transmission gate 45. The voltage Vref may be equal to the initial potential Vini.

An operation according to the present embodiment is the same as that of each embodiment described above, and the second data transfer line 14-2 on the transfer capacitor 133 side of the second transistor 122, which becomes a floating node during the light emission period, is set to the initial potential Vini of a fixed potential during a period in which processing of the initialization period is performed in other blocks. Thus, it is possible to prevent a potential of the second data transfer line 14-2 from approaching the power supply voltage. As a result, the second transistor 122 is not turned on, a voltage is retained in the pixel capacitor 132, and display failure does not occur.

Structure

Figure 24:
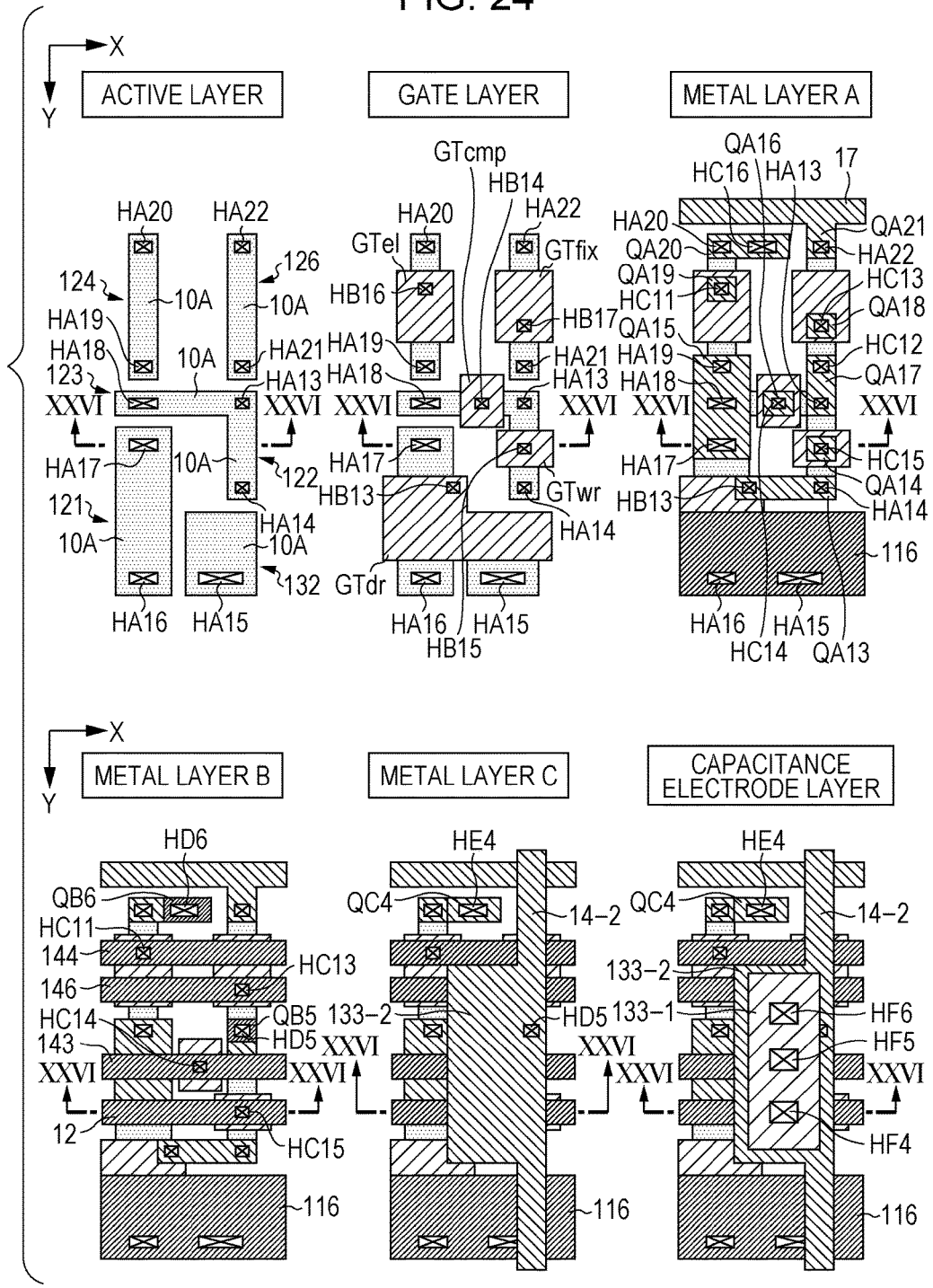
FIG. 24 is an explanatory view of each unit which is formed on the substrate.
Figure 25:
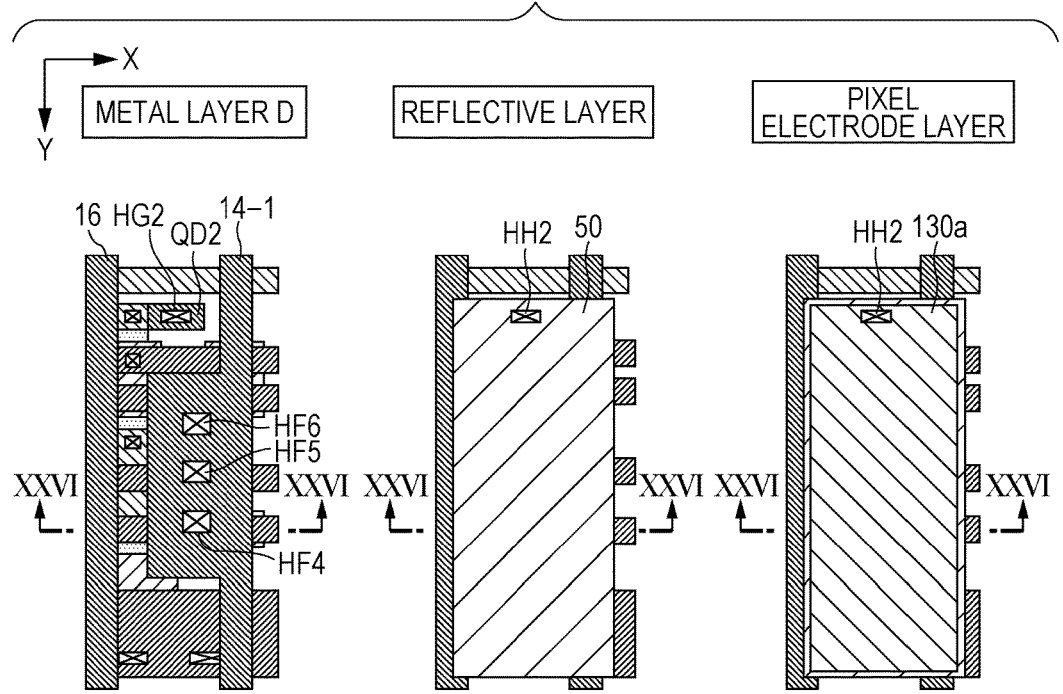
FIG. 25 is an explanatory view of each unit which is formed on the substrate.
Figure 25:
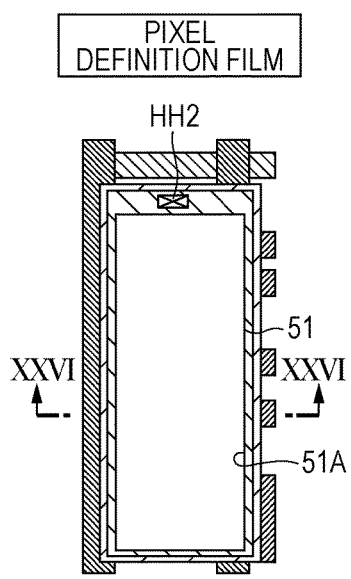
Figure 26:
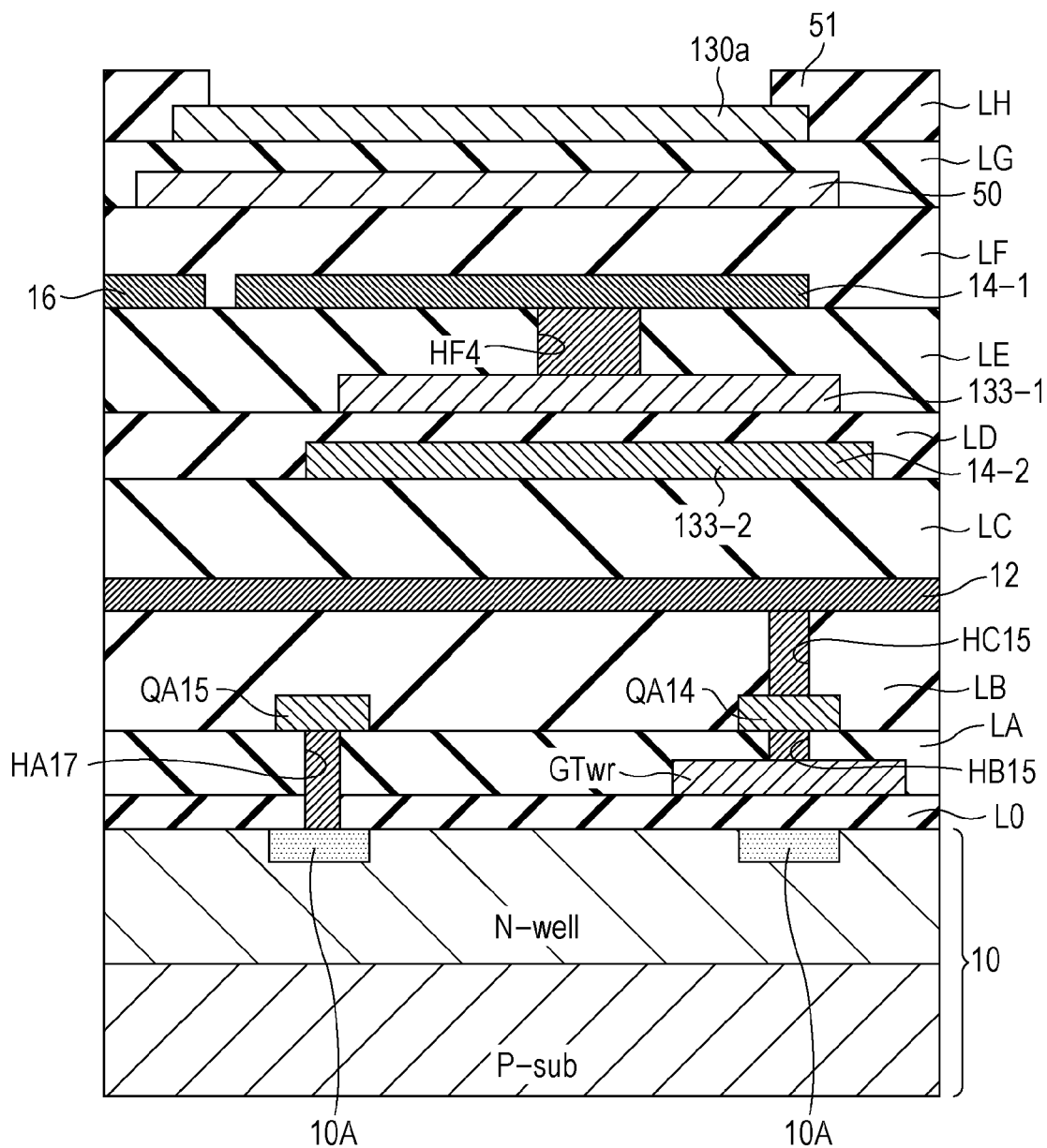
FIG. 26 is a sectional view of the light emitting device.

Next, a specific structure of the electro-optical device 1 according to the third embodiment will be hereinafter described. In each figure which is used in the following description, dimensions and scales of each element are illustrated differently from actual dimensions and scales of the electro-optical device 1, for the sake of convenience of description. FIG. 24 and FIG. 25 are plan views illustrating states of surfaces of the substrate 10 in each step in which each element of the electro-optical device 1 is formed, in one pixel circuit 110. FIG. 26 is a sectional view of the electro-optical device 1. FIG. 26 is a sectional view corresponding to a cross section including lines XXVI-XXVI of FIG. 24 and FIG. 25. FIG. 24 and FIG. 25 are plan views, but patterning of the same shape as in FIG. 26 is conveniently added to the respective elements which are common to those of FIG. 26, from a viewpoint of facilitating visual understanding of each element.

As can be understood from FIG. 26 and the part of active layers of FIG. 24, the active regions 10A (source/drain regions) of the respective transistors 121, 122, 123, 124, and 126 of the pixel circuit 110 are formed on a surface of the substrate 10 which is formed of a semiconductor material such as silicon. Ions are injected into the active regions 10A. Active layers of the respective transistors 121, 122, 123, 124, and 126 of the pixel circuit 110 are located between source regions and drain regions, and ions of different types from those which are injected into the active region 10A are injected into the active layers, but the active regions are described as one piece with the active region 10A for the sake of convenience. In addition, in the present embodiment, the active region 10A is formed even in a region which configures the pixel capacitor 132, impurity is injected into the active region 10A, and the active region 10A is coupled to the power supply. In addition, a so-called MOS capacitor is configured in which the active region 10A is used as one electrode thereof and a capacitance electrode that is formed through an insulating layer is used as the other electrode thereof. In addition, the active region 10A in a region which configures the pixel capacitor 132 also functions as a power supply potential unit. As can be understood from the part of the active layer of FIG. 24, the active region 10A of the third transistor 123 is coupled to the active region 10A of the second transistor 122, in the part where the conduction hole HA13 is provided. Hence, a current terminal of the third transistor 123 also functions as a current terminal of the second transistor 122. As can be understood from the part of the gate layer of FIG. 24 and FIG. 26, a surface of the substrate 10 on which the active region 10A is formed is covered with the insulating film L0 (gate insulating film), and gate layers GT (GTdr, GTwr, GTcmp, GTe1, and GTfix) of the respective transistors 121, 122, 123, 124, and 126 are formed on a surface of the insulating film L0. The gate layers GT of the respective transistors 121, 122, 123, 124, and 126 face the active layer in a state where the insulating film L0 is interposed therebetween.

In addition, as illustrated in the part of the gate layer of FIG. 24, the gate layer GTdr of the drive transistor 121 is formed so as to extend to the active region 10A formed in a region which configures a capacitance element, and configures the pixel capacitor 132.

As can be understood from FIG. 26, a multilayer wiring layer in which a plurality of insulating layers L (LA to LH) and a plurality of conductive layers (wiring layers) are alternately stacked is formed on the surface of the insulating film L0 in which the gate layers GT of the respective transistors 121, 122, 123, 124, and 126 and the pixel capacitor 132 are formed. Each of the insulating films L is formed of an insulating inorganic material such as a silicon compound (typically silicon nitride or silicon oxide). In the following description, a relationship in which a plurality of elements are collectively formed in the same step by selective removal of a conductive layer (single layer or multiple layers) is referred to as "it is formed from the same layer".

The insulating layer LA is formed on a surface of the insulating film L0 in which the gate layers GT of the respective transistors 121, 122, 123, 124, and 126 are formed. As can be understood from the part of a metal layer A of FIG. 24 and FIG. 26, the power supplying line 116 and a plurality of relay electrodes QA (QA13, QA14, QA15, QA16, QA17, QA18, QA19, QA20, and QA21) are formed on a surface of the insulating layer LA from the same layer.

In addition, as can be understood from FIG. 24, in the present embodiment, the second data transfer line 14-2 is formed in a layer higher than a layer in which source electrodes of the drive transistor 121, the first transistor 126, the second transistor 122, and the third transistor 123 are formed. Hence, it is possible to prevent a chip size from increasing.

The relay electrode QA13 illustrated in FIG. 24 is a source electrode, and is formed by directly coming into contact with the active region 10A which forms a drain region or a source region of the second transistor 122.

In addition, the relay electrode QA15 illustrated in FIG. 24 is also a source electrode, and is formed by directly coming into contact with the active region 10A which forms a drain region or a source region of the third transistor 123, the active region 10A which forms a drain region or a source region of the fourth transistor 124, and the active region 10A which forms a drain region or a source region of the drive transistor 121.

Furthermore, the relay electrode QA17 illustrated in FIG. 24 is also a source electrode, and is formed by directly coming into contact with the active region 10A which forms a drain region or a source region of the third transistor 123, the active region 10A which forms a drain region or a source region of the second transistor 122, and the active region 10A which forms a drain region or a source region of the first transistor 126.

As can be understood from the part of the metal layer A of FIG. 24 and FIG. 26, the power supplying line 116 is electrically coupled to the active region 10A which forms a drain region or a source region of the drive transistor 121 through the conduction hole HA16 which penetrates the insulating layer LA and the insulating film L0. In addition, the power supplying line 116 is electrically coupled to the active region 10A which forms the pixel capacitor 132 through the conduction hole HA15 that penetrates the insulating layer LA and the insulating film L0. The power supplying line 116 extends in a direction (X direction) of a channel width of the drive transistor 121 across the plurality of pixel circuits 110. The power supplying line 116 is electrically coupled to a mounting terminal to which the power supply potential Vel on a high side is supplied through a wire (not illustrated) in the multilayer wiring layer. While not illustrated, another power supply line layer is also formed in a peripheral region of the pixel circuit 110. The power supply line layer is electrically coupled to a mounting terminal to which the power supply potential Vct on a low side is supplied through a wire (not illustrated) in the multilayer wiring layer. The power supplying line 116 and the power supply line layer to which the power supply potential Vct on a low side are formed of a conductive material, which contains, for example, silver or aluminum, with a thickness of, for example, approximately 100 nm.

The gate layer GTdr of the drive transistor 121 is electrically coupled to the active region 10A which forms a source region or a drain region of the second transistor 122 through the relay electrode QA13, the conduction hole HB13 which penetrates the insulating layer LA, and the conduction hole HA14 which penetrates the insulating layer LA and the insulating film L0.

The relay electrode QA15 and the relay electrode QA17 are formed in the same layer as the power supplying line 116, in each of a conductive section of the drive transistor 121, the third transistor 123, and the fourth transistor 124 and a conductive section of the third transistor 123 and a first transistor 126. In addition, the relay electrode QA14, the relay electrode QA16, the relay electrode QA19, and the relay electrode QA18 are formed in the same layer as the power supplying line 116, in a conductive section of the gate layer GTwr of the second transistor 122, the gate layer GTcmp of the third transistor 123, the gate layer GTe1 of the fourth transistor 124, and the gate layer GTfix of the first transistor 126. Furthermore, the relay electrode QA20 and the relay electrode QA21 are formed in the same layer as the power supplying line 116, in the conductive section of a source region or a drain region of the fourth transistor 124 and a conductive section of a source region or a drain region of the first transistor 126.

As can be understood from the part of the metal layer A of FIG. 24 and FIG. 26, the relay electrode QA15 is electrically coupled to the active region 10A which forms a drain region or a source region of the drive transistor 121 through the conduction hole HA17 which penetrates the insulating film L0 and the insulating layer LA. In addition, the relay electrode QA15 is electrically coupled to the active region 10A which forms a drain region or a source region of the third transistor 123 through the conduction hole HA18 which penetrates the insulating film L0 and the insulating layer LA. Furthermore, the relay electrode QA15 is electrically coupled to the active region 10A which forms a drain region or a source region of the fourth transistor 124 through the conduction hole HA19 which penetrates the insulating film L0 and the insulating layer LA.

The relay electrode QA17 is electrically coupled to the active region 10A which forms drain regions or source regions of the second transistor 122 and the third transistor 123 through the conduction hole HA13 which penetrates the insulating film L0 and the insulating layer LA. In addition, the relay electrode QA17 is electrically coupled to the active region 10A which forms a drain region or a source region of the first transistor 126 through the conduction hole HA21 which penetrates the insulating film L0 and the insulating layer LA.

The relay electrode QA20 is electrically coupled to the active region 10A which forms a drain region or a source region of the fourth transistor 124 through the conduction hole HA20 which penetrates the insulating film L0 and the insulating layer LA. The relay electrode QA21 is electrically coupled to the active region 10A which forms a drain region or a source region of the first transistor 126 through the conduction hole HA22 which penetrates the insulating film L0 and the insulating layer LA. In addition, the relay electrode QA21 is coupled to the power supplying line 17 to which an initial potential is supplied.

The insulating layer LB is formed on the surface of the insulating layer LA in which the power supplying line 116 and a plurality of relay electrodes QA (QA13, QA14, QA15, QA16, QA17, QA18, QA19, QA20, and QA21) are formed. As can be understood from the part of a metal layer B of FIG. 24 and FIG. 26, the scan line 12, the control line 143 of the third transistor 123, the control line 144 of the fourth transistor 124, the control line 146 of the first transistor 126, and a plurality of relay electrodes QB (QB5 and QB6) are formed on a surface of the insulating layer LB from the same layer.

As can be understood from the part of the metal layer B of FIG. 24 and FIG. 26, the scan line 12 which is used as an example of a first conductive layer is electrically coupled to the relay electrode QA14 through the conduction hole HC15 formed in the insulating layer LB in each pixel circuit 110. Hence, as can be understood from FIG. 24 and FIG. 26, the scan line 12 is electrically coupled to the gate layer GTwr of the second transistor 122 through the conduction hole HC15 which penetrates the insulating layer LB, the relay electrode QA14, and a conduction hole HB15 which penetrates the insulating layer LA. The scan line 12 linearly extends in X direction across the plurality of pixel circuits 110, and is electrically insulated from the first capacitor 133 and the second data transfer line 14-2 by the insulating layer LC.

As can be understood from FIG. 24, the control line 143 is electrically coupled to the relay electrode QA16 through the conduction hole HC14 formed in the insulating layer LB in each pixel circuit 110. Hence, as can be understood from FIG. 24 to FIG. 26, the control line 143 is electrically coupled to the gate layer GTcmp of the third transistor 123 through the conduction hole HC14 which penetrates the insulating layer LB, the relay electrode QA16, and a conduction hole HB14 which penetrates the insulating layer LA. The control line 143 linearly extends in the X direction across the plurality of pixel circuits 110, and is electrically insulated from the first capacitor 133 and the second data transfer line 14-2 by the insulating layer LC.

As can be understood from FIG. 24, the control line 144 is electrically coupled to the relay electrode QA19 through the conduction hole HC11 formed in the insulating layer LB in each pixel circuit 110. Hence, as can be understood from FIG. 24 to FIG. 26, the control line 144 is electrically coupled to the gate layer GTe1 of the fourth transistor 124 through the conduction hole HC11 which penetrates the insulating layer LB, the relay electrode QA19, and a conduction hole HB16 which penetrates the insulating layer LA. The control line 144 linearly extends in the X direction across the plurality of pixel circuits 110, and is electrically insulated from the first capacitor 133 and the second data transfer line 14-2 by the insulating layer LC.

As can be understood from FIG. 24, the control line 146 is electrically coupled to the relay electrode QA18 through the conduction hole HC13 formed in the insulating layer LB in each pixel circuit 110. Hence, as can be understood from FIG. 24 to FIG. 26, the control line 146 is electrically coupled to the gate layer GTfix of the first transistor 126 through the conduction hole HC13 which penetrates the insulating layer LB, the relay electrode QA18, and a conduction hole HB17 which penetrates the insulating layer LA. The control line 146 linearly extends in the X direction across the plurality of pixel circuits 110, and is electrically insulated from the first capacitor 133 and the second data transfer line 14-2 by the insulating layer LC.

The relay electrode QB5 is electrically coupled to the relay electrode QA17 through the conduction hole HC12 formed in the insulating layer LB in each pixel circuit 110. As can be understood from FIG. 24 to FIG. 26, the relay electrode QB5 is electrically coupled to the active region 10A which forms a drain region or a source region of the first transistor 126 through the conduction hole HC12 which penetrates the insulating layer LB, the relay electrode QA17, and a conduction hole HA21 which penetrates the insulating film L0 and the insulating layer LA.

The relay electrode QB6 is electrically coupled to the relay electrode QA20 through the conduction hole HC16 formed in the insulating layer LB in each pixel circuit 110. As can be understood from FIG. 24 to FIG. 26, the relay electrode QB6 is electrically coupled to the active region 10A which forms a drain region or a source region of the fourth transistor 124 through the conduction hole HC16 which penetrates the insulating layer LB, the relay electrode QA20, and a conduction hole HA20 which penetrates the insulating film L0 and the insulating layer LA.

The insulating layer LC is formed on a surface of the insulating layer LB in which the scan line 12, the control line 143 of the third transistor 123, the control line 144 of the fourth transistor 124, the control line 146 of the first transistor 126, a plurality of relay electrodes QB (QB5 and QB6) are formed. As can be understood from FIG. 24 and FIG. 26, the second data transfer line 14-2, the second electrode 133-2 of the transfer capacitor 133 which is formed as one piece with the second data transfer line 14-2, and a relay electrode QC4 are formed on a surface of the insulating layer LC.

The second data transfer line 14-2 which is used as an example of a third conductive layer extends in the Y direction across the plurality of pixel circuits 110. The second data transfer line 14-2 is electrically coupled to the active region 10A which forms a drain region or a source region of the first transistor 126 through a conduction hole HD5 which penetrates the insulating layer LC, the relay electrode QB5, the conduction hole HC12 which penetrates the insulating layer LB, the relay electrode QA17, and the conduction hole HA21 which penetrates the insulating film L0 and the insulating layer LA. In addition, the second data transfer line 14-2 is electrically coupled to the active region 10A which forms a drain region or a source region of the third transistor 123 and the second transistor 122 through the conduction hole HD5 which penetrates the insulating layer LC, the relay electrode QB5, the conduction hole HC12 which penetrates the insulating layer LB, the relay electrode QA17, the conduction hole HA13 which penetrates the insulating film L0 and the insulating layer LA.

The second electrode 133-2 which is used as an example of the fifth conductive layer of the transfer capacitor (first capacitor) 133 is a rectangular electrode which covers the scan lines 12, the control line 143, and the control line 146, and is formed as one piece with the second data transfer line 14-2, in the pixel circuit 110.

The insulating layer LD is formed on a surface of the insulating layer LC in which the second data transfer line 14-2, the second electrode 133-2 of the transfer capacitor 133, and the relay electrode QC4 are formed. As can be understood from the part of the capacitance electrode layer of FIG. 24 and FIG. 26, the first electrode 133-1 of the transfer capacitor 133 is formed on a surface of the insulating layer LD.

The first electrode 133-1 which is used as an example of the fourth conductive layer of the transfer capacitor (first capacitor) 133 is a rectangular capacitance electrode which faces the second electrode 133-2 through the insulating layer LD. The first electrode 133-1 faces the second electrode 133-2 through the insulating layer LD. In this way, the transfer capacitor 133 is formed by a metal-insulator-metal (MIM) structure, and thus, the transfer capacitor 133 can have large capacitance.

The insulating layer LE is formed on a surface of the insulating layer LD in which the first electrode 133-1 of the transfer capacitor 133 is formed. As can be understood from the part of the metal layer D of FIG. 25 and FIG. 26, the first data transfer line 14-1, the power supplying line 16, and the relay electrode QD2 are formed on a surface of the insulating layer LE.

The first data transfer line 14-1 which is used as an example of the second conductive layer extends in the Y direction across the plurality of pixel circuits 110. The first data transfer line 14-1 is electrically coupled to the first electrode 133-1 of the transfer capacitor 133 through conduction holes HF4, HF5, and HF6 which penetrates the insulating layer LE.

The power supplying line 16 which is used as an example of a sixth conductive layer extends in the Y direction across the plurality of pixel circuits 110. The power supplying line 16 is formed in the same layer as the first data transfer line 14-1, and is disposed so as to have a predetermined gap between the power supplying line 16 and the first data transfer line 14-1 through the insulating layer LF. By doing so, the shield capacitor 134 is formed, and the first data transfer line 14-1 is shielded by the power supplying line 16.

The relay electrode QD2 is electrically coupled to the relay electrode QC4 through a conduction hole HE4 which penetrates the insulating layer LE and the insulating layer LD. Hence, the relay electrode QD2 is electrically coupled to the active region 10A which forms the drain region or the source region of the fourth transistor 124 through the conduction hole HE4 which penetrates the insulating layer LE and the insulating layer LD, the relay electrode QC4, a conduction hole HD6 which penetrates the insulating layer LC, the relay electrode QB6, the conduction hole HC16 which penetrates the insulating layer LB, the relay electrode QA20, and the conduction hole HA20 which penetrates the insulating film L0 and the insulating layer LA.

The insulating layer LF is formed on a surface of the insulating layer LE in which the first data transfer line 14-1, the power supplying line 16, and the relay electrode QD2 are formed. As can be understood from the part of the reflective layer of FIG. 25 and FIG. 26, the reflective layer 50 is formed on a surface of the insulating layer LF. The reflective layer 50 is independently formed in each pixel circuit 110. The reflective layer 50 is formed of a conductive material with a light-reflective property, which contains, for example, silver or aluminum, with a thickness of, for example, approximately 100 nm. As can be understood from FIG. 25 and FIG. 26, the reflective layer 50 is electrically coupled to the relay electrode QD2 through a conduction hole HG2 which penetrates the insulating layer LF. Hence, the reflective layer 50 is electrically coupled to the active region 10A which forms the drain region or the source region of the fourth transistor 124 through the relay electrode QD2.

As illustrated in FIG. 26, the light path adjustment layer LG is formed on a surface of the insulating layer LF on which the reflective layer 50 is formed. The light path adjustment layer LG is a film body with optical transparency which defines a resonance wavelength (that is, display color) of a resonance structure of the pixel circuit 110. The resonance wavelengths of the resonance structure are set to be approximately the same in pixels having the same display color, and the resonance wavelengths of the resonance structure are set to be different in pixels having different display colors.

As can be seen from the part of the pixel electrode layer of FIG. 25 and FIG. 26, the anodes 130a in each pixel circuit 110 are formed on a surface of the light path adjustment layer LG. The anode 130a is formed of a conductive material with optical transparency such as indium tin oxide (ITO). The anode 130a is electrically coupled to the reflective layer 50 through a conduction hole HH2 which penetrates the light path adjustment layer LG. Hence, the anode 130a is electrically coupled to the active region 10A which forms the drain region or the source region of the fourth transistor 124 and the active region 10A which forms the drain region or the source region of the fifth transistor 125 through the reflective layer 50.

As illustrated in the part of a pixel definition film of FIG. 25 and FIG. 26, the pixel definition film 51 is formed on a surface of the light path adjustment layer LG on which the anode 130a is formed, over the entire substrate 10. The pixel definition film 51 is formed of an insulating inorganic material such as a silicon compound (typically, silicon nitride or silicon oxide). As can be understood from the part of the pixel definition film of FIG. 25, an opening 51A corresponding to each anode 130a is formed in the pixel definition film 51. A region around an inner circumference of the opening 51A of the pixel definition film 51 overlaps a circumference of the anode 130a. That is, the inner circumference of the opening 51A is located at the inside of the circumference of the anode 130a in a planar view. The respective openings 51A have a plan shape (rectangular shape) or a common size, and are arranged in a matrix with a common pitch in the X direction and Y direction. As can be understood from the aforementioned description, the pixel definition films 51 are formed in a lattice shape in a planar view. Meanwhile, the plan shapes or the sizes of the openings 51A may be the same as each other if display colors thereof are the same as each other, and may be different from each other in a case where the display colors thereof are different from each other. In addition, the pitches between the opening 51A may be equal in the openings having the same display colors, and may be different in the openings having different display colors from each other.

While not described in detail, also in others, a light emission function layer, a cathode of the OLED 130, and a sealing body are stacked on an upper layer of the anode 130a, and a sealing substrate (not illustrated) is bonded to a surface of the substrate 10 on which the aforementioned elements are formed, by, for example, an adhesive. The sealing substrate is a plate shape member (for example, glass substrate) with optical transparency which protects each unit on the substrate 10. It is also possible to form a color filter on a surface of the sealing substrate or a surface of a sealing body for each pixel circuit 110.

In addition, while not illustrated, the common electrode 118 which is used as another power supply line layer is formed in the pixel circuit 110. The common electrode 118 is electrically coupled to a mounting terminal to which the power supply potential Vct on a low side is supplied, through a wire (not illustrated) in a multilayer wiring layer. The power supplying line 116 and the common electrode 118 to which the power supply potential Vct on a low side is supplied are formed of a conductive material which contains, for example, silver or aluminum with a thickness of, for example, approximately 100 nm. The common electrode 118 is electrically coupled to the anode 130a.

It is preferable that the transfer capacitor (first capacitor) 133 is increased in size so as to increase a data compression rate of the potential Vg which is supplied to the gate g of the drive transistor 121, but according to the present embodiment, the transfer capacitor 133 is formed by a metal-insulator-metal (MIM) structure, and thus, the transfer capacitor 133 can have large capacitance. In addition, the transfer capacitor 133 is formed in a layer higher than a layer in which source electrodes of the second transistor 122 and the third transistor 123 are formed, thereby being formed in a display region of the pixel circuit 110. Accordingly, it is possible to prevent a chip size from increasing.

In addition, the shield capacitor (second capacitor) 134 is formed by disposing a predetermined gap between the first data transfer line 14-1 and the power supplying line 16 which is used as a shield line, through the insulating layer LF. Hence, the shield capacitor 134 is formed of two parallel wires, and has a predetermined length in the Y direction, and thus, it is possible to secure predetermined capacitance. In addition, the shield capacitor 134 is also formed in a display region of the pixel circuit 110, and thus, it is possible to prevent a chip size from increasing.

In the present embodiment, the transfer capacitor 133 is formed in each pixel circuit 110, but the transfer capacitor 133 may be formed in each second data transfer lines 14-2. Hence, it is possible to further prevent a chip size from increasing.

As can be understood from FIG. 24 to FIG. 26, in the present embodiment, the first data transfer line 14-1 to which a signal with large amplitude is supplied is formed in a layer higher than a layer having the second data transfer line 14-2 to which a compressed signal is supplied. That is, it is possible to reduce effects of a signal with large amplitude which is supplied to the first data transfer line 14-1, on the gate of the drive transistor 121, to prevent a potential of the gate of the drive transistor 121 from changing, and to increase display quality.

In addition, as can be understood from FIG. 24 and FIG. 26, in the present embodiment, the second data transfer line 14-2 is formed on a layer higher than a layer in which source electrodes of the drive transistor 121, the first transistor 126, the second transistor 122, and the third transistor 123. Hence, it is possible to prevent a chip size from increasing.

Furthermore, as can be understood from FIG. 24 and FIG. 26, the power supplying line 116 which is used as a power supply line coupled to a second current terminal of the drive transistor 121 is formed in a layer lower than a layer having the second data transfer line 14-2, and thus, the power supplying line 116 functions as a shield. In addition, it is possible to more effectively prevent a potential of the gate of the drive transistor 121 from changing, and to increase display quality.

In addition, as can be understood from FIG. 24, the drive transistor 121 is covered with the power supplying line 116 which is used as a power supply line, and thus, the power supplying line 116 functions as a shield. In addition, it is possible to more effectively prevent the potential of the gate of the drive transistor 121 from changing, and to increase display quality.

As can be understood from FIG. 24 to FIG. 26, the first electrode 133-1 and the second electrode 133-2 of the transfer capacitor 133 are formed in different layers from the layer in which the first data transfer line 14-1 is formed. Hence, even in a case where the insulating layer is thinned to secure a capacitor with a small size, it is possible to form the transfer capacitor 133 having a uniform space between layers without short-circuit.

Fourth Embodiment

Next, a fourth embodiment of the invention will be described with reference to FIG. 27 to FIG. 30 of the accompanying drawings. In the fourth embodiment, the same symbols or reference numerals will be attached to the same members as in the third embodiment.

Circuit Diagram

Figure 27:
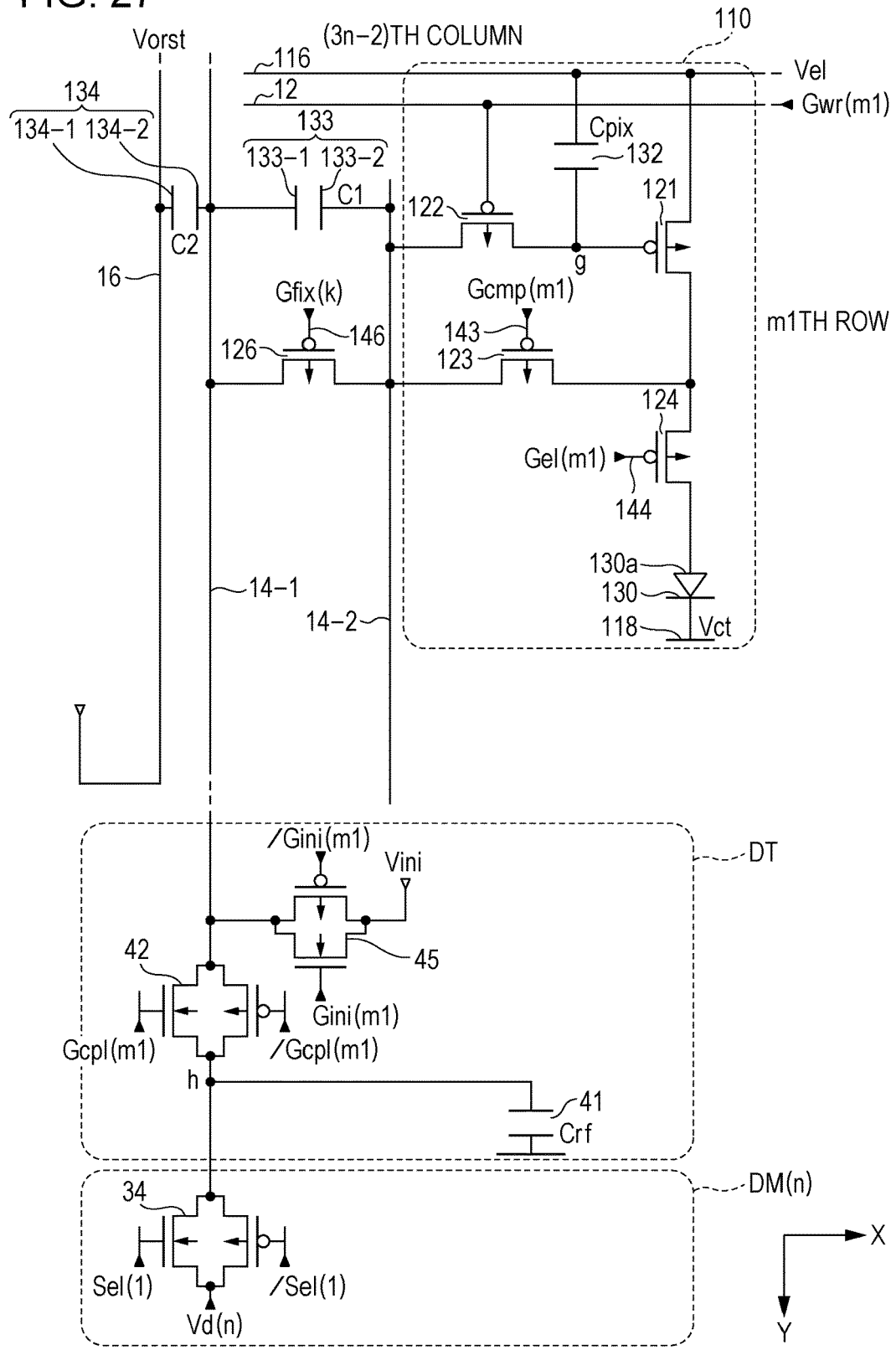
FIG. 27 is a circuit diagram illustrating a configuration of a pixel circuit of an electro-optical device according to a fourth embodiment of the invention.

As illustrated in FIG. 27, a circuit according to the present embodiment is configured by five transistors in the same manner as in the third embodiment, but a power supplying line 17 is not provided. Instead of that, the drain or the source of the first transistor 126 is coupled to the first data transfer line 14-1, and the initial potential Vini is supplied to the first data transfer line 14-1 through the transmission gate 45. Other configurations are the same as in the third embodiment.

An operation according to the present embodiment is the same as that of each embodiment described above, and the second data transfer line 14-2 on the transfer capacitor 133 side of the second transistor 122, which becomes a floating node during the light emission period, is set to the initial potential Vini of a fixed potential during a period in which processing of the initialization period is performed in other blocks. Thus, it is possible to prevent a potential of the second data transfer line 14-2 from approaching the power supply potential. As a result, the second transistor 122 is not turned on, a voltage is retained in the pixel capacitor 132, and display failure does not occur.

Structure

Figure 28:
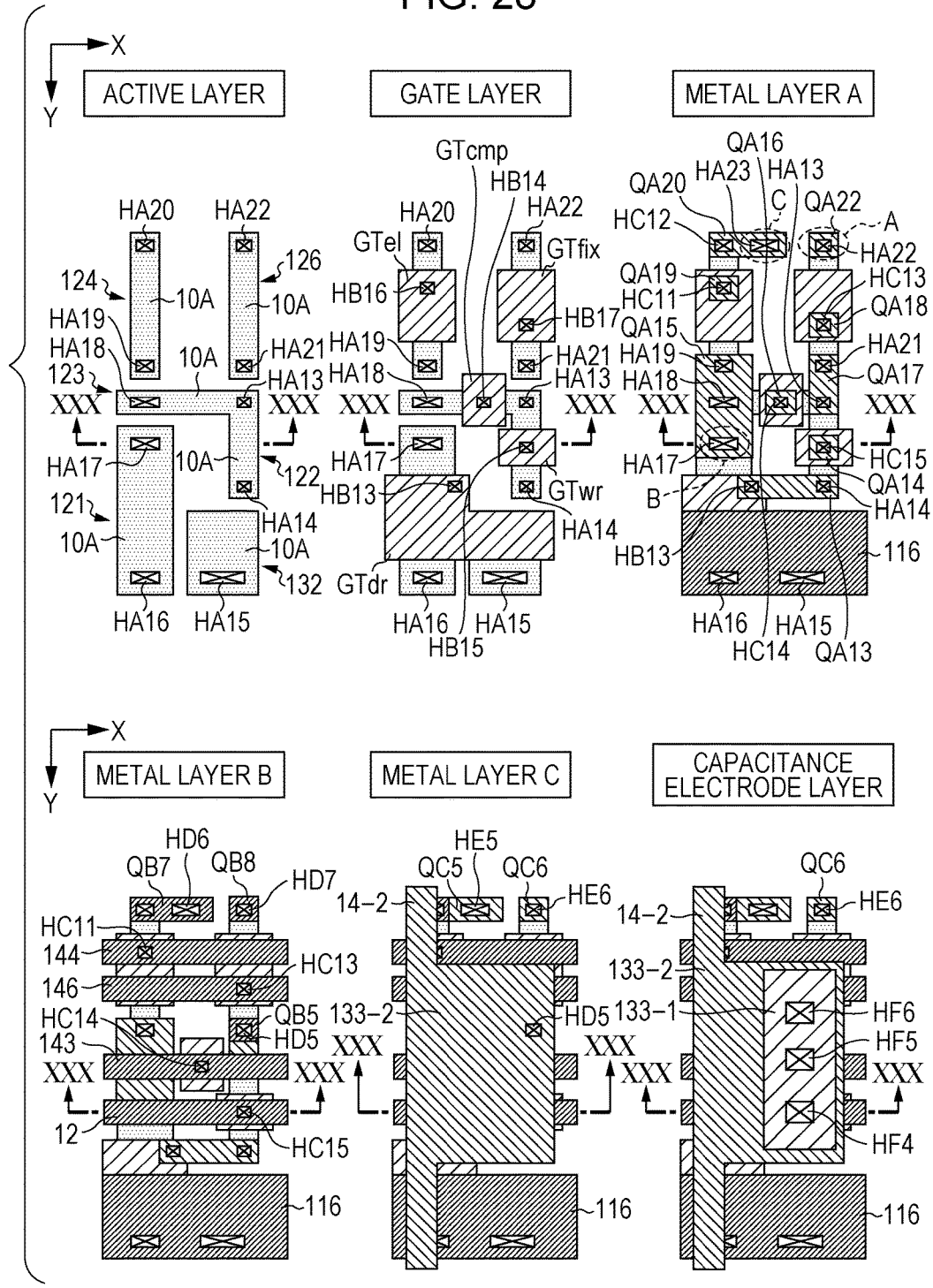
FIG. 28 is an explanatory view of each unit which is formed on the substrate.

In the present embodiment, disposition and a shape of the second data transfer line 14-2 are different from those in the third embodiment, as illustrated in FIG. 28. In addition, the active region 10A which forms the drain or the source of the first transistor 126 is coupled to the first data transfer line 14-1 through the conduction hole HA22, a relay electrode QA22, a conduction hole HD7, and a relay electrode QB8. Other structures are the same as in the third embodiment.

It is preferable that the transfer capacitor (first capacitor) 133 is increased in size so as to increase a data compression rate of the potential Vg which is supplied to the gate g of the drive transistor 121, but according to the present embodiment, the transfer capacitor 133 is formed by a metal-insulator-metal (MIM) structure, and thus, the transfer capacitor 133 can have large capacitance. In addition, the transfer capacitor 133 is formed in a layer higher than a layer in which source electrodes of the second transistor 122 and the third transistor 123 are formed, thereby being formed in a display region of the pixel circuit 110. Accordingly, it is possible to prevent a chip size from increasing.

The relay electrode QA13 illustrated in FIG. 28 is a source electrode, and is formed by directly coming into contact with the active region 10A which forms a drain region or a source region of the second transistor 122.

In addition, the relay electrode QA15 illustrated in FIG. 28 is also a source electrode, and is formed by directly coming into contact with the active region 10A which forms a drain region or a source region of the third transistor 123, the active region 10A which forms a drain region or a source region of the fourth transistor 124, and the active region 10A which forms a drain region or a source region of the drive transistor 121.

Furthermore, the relay electrode QA17 illustrated in FIG. 28 is also a source electrode, and is formed by directly coming into contact with the active region 10A which forms a drain region or a source region of the third transistor 123, the active region 10A which forms a drain region or a source region of the second transistor 122, and the active region 10A which forms a drain region or a source region of the first transistor 126.

In addition, the shield capacitor (second capacitor) 134 is formed by disposing a predetermined gap between the first data transfer line 14-1 and the power supplying line 16 which is used as a shield line, through the insulating layer LF. Hence, the shield capacitor 134 is formed of two parallel wires, and has a predetermined length in the Y direction, and thus, it is possible to secure predetermined capacitance. In addition, the shield capacitor 134 is also formed in a display region of the pixel circuit 110, and thus, it is possible to prevent a chip size from increasing.

In the present embodiment, the transfer capacitor 133 is formed in each pixel circuit 110, but the transfer capacitor 133 may be formed in each second data transfer lines 14-2. Hence, it is possible to further prevent a chip size from increasing.

Figure 29:
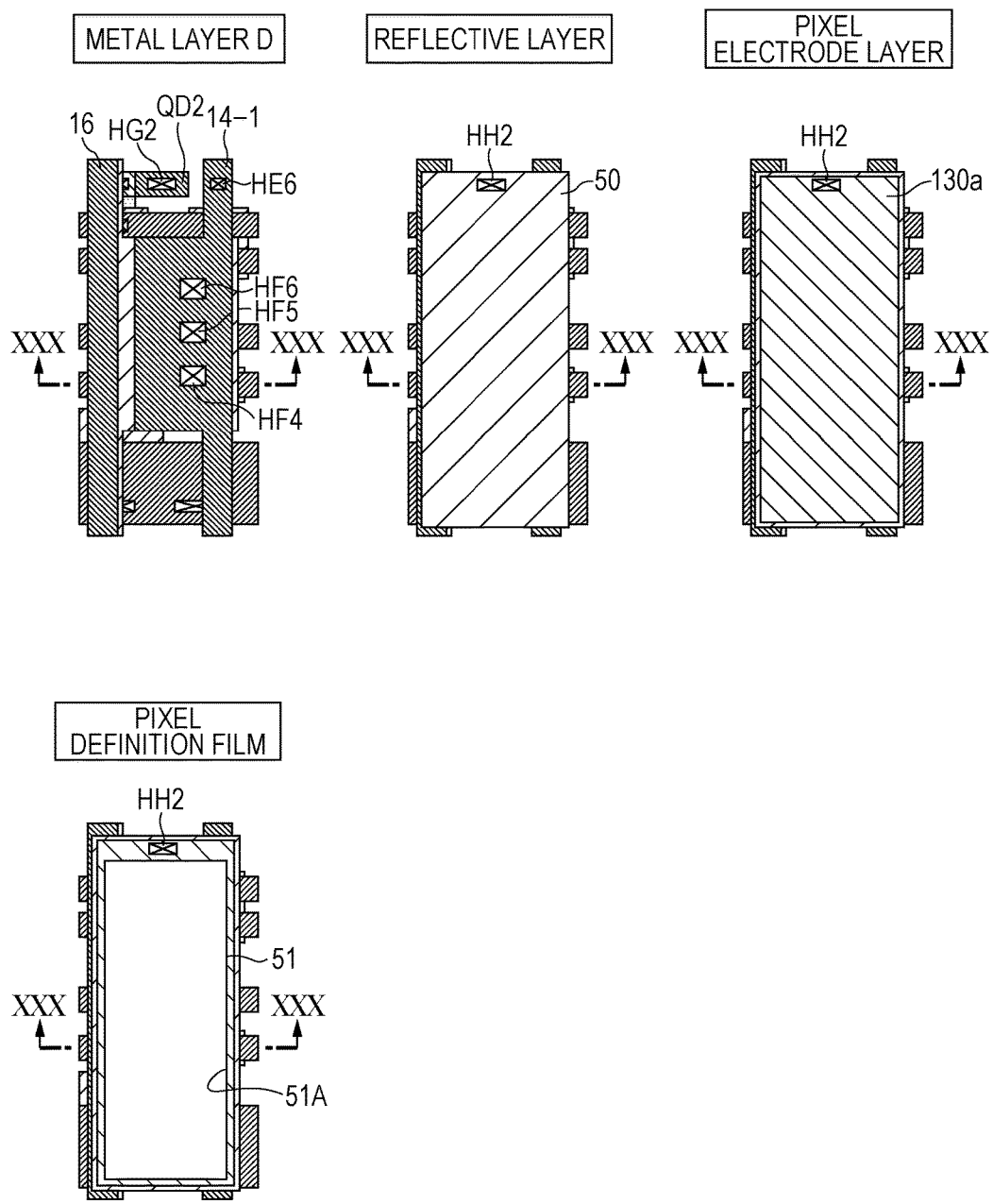
FIG. 29 is an explanatory view of each unit which is formed on the substrate.
Figure 30:
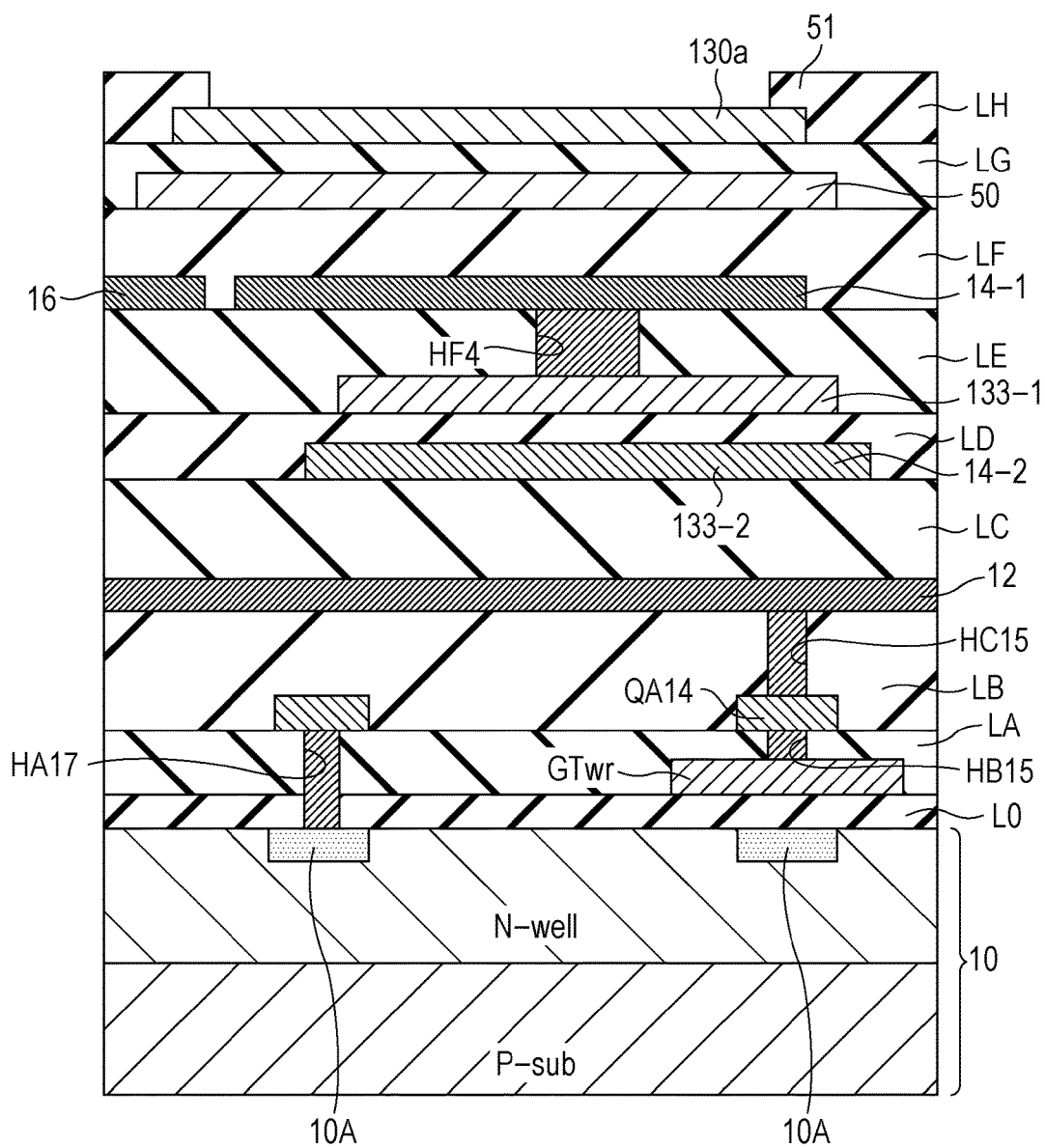
FIG. 30 is a sectional view of the light emitting device.

As can be understood from FIG. 28 to FIG. 30, in the present embodiment, the first data transfer line 14-1 to which a signal with large amplitude is supplied is formed in a layer higher than a layer having the second data transfer line 14-2 to which a compressed signal is supplied. That is, it is possible to reduce effects of a signal with large amplitude which is supplied to the first data transfer line 14-1, on the gate of the drive transistor 121, to prevent a potential of the gate of the drive transistor 121 from changing, and to increase display quality.

In addition, as can be understood from FIG. 28 and FIG. 30, in the present embodiment, the second data transfer line 14-2 is formed on a layer higher than a layer in which source electrodes of the drive transistor 121, the first transistor 126, the second transistor 122, and the third transistor 123. Hence, it is possible to prevent a chip size from increasing.

Furthermore, as can be understood from FIG. 28 and FIG. 30, the power supplying line 116 which is used as a power supply line coupled to the second current terminal of the drive transistor 121 is formed in a layer lower than a layer having the second data transfer line 14-2, and thus, the power supplying line 116 functions as a shield. In addition, it is possible to more effectively prevent a potential of the gate of the drive transistor 121 from changing, and to increase display quality.

In addition, as can be understood from FIG. 28, the drive transistor 121 is covered with the power supplying line 116 which is used as a power supply line, and thus, the power supplying line 116 functions as a shield. In addition, it is possible to more effectively prevent the potential of the gate of the drive transistor 121 from changing, and to increase display quality.

As can be understood from FIG. 28 to FIG. 30, the first electrode 133-1 and the second electrode 133-2 of the transfer capacitor 133 are formed in different layers from the layer in which the first data transfer line 14-1 is formed. Hence, even in a case where the insulating layer is thinned to secure a capacitor with a small size, it is possible to form the transfer capacitor 133 having a uniform space between layers without short-circuit.

As illustrated in the part of the metal layer A of FIG. 28, an ellipse A of a dashed line denotes a coupling location of the first transistor 126 and the first data transfer line 14-1, and an ellipse B of a dashed line denotes a coupling location of the first current terminal of the drive transistor 121 and the third transistor 123. In addition, an ellipse C of a dashed line denotes a coupling location of the fourth transistor 124 and the OLED 130 which is used as a light emitting element. By illustrating so, in a case of being viewed from the inside of one pixel circuit 110, the ellipse A of a dashed line which denotes a coupling location of the first transistor 126 and the first data transfer line 14-1 is set to be close to the ellipse C of a dashed line which denotes the coupling location of the fourth transistor 124 and the OLED 130 which is used as a light emitting element rather than the ellipse B of a dashed line which denotes the coupling location of the first current terminal of the drive transistor 121 and the third transistor 123.

Hence, even though a signal with large amplitude is supplied to the first data transfer line 14-1 and noise is generated in the coupling location (ellipse A) of the first transistor 126 and the first data transfer line 14-1, it is possible to prevent the noise from affecting the drive transistor 121, and to increase display quality.

In addition, as illustrated in FIG. 28, the coupling location (ellipse A) of the first transistor 126 and the first data transfer line 14-1, the coupling location (ellipse B) of a first current terminal of the drive transistor 121 and the third transistor 123, and the coupling location (ellipse C) of the fourth transistor 124 and the OLED 130 which is used as a light emitting element are respectively disposed between the power supplying lines 116 which are used as power supply lines in the pixel circuit 110 and the power supplying lines 116 which are used as power supply lines in the pixel circuits 110 of blocks adjacent to each other in the Y direction. Hence, the power supplying line 116 becomes a shield, and effects of noise can be reduced.

Modification Example

The invention is not limited to the embodiments described above, and for example, various modifications which will be described hereinafter can be made. In addition, forms of modification which will be described hereinafter can be combined with one or more of the forms which are arbitrarily selected.

Modification Example 1

Figure 31:
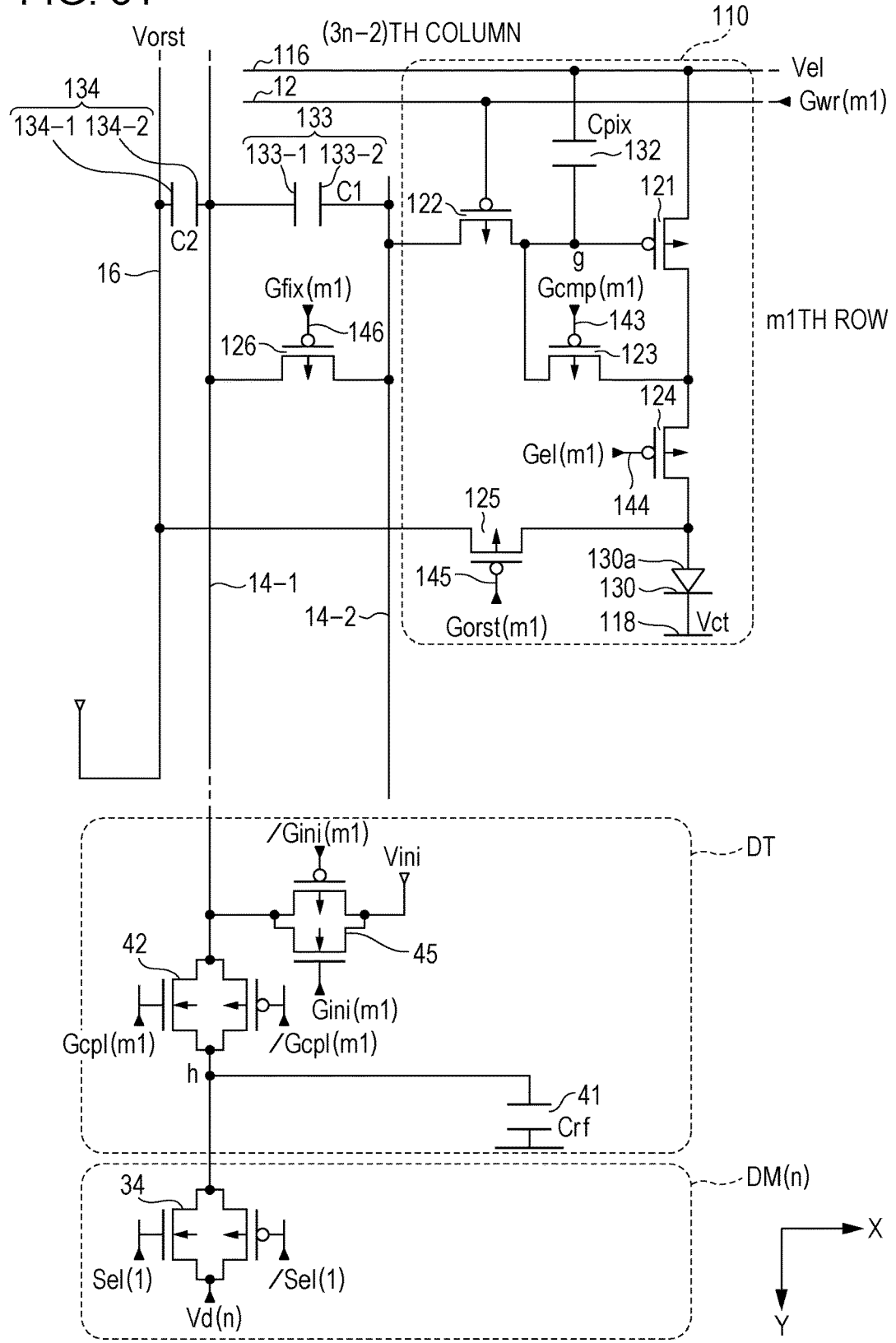
FIG. 31 is a circuit diagram illustrating a configuration of a pixel circuit according to a modification example.

In the embodiments described above, the third transistor 123 is coupled between a drain of the drive transistor 121 and the second data transfer line 14-2, in each pixel circuit 110, but the third transistor 123 may be coupled between the drain and the gate g of the drive transistor 121, as illustrated in FIG. 31.

Modification Example 2

Figure 32:
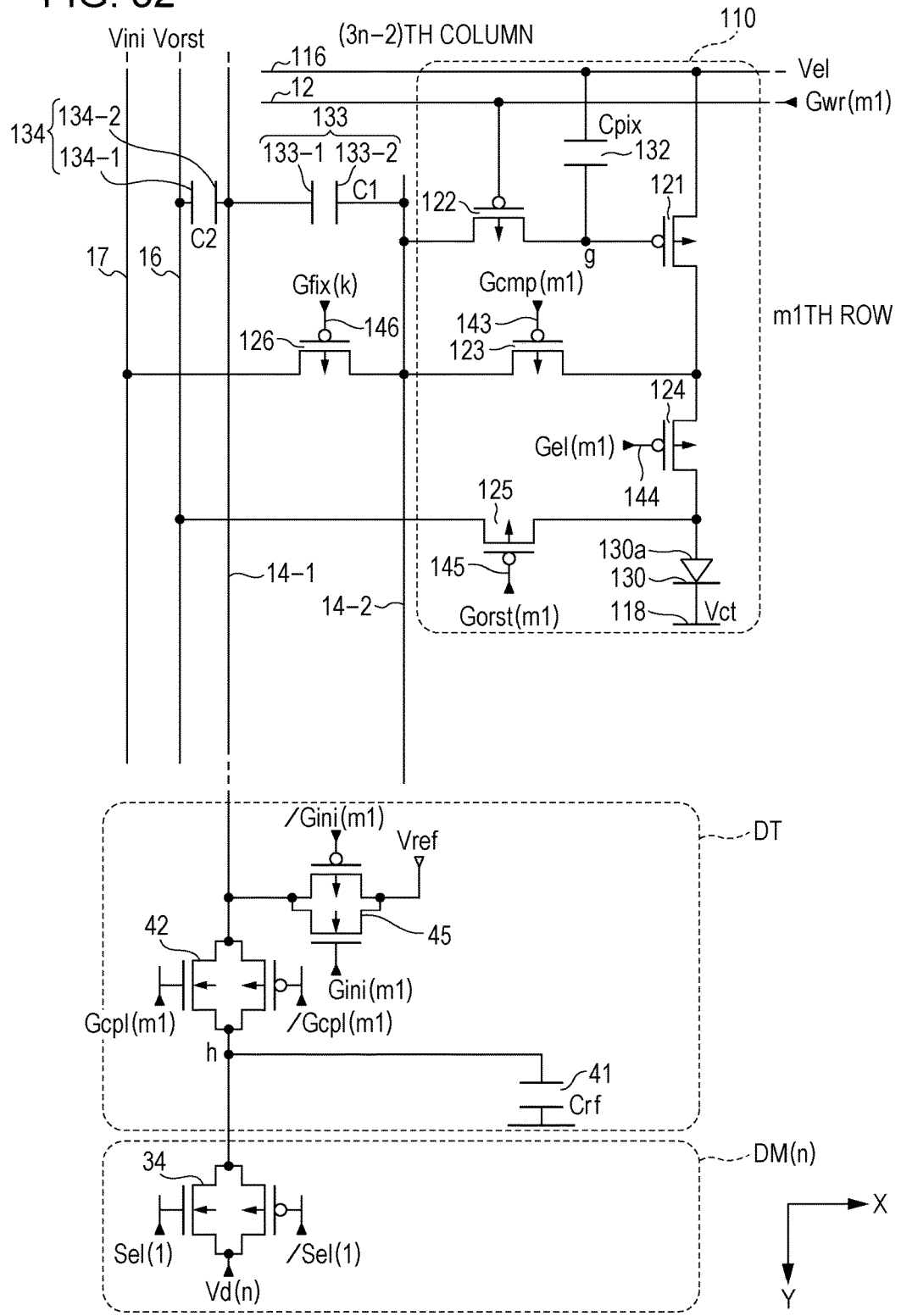
FIG. 32 is a circuit diagram illustrating a configuration of the pixel circuit according to the modification example.

In the first embodiment, the initial potential Vini is supplied to the first data transfer line 14-1 through the transmission gate 45, and the initial potential Vini is supplied to the second data transfer line 14-2 by turning on the first transistor 126. However, as illustrated in FIG. 32, the power supplying line 17 which supplies the initial potential Vini may be provided and the drain or the source of the first transistor 126 may be coupled to the power supplying line 17. In this case, the initial potential Vini is supplied to the second data transfer line 14-2 from the power supplying line 17 by turning on the first transistor 126.

Modification Example 3

Figure 33:
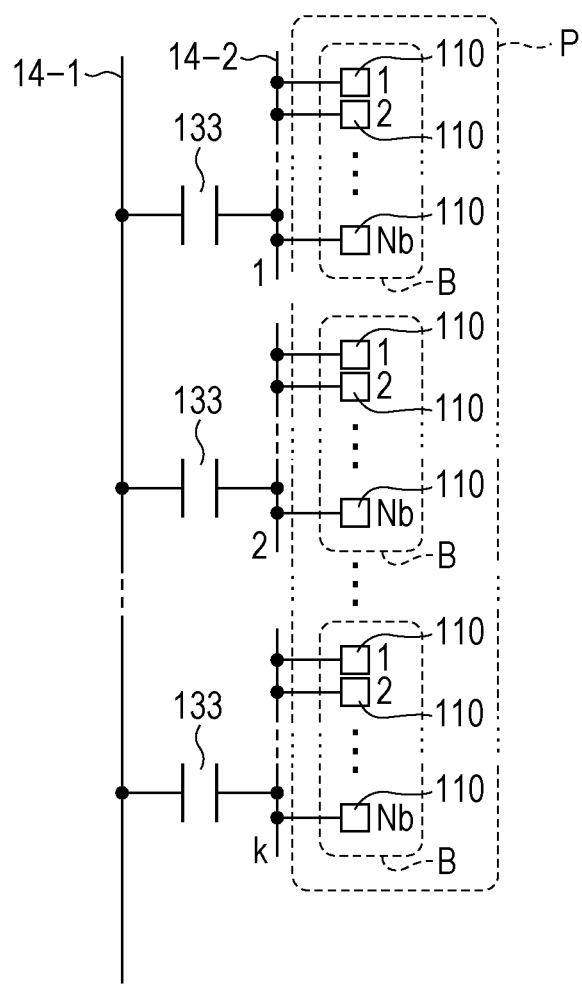
FIG. 33 is a diagram illustrating a relationship between a first data transfer line, a transfer capacitor, a second data transfer line of the pixel circuit, and the pixel circuit according to the modification example.

In the circuit diagrams of the aforementioned embodiments, the first transistor 126 and the transfer capacitor 133 are provided in one-to-one correspondence with each pixel circuit 110, but as illustrated in FIG. 33, one of the first transistors 126 and one of the transfer capacitors 133 may be provided for Nb pixel circuits 110.

Modification Example 4

The embodiments described above are configured in such a manner that the first data transfer lines 14-1 are grouped for the three respective columns, the first data transfer lines 14-1 are sequentially selected in each group, and a data signal is supplied to the selected lines, but the number of data lines which configure the group may be a predetermined number which is equal to or greater than "2" and equal to or smaller than "3n". For example, the number of data lines which configure the group may be "2" and may be equal to or greater than "4".

In addition, without grouping, that is, without using the demultiplexer DM, the embodiments may be configured so as to simultaneously and sequentially supply the data signals to the first data transfer lines 14-1 of each column.

Modification Example 5

In the embodiments described above, the transistors 121 to 126 are all P-channel types, but may all be N-channel types. In addition, P-channel type transistors and N-channel type transistors may be appropriately combined.

For example, in a case in which the transistors 121 to 126 are all N-channel types, the data signal Vd(n) of the embodiments described above may be supplied to each pixel circuit 110 as a potential, polarity of which is reversed. In this case, the sources and the drains of the transistors 121 to 126 are in a relationship of being reversed to those of the embodiments and modification examples which are described above.

Modification Example 6

In the embodiments and modification examples which are described above, an example is described in which an OLED that is a light emitting element is used as an electro-optical element, but the electro-optical element may be an element which emits light in brightness according to a current, such as an inorganic light emitting diode or a light emitting diode (LED).

Application Example

Next, an electronic apparatus to which the electro-optical device 1 according to an embodiment, an application example, or the like is applied will be described. In the electro-optical device 1, the pixels are directed to a high definition display with a small size. However, an example in which a head-mounted display is used as an electronic apparatus will be described.

Figure 34:
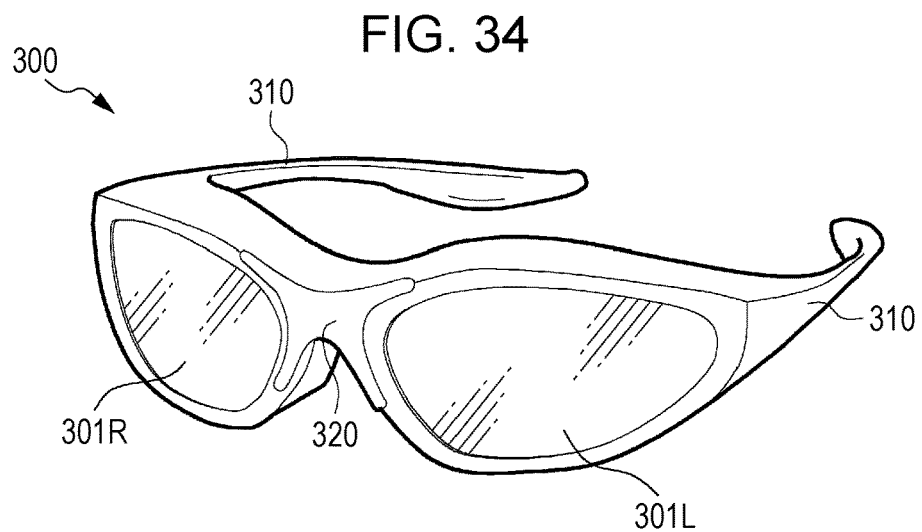
FIG. 34 is a view illustrating an external configuration of an HMD.
Figure 35:
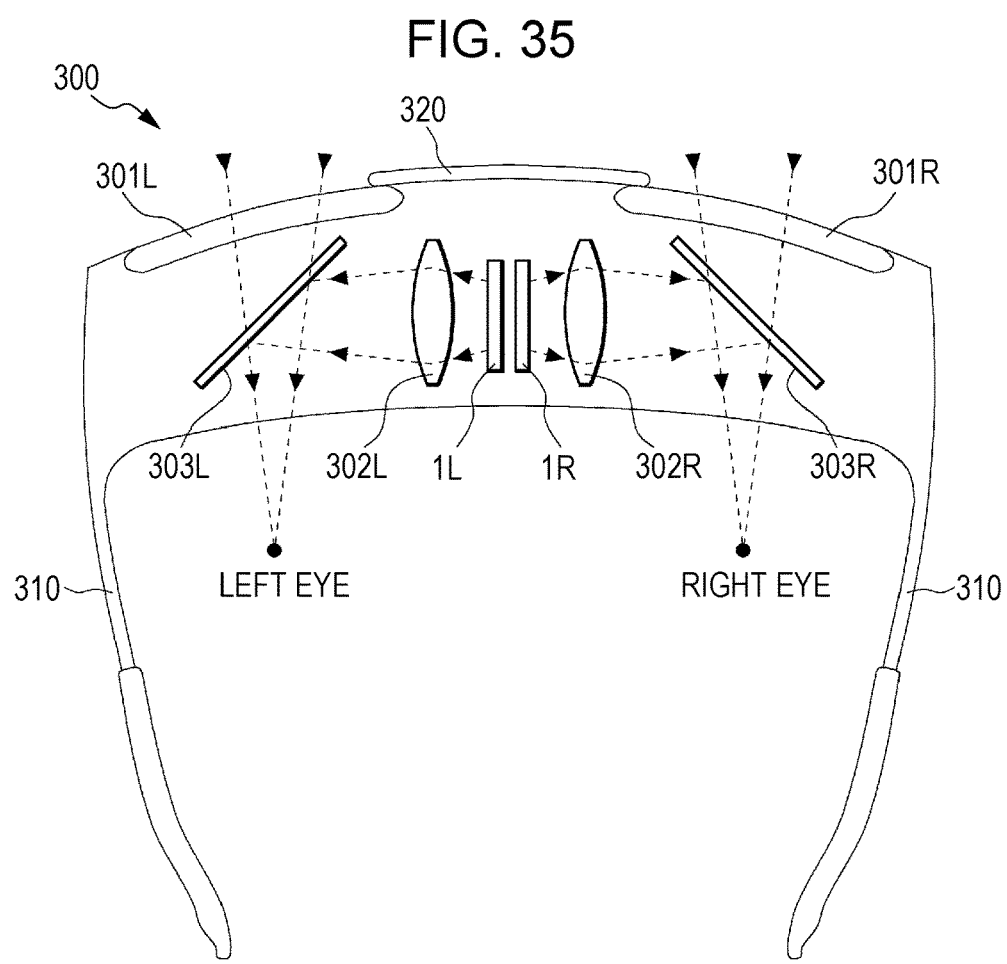
FIG. 35 is a view illustrating an optical configuration of the HMD.

FIG. 34 is a diagram illustrating an appearance of a head-mounted display, and FIG. 35 is a diagram illustrating an optical configuration of the head-mounted display.

To begin with, as illustrated in FIG. 34, the head-mounted display 300 includes a temple 310, a bridge 320, and lenses 301L and 301R, in the same manner as in an eyeglasses, in appearance. In addition, as illustrated in FIG. 35, in the head-mounted display 300, an electro-optical device 1L for the left eye and an electro-optical device 1R for the right eye are provided on a far side (lower side in the figure) of the lenses 301L and 301R in the vicinity of the bridge 320.

A pixel display surface of the electro-optical device 1L is disposed so as to be positioned on the left side of FIG. 35. According to this, a display image formed by the electro-optical device 1L is emitted in a nine o'clock direction in the figure via an optical lens 302L. While reflecting a display image formed by the electro-optical device 1L in a six o'clock direction, a half mirror 303L makes light which is incident in a twelve o'clock direction pass through.

An image display surface of the electro-optical device 1R is disposed so as to be positioned on the right side opposite to that of the electro-optical device 1L. According to this, a display image formed by the electro-optical device 1R is emitted in a three o'clock direction in the figure via an optical lens 302R. While reflecting a display image formed by the electro-optical device 1R in a six o'clock direction, a half mirror 303R makes light which is incident in a twelve o'clock direction pass through.

In this configuration, a wearer of the head-mounted display 300 can observe display images formed by the electro-optical devices 1L and 1R, in a see-through state in which the display images overlap external appearances.

In addition, in the head-mounted display 300, if an image for the left eye is displayed on the electro-optical device 1L and an image for the right eye is displayed on the electro-optical device 1R, among binocular images with parallax, an image which is displayed can be perceived to the wearer as if having a depth and a three-dimensional appearance (3D display).

The electro-optical device 1 can also be applied to an electronic viewfinder in a video camera, a digital camera of an interchangeable lens type, or the like, in addition to the head-mounted display 300.

The entire disclosure of Japanese Patent Application No. 2015-215228, filed Oct. 30, 2015 is expressly incorporated by reference.

What is claimed is:

1. An electro-optical device comprising:
a first conductive layer;
a second conductive layer;
a third conductive layer;
a first capacitor that includes a fourth conductive layer which is coupled to the second conductive layer, a fifth conductive layer which is coupled to the third conductive layer, and a dielectric film between the fourth conductive layer and the fifth conductive layer;
a sixth conductive layer;
a second capacitor that is formed between the second conductive layer and the sixth conductive layer; and
a pixel circuit that is provided in correspondence with the third conductive layer and the first conductive layer,
wherein the pixel circuit includes a plurality of transistors including a drive transistor, and a light emitting element,
wherein the second conductive layer and the sixth conductive layer are formed in a same layer,
wherein the fourth conductive layer of the first capacitor is formed in a different layer from the second conductive layer, and
wherein the fifth conductive layer of the first capacitor is formed in a different layer from the fourth conductive layer,
wherein the first capacitor and the second capacitor are located in a display region.

2. The electro-optical device according to claim 1, wherein, in response to the third conductive layer and at least one additional layer being coupled to the second conductive layer through each of the first capacitors, a set of the pixel circuits that are coupled to the same second conductive layer through the third conductive layer is set as a pixel string, and the pixel circuits having a smaller number than the pixel circuits which are included in the pixel string are set as one block, the third conductive layer is provided to each block.

3. The electro-optical device according to claim 2, wherein the first capacitor is provided to each of the third conductive layers.

4. An electronic apparatus comprising the electro-optical device according to claim 3.

5. An electronic apparatus comprising the electro-optical device according to claim 2.

6. The electro-optical device according to claim 1, wherein the first capacitor is formed in a layer higher than a layer in which a source electrode of a transistor is formed.

7. An electronic apparatus comprising the electro-optical device according to claim 6.

8. An electronic apparatus comprising the electro-optical device according to claim 1.

9. An electro-optical device comprising:
a scan line;
a first data transfer line;
a second data transfer line;
a first capacitor that includes a first electrode which is coupled to the first data transfer line, a second electrode which is coupled to the second data transfer line, and a dielectric film between the first electrode and the second electrode;
a shield line;
a second capacitor that is formed between the first data transfer line and the shield line; and
a pixel circuit that is provided in correspondence with the scan line and the second data transfer line,
wherein the pixel circuit includes a plurality of transistors including a drive transistor, and a light emitting element,
wherein the first data transfer line and the shield line are formed in a same layer,
wherein the first electrode of the first capacitor is formed in a different layer from a layer having the first data transfer line, and
wherein the second electrode of the first capacitor is formed in a different layer from a layer having the first electrode.

10. An electronic apparatus comprising the electro-optical device according to claim 9.

* * * * *